(12) United States Patent
Iijima et al.

(10) Patent No.: US 11,447,639 B2
(45) Date of Patent: Sep. 20, 2022

(54) COMPOSITION, PHOTOELECTRIC CONVERSION ELEMENT, AND IMAGING DEVICE

(71) Applicant: Panasonic Intellectual Property Management Co., Ltd., Osaka (JP)

(72) Inventors: Hiroaki Iijima, Nara (JP); Masaya Hirade, Osaka (JP); Manabu Nakata, Osaka (JP); Taniyuki Furuyama, Ishikawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/013,780

(22) Filed: Sep. 7, 2020

(65) Prior Publication Data

US 2020/0407562 A1    Dec. 31, 2020

Related U.S. Application Data

(63) Continuation of application No. PCT/JP2019/009322, filed on Mar. 8, 2019.

(30) Foreign Application Priority Data

Mar. 29, 2018  (JP) .............................. JP2018-066166
Nov. 16, 2018  (JP) .............................. JP2018-215834

(51) Int. Cl.
*C09B 47/067* (2006.01)
*H01L 51/00* (2006.01)
*H01L 51/42* (2006.01)

(52) U.S. Cl.
CPC ...... *C09B 47/0675* (2013.01); *H01L 51/0078* (2013.01); *H01L 51/42* (2013.01)

(58) Field of Classification Search
CPC .................................................. C09B 47/0675
See application file for complete search history.

(56) References Cited

U.S. PATENT DOCUMENTS

| | | | |
|---|---|---|---|
| 5,358,940 | A | 10/1994 | Capraro et al. |
| 5,525,516 | A | 6/1996 | Krutak et al. |
| 5,670,491 | A | 9/1997 | Capraro et al. |
| 5,686,439 | A | 11/1997 | Capraro et al. |
| 2007/0010645 | A1 | 1/2007 | Vonwiller et al. |

(Continued)

FOREIGN PATENT DOCUMENTS

| | | |
|---|---|---|
| JP | 3-077840 | 4/1991 |
| JP | 3-100066 | 4/1991 |

(Continued)

OTHER PUBLICATIONS

Ogunbayo. Polyhedron, 2009, 28, 2710-2718 (Year: 2009).*

(Continued)

*Primary Examiner* — Noble E Jarrell
(74) *Attorney, Agent, or Firm* — McDermott Will & Emery LLP

(57) ABSTRACT

A composition contains a phthalocyanine derivative represented by the following formula:

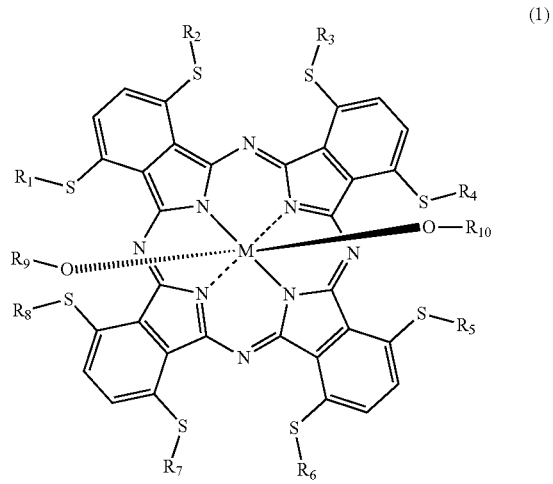

(1)

where $R_1$ to $R_8$ are independently an alkyl group, M is Si, each of $R_9$ and $R_{10}$ is any one of substituents represented by the following formulas, $R_{11}$ to $R_{13}$ are independently an alkyl group, and $R_{14}$ to $R_{18}$ are independently an alkyl group or an aryl group:

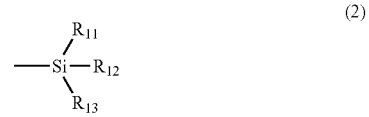

(2)

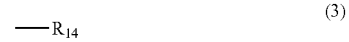

(3)

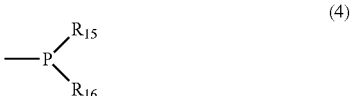

(4)

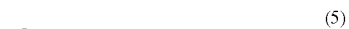

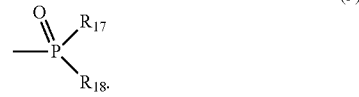

(5)

7 Claims, 21 Drawing Sheets

(56) References Cited

U.S. PATENT DOCUMENTS

2012/0204960 A1 8/2012 Kato et al.
2015/0338754 A1 11/2015 Azuma et al.

FOREIGN PATENT DOCUMENTS

| JP | 3-202395 | 9/1991 |
| JP | 5-124354 | 5/1993 |
| JP | 6-056839 | 3/1994 |
| JP | 10-036830 | 2/1998 |
| JP | 2007-288151 | 11/2007 |
| JP | 2011-119694 | 6/2011 |
| JP | 2015-222339 | 12/2015 |
| JP | 2016-225456 | 12/2016 |
| WO | 1996/010620 | 4/1996 |

OTHER PUBLICATIONS

International Search Report of PCT application No. PCT/JP2019/009322 dated May 28, 2019.
Hirohusa Shirai et al., "Phthalocyanines—Chemistry and Function-", IPC (1997), Feb. 28, 1997, pp. 1-62 (Partial Translation).
Jana Zaumseil et al., "Electron and Ambipolar Transport in Organic Field-Effect Transistors", Chemical Reviews, American Chemical Society, vol. 107, No. 4 (2007), Mar. 23, 2007, pp. 1296-1323.
Serap Gunes et al., "Conjugated Polymer-Based Organic Solar Cells", Chemical Reviews, American Chemical Society, vol. 107, No. 4 (2007), Apr. 11, 2007, pp. 1324-1338.
Samson Khene et al., "Synthesis, electrochemical characterization of tetra- and octa-substituted dodecyl-mercapto tin phthalocyanines in solution and as self-assembled monolayers", Electrochimica Acta 54 (2008), Dec. 30, 2008, pp. 183-191.
Taniyuki Furuyama et al., "Design, Synthesis, and Properties of Phthalocyanine Complexes with Main-Group Elements Showing Main Absorption and Fluorescence beyond 1000 nm", Journal of The American Chemical Society, vol. 136, No. 2, Dec. 13, 2013, pp. 765-776.
Peter Peumans et al., "Small molecular weight organic thin-film photodetectors and solar cells", Journal of Applied Physics, American Institute of Physics, vol. 93, No. 7, Apr. 1, 2003, pp. 3693-3723.
Gcineka Mbambisa et al., "Synthesis and electrochemical properties of purple manganese(III) and red titanium(IV) phthalocyanine complexes octa-substituted at non-peripheral positions with pentylthio groups", Polyhedron vol. 26 Issue 18, Sep. 14, 2007, pp. 5355-5364.
Jian-Yong Liu et al., "Switching the photo-induced energy and electron-transfer processes in BODIPY-phthalocyanine conjugates", Chemical Communications, The Royal Society of Chemistry 2009, Jan. 28, 2009, pp. 1517-1519.

* cited by examiner

COMPOSITION, PHOTOELECTRIC CONVERSION ELEMENT, AND IMAGING DEVICE

BACKGROUND

1. Technical Field

The present disclosure relates to a composition containing a phthalocyanine derivative, a photoelectric conversion element, and an imaging device.

2. Description of the Related Art

Phthalocyanine derivatives and naphthalocyanine derivatives are materials having light absorption characteristics in the near-infrared region and are being investigated as materials, not limited to organic semiconductor materials, usable in various fields such as marking materials for products as disclosed in Japanese Patent No. 5405719 and U.S. Pat. No. 5,525,516.

For example, Samson Khene et al., "Synthesis, electrochemical characterization of tetra- and octa-substituted dodecyl-mercaptotin phthalocyanines in solution and as self-assembled monolayers", Electrochimica Acta, Elsevier, 2008, vol. 54, pp. 183-191 (Non-Patent Document 1) and Taniyuki Furuyama et al., "Design, Synthesis, and Properties of Phthalocyanine Complexes with Main-Group Elements Showing Main Absorption and Fluorescence beyond 1000 nm", Journal of the American Chemical Society, American Chemical Society, 2014, vol. 136, No. 2, pp. 765-776 (Non-Patent Document 2) disclose a method for synthesizing a phthalocyanine derivative having light absorption characteristics in a longer-wavelength near-infrared region.

Japanese Patent No. 5405719 discloses that a semiconductor element and an electronic element are achieved in such a manner that a phthalocyanine derivative is formed into a thin film, which is used as a photoelectric conversion material. Peter Peumans et al., "Small molecular weight organic thin-film photodetectors and solar cells", Journal of Applied Physics, American Institute of Physics, 2003, vol. 93, No. 7, pp. 3693-3723 (Non-Patent Document 3) discloses a photodetector and solar cell including a low-molecular weight organic thin film. Japanese Patent No. 5405719 and Non-Patent Document 3 disclose a phthalocyanine derivative with an absorption maximum wavelength of 600 nm to 800 nm.

SUMMARY

In one general aspect, the techniques disclosed here feature a composition containing a phthalocyanine derivative represented by the following formula:

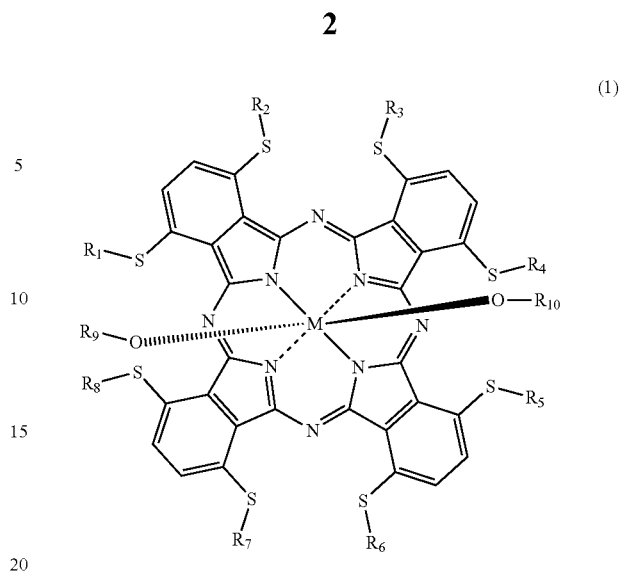

where $R_1$ to $R_8$ are independently an alkyl group, M is Si, each of $R_9$ and $R_{10}$ is any one of substituents represented by the following formulas, $R_{11}$ to $R_{13}$ are independently an alkyl group, and $R_{14}$ to $R_{18}$ are independently an alkyl group or an aryl group:

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
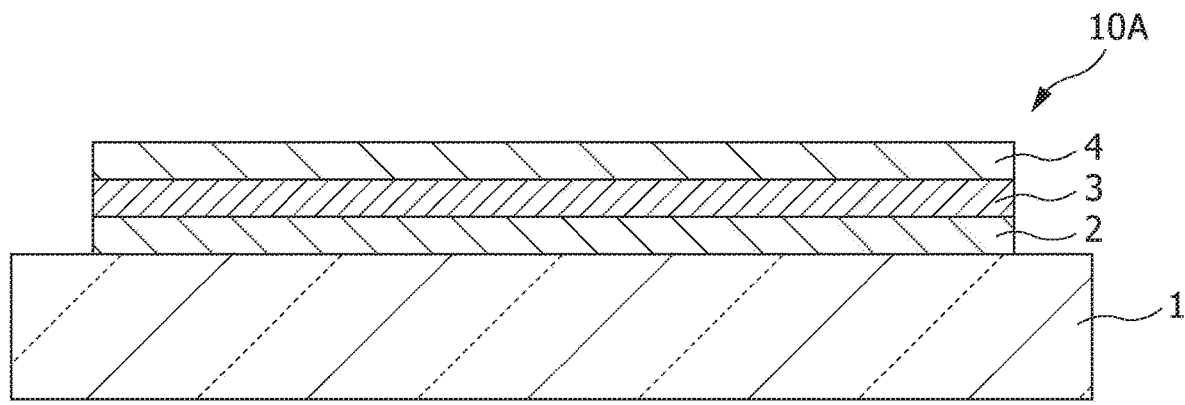
FIG. 1 is a schematic sectional view of an example of a photoelectric conversion element according to an embodiment of the present disclosure.

Underlying Knowledge Forming Basis of the Present Disclosure

In organic semiconductor materials, changing the molecular structure of an organic compound used enables the energy level thereof to be changed. Therefore, in a case where, for example, an organic semiconductor material is used as a photoelectric conversion material, the absorption wavelength can be controlled and sensitivity can be held in the near-infrared region, in which Si has no sensitivity. That is, using organic semiconductor materials enables light in a wavelength region hitherto unused for photoelectric conversion to be utilized, thereby enabling the efficiency of solar cells to be increased and photosensors with sensitivity in the near-infrared region to be achieved. Therefore, in recent years, photoelectric conversion elements and imaging elements containing an organic semiconductor material with sensitivity in a wavelength range from 650 nm to 3.0 µm have been actively investigated.

In recent years, imaging elements with sensitivity in the near-infrared region have been actively investigated. Phthalocyanine derivatives have a large π-conjugated system and strong absorption, due to π-π* absorption, in the near-infrared region and are therefore promising material candidates. However, conventional phthalocyanine derivatives have an absorption maximum wavelength of at most about 700 nm to 800 nm; hence, molecular structures ensuring both a further increase in wavelength and imaging element characteristics are required. That is, in conventional techniques, near-infrared photoelectric conversion films having light absorption characteristics in a near-infrared region of 800 nm or more have not been obtained.

The inventors have found that the response wavelength of an organic material photoelectric conversion film can be controlled by controlling the electronic state a phthalocyanine ring.

The present disclosure provides a composition having highlight absorption characteristics in a longer-wavelength near-infrared region, a photoelectric conversion element, and an imaging device.

The outline of an aspect of the present disclosure is as described below.

A composition according to an aspect of the present disclosure contains a phthalocyanine derivative represented by the following formula:

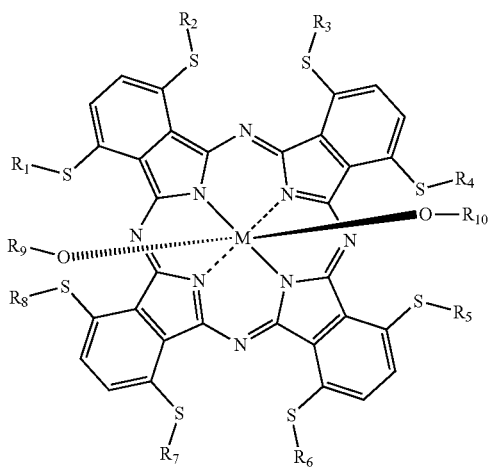

(1)

where $R_1$ to $R_8$ are independently an alkyl group or an aryl group, M is a tetravalent metal, each of $R_9$ and $R_{10}$ is any one of substituents represented by the following formulas, $R_{11}$ to $R_{13}$ are independently an alkyl group, and $R_{14}$ to $R_{18}$ are independently an alkyl group or an aryl group:

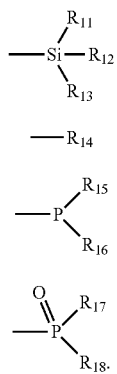

(2)
(3)
(4)
(5)

The composition is such that the electron density of a phthalocyanine ring is low and both the energy level of the highest occupied molecular orbital (HOMO) and the energy level of the lowest unoccupied molecular orbital (LUMO) are deep because the phthalocyanine derivative, which is represented by Formula (1), has electron-withdrawing axial ligands. Furthermore, the composition is such that the LUMO energy level only is low because the phthalocyanine derivative has an electron-donating α-side chain. Therefore, the composition is such that the HOMO energy level is deep and the energy gap (Eg) that is the difference between the HOMO energy level and the LUMO energy level is narrow.

This allows the composition to have high light absorption characteristics in a longer-wavelength near-infrared region because the composition contains the phthalocyanine derivative, which is represented by Formula (1), and the energy gap is narrow and enables the composition to reduce the dark current in a case where the composition is used in a near-infrared photoelectric conversion element because the HOMO energy level is deep and the value of the ionization potential that is the difference between the vacuum level and the HOMO energy level is large. Therefore, using the composition enables a near-infrared photoelectric conversion element and imaging device which have high light absorption characteristics in a longer-wavelength near-infrared region and in which the occurrence of the dark current is reduced to be obtained.

The effect of the above axial ligands is such that oxygen atoms bonded to a central metal mainly play an electron-withdrawing role. Therefore, even when each of $R_9$ and $R_{10}$ is one represented by any one of Formulas (2) to (5), the composition has high light absorption characteristics in the near-infrared region and can reduce the dark current.

In the composition, $R_1$ to $R_8$ in Formula (1) may be, for example, alkyl groups containing five or less carbon atoms.

This allows, in the composition, the phthalocyanine derivative, which is represented by Formula (1), to be solid at room temperature and to be readily synthesized.

In the composition, M in Formula (1) may be, for example, Si or Sn.

This allows, in the composition, the phthalocyanine derivative to be relatively readily synthesized using Si or Sn, which is a tetravalent metal.

In the composition, the phthalocyanine derivative may be, for example, one of compounds represented by the following formulas:

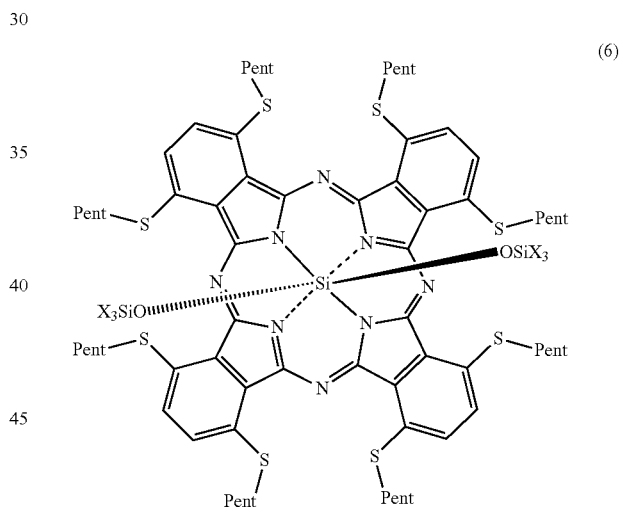

(6)

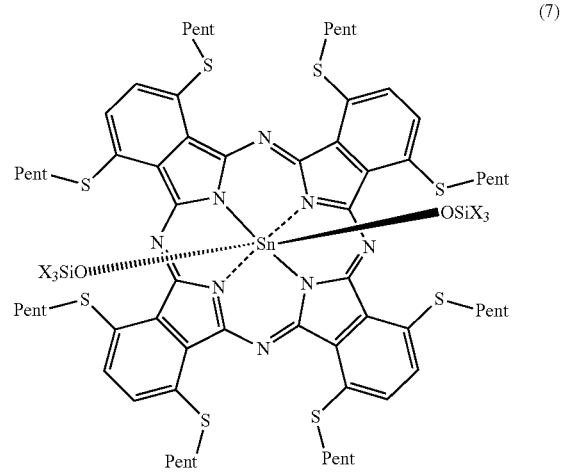

(7)

(8)

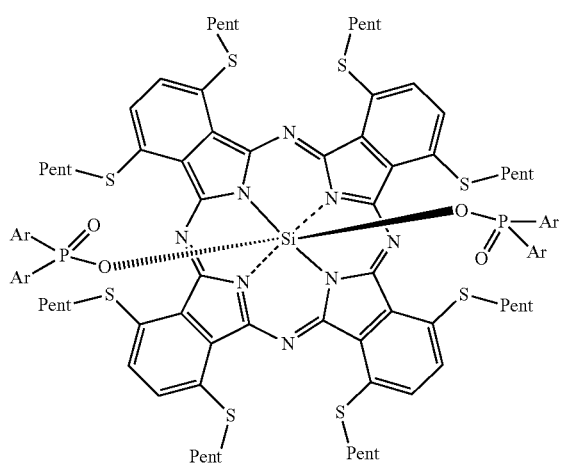

(9)

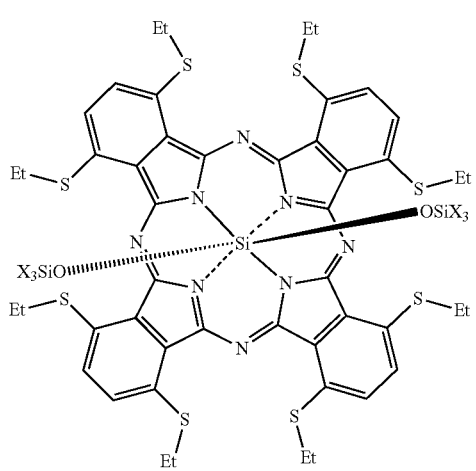

(10)

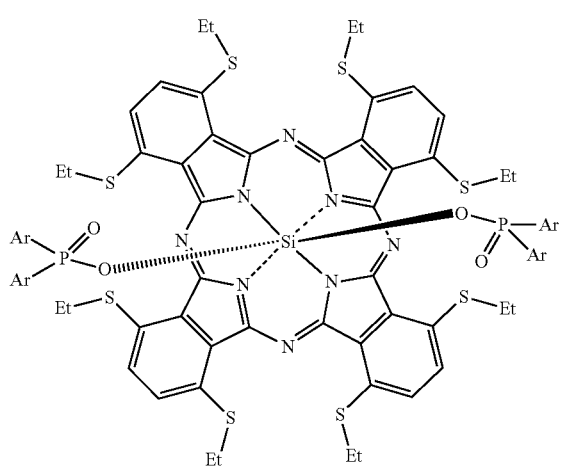

(11)

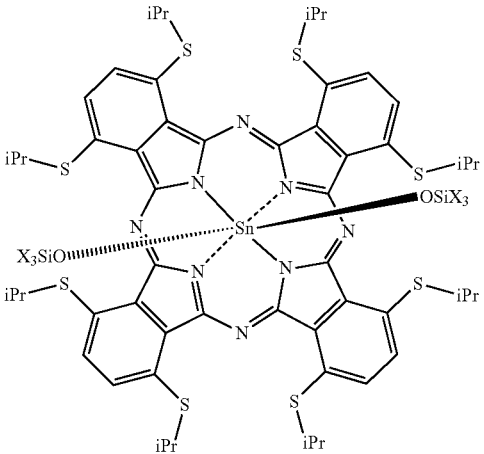

where Ar is an aryl group and X is an alkyl group containing ten or less carbon atoms.

This enables the phthalocyanine derivative, which is represented by Formula (1), to be readily synthesized.

In the composition, at least one hydrogen atom contained in at least one selected from the group consisting of $R_9$ and $R_{10}$ in Formula (1) may be substituted by, for example, a fluorine atom or a fluorine-containing group.

This further enhances electron withdrawing properties of the axial ligands that the phthalocyanine derivative has therefore further reduces the energy density of a phthalocyanine ring; and further deepens both the HOMO energy level and the LUMO energy level in the composition. Therefore, the ionization potential of the phthalocyanine derivative, which is represented by Formula (1), is further reduced and the dark current can be further reduced. The LUMO energy level is deeper than the HOMO energy level and therefore the energy gap (Eg) is further narrowed. Thus, the composition is such that the energy gap is narrower and an absorption peak in the near-infrared region shifts to a longer wavelength.

In the composition, $R_9$ and $R_{10}$ in Formula (1) may be represented by, for example, Formula (5); $R_{17}$ and $R_{18}$ in Formula (5) may be independently, for example, an aryl group; and at least one hydrogen atom contained in at least one selected from the group consisting of $R_{17}$ and $R_{18}$ may be substituted by, for example, a fluorine atom or a fluorine-containing group.

This allows, in the composition, an axial ligand to be readily introduced and synthesis to be easy.

In the composition, $R_{17}$ and $R_{18}$ in Formula (5) may be independently, for example, a phenyl group and at least one hydrogen atom contained in at least one selected from the group consisting of $R_{17}$ and $R_{18}$ may be substituted by, for example, a fluorine atom or a trifluoromethyl group.

This allows, in the composition, an axial ligand to be readily introduced and synthesis to be easy.

In the composition, the phthalocyanine derivative may be, for example, any one of compounds represented by the following formulas:

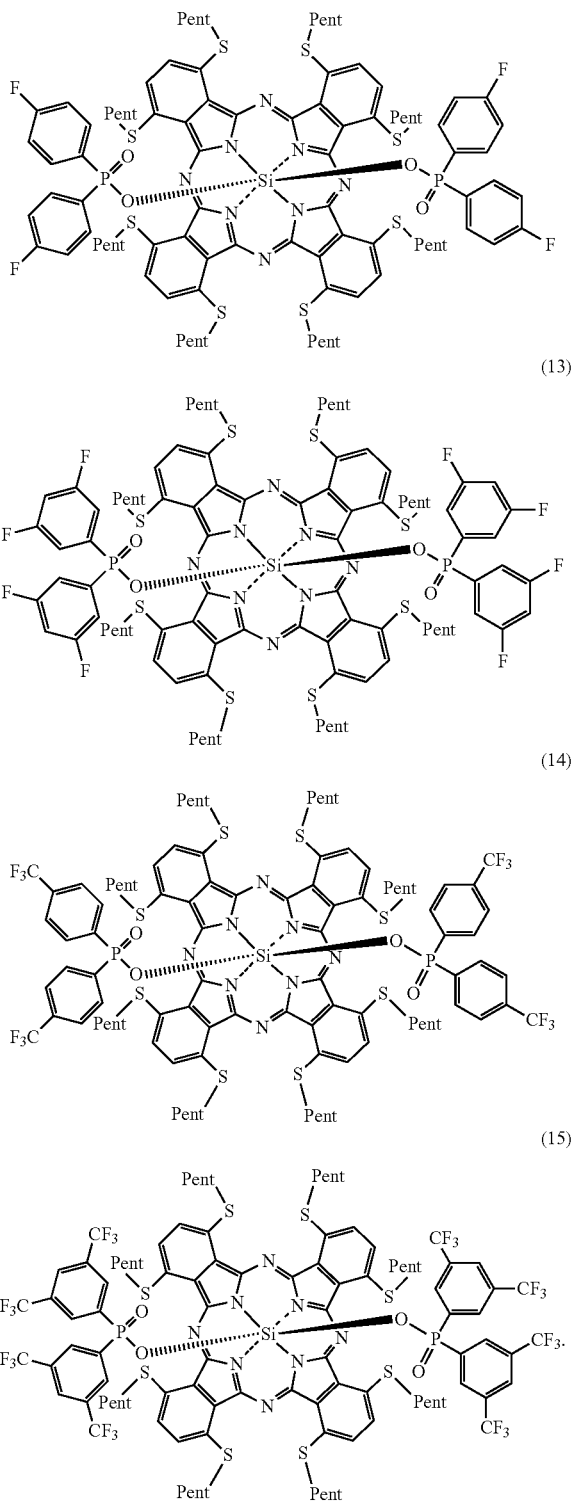

(12)

(13)

(14)

(15)

This enables, in the composition, an axial ligand that can be readily prepared to be used and allows synthesis to be relatively easy.

A photoelectric conversion element according to an aspect of the present disclosure includes a pair of electrodes and a photoelectric conversion film which is placed between the electrodes, which contains the composition, and which has light absorption characteristics in the near-infrared region.

This allows, in the photoelectric conversion element, the photoelectric conversion film, which contains the composition, to have high light absorption characteristics in a longer-wavelength near-infrared region and enables the dark current to be reduced. Therefore, the photoelectric conversion element can exhibit high light absorption characteristics in a wide range of the near-infrared region.

In the photoelectric conversion element, the ionization potential of the photoelectric conversion film may be, for example, 5.1 eV or more.

This reduces the dark current in the photoelectric conversion element.

In the photoelectric conversion element, the concentration of the composition in the photoelectric conversion film may be, for example, 5% by weight to 25% by weight.

This enables the photoelectric conversion element to ensure both the reduction of the dark current and sensitivity in the near-infrared region.

In the photoelectric conversion element, the absorption spectrum of the photoelectric conversion film may include an absorption peak in a wavelength range of, for example, 803 nm or more.

This allows the photoelectric conversion element to have high light absorption characteristics over a wide range of the near-infrared region.

An imaging device according to an aspect of the present disclosure includes a substrate, a charge detection circuit placed at a surface of the substrate, a photoelectric converter placed on the substrate, and a pixel electrically connected to the charge detection circuit and the photoelectric converter. The photoelectric converter includes the photoelectric conversion element.

This allows the imaging device to have high light absorption characteristics in a longer-wavelength near-infrared region and enables the imaging device to reduce the dark current.

Embodiments of the present disclosure are described below in detail with reference to the accompanying drawings.

Each of the embodiments below illustrates a general or specific example. Numerical values, shapes, materials, components, the positions of the components, ways to connect the components, steps, the order of the steps, and the like described in the embodiments below are examples and are not intended to limit the present disclosure. Among components in the embodiments below, components not described in independent claims indicating the highest concepts are described as arbitrary components. The drawings are not necessarily strict illustrations. In the drawings, substantially the same components are given the same reference numerals and will not be redundantly described or will be briefly described.

EMBODIMENTS

Embodiments of the present disclosure are described below.

Composition

First, a composition according to an embodiment of the present disclosure is described. The composition contains a phthalocyanine derivative represented by the following formula:

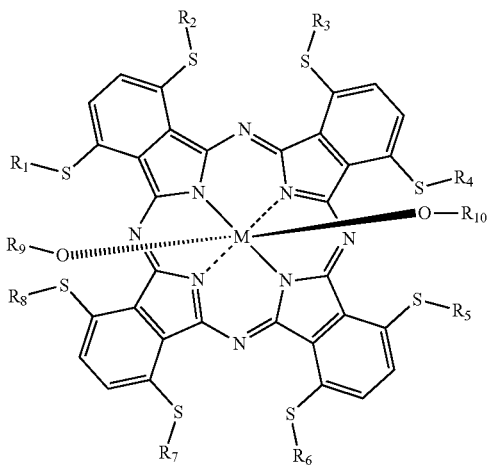 (1)

where $R_1$ to $R_8$ are independently an alkyl group or an aryl group, M is a tetravalent metal, each of $R_9$ and $R_{10}$ is any one of substituents represented by the following formulas, $R_{11}$ to $R_{13}$ are independently an alkyl group, and $R_{14}$ to $R_{18}$ are independently an alkyl group or an aryl group:

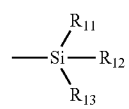 (2)

 (3)

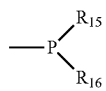 (4)

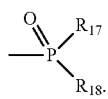 (5)

Since the composition contains the phthalocyanine derivative, which is represented by Formula (1), the composition has high light absorption characteristics in the near-infrared region and can reduce the dark current.

The phthalocyanine derivative, which is represented by Formula (1), has an axial ligand-type structure having a tetravalent metal as a central metal and two axial ligands above and below the molecular plane. This reduces the interaction between molecules; hence, film formation by vapor deposition is easy. The phthalocyanine derivative, which is represented by Formula (1), has electron-withdrawing axial ligands. Therefore, the electron density of a phthalocyanine ring is low and both the energy level of the highest occupied molecular orbital (HOMO) (hereinafter referred to as the HOMO level) and the energy level of the lowest unoccupied molecular orbital (LUMO) (hereinafter referred to as the LUMO level) are deep. Furthermore, the phthalocyanine derivative has an electron-donating α-side chain and therefore the LUMO level only is low. A combination of effects due to the fact that the phthalocyanine derivative has the above-mentioned central metal, axial ligands, and α-side chain allows the HOMO level and LUMO level to be deep and the LUMO level only to be further deep. Therefore, the phthalocyanine derivative is such that the fall of the LUMO level is larger than the fall of HOMO level. This allows the HOMO level of the phthalocyanine derivative to be large and the energy gap (Eg) that is the difference between the HOMO level and LUMO level thereof to be narrow. Thus, the composition has high light absorption characteristics in the near-infrared region, a deep HOMO energy level, and a reduced ionization potential because the composition contains the phthalocyanine derivative. The increase in value of the ionization potential enables the composition to reduce the dark current in a case where the composition is used in a near-infrared photoelectric conversion element or the like.

In Formula (1), $R_1$ to $R_8$ may be the same or different and may be alkyl groups from the viewpoint of photoelectric conversion efficiency. The alkyl groups include linear or branched alkyl groups. In particular, $R_1$ to $R_8$ may contain five or less carbon atoms. Examples of $R_1$ to $R_8$ include a methyl group, an ethyl group, a propyl group, a butyl group, and a pentyl group.

When the phthalocyanine derivative, which is represented by Formula (1), has an alkylthio or arylthio group, which contains sulfur, at an α-position, the composition has an absorption wavelength peak, that is, an absorption maximum wavelength in a near-infrared region of 803 nm or more. That is, the phthalocyanine derivative has an absorption wavelength peak at a longer wavelength as compared to phthalocyanine derivatives containing no sulfur at an α-position and can have high light absorption characteristics over a wide range of the near-infrared region.

Furthermore, in the composition, when the phthalocyanine derivative, which is represented by Formula (1), has alkyl groups containing five or less carbon atoms in $R_1$ to $R_8$, the phthalocyanine derivative is solid at room temperature and is readily synthesized.

In Formula (1), $R_{11}$ to $R_{13}$ may be the same or different and are independently an alkyl group and $R_{14}$ to $R_{18}$ may be the same or different and are independently an alkyl group or an aryl group. The alkyl groups may include an unsubstituted or substituted alkyl group which is linear, branched, or cyclic.

Examples of the unsubstituted alkyl group include linear alkyl groups such as a methyl group, an ethyl group, an n-propyl group, an n-butyl group, an n-pentyl group, an n-hexyl group, an n-heptyl group, an n-octyl group, an n-nonyl group, an n-decyl group, an n-undecyl group, and an n-dodecyl group; branched alkyl groups such as an isopropyl group, an iso-butyl group, a sec-butyl group, a tert-butyl group, an iso-pentyl group, a neo-pentyl group, a tert-pentyl group, an iso-hexyl group, a sec-hexyl group, a tert-hexyl group, an iso-heptyl group, a sec-heptyl group, a tert-heptyl group, an iso-octyl group, a sec-octyl group, a tert-octyl group, an isononyl group, a sec-nonyl group, a tert-nonyl group, an iso-decyl group, a sec-decyl group, a tert-decyl group, an iso-undecyl group, a sec-undecyl group, a tert-undecyl group, an iso-dodecyl group, a sec-dodecyl group, and a tert-dodecyl group; and cyclic alkyl groups such as a cyclopropyl group, a cyclobutyl group, a cyclopentyl group, a cyclohexyl group, a cycloheptyl group, a cyclooctyl group, a cyclononyl group, a cyclodecyl group, a cycloundecyl group, and a cyclododecyl group.

The above alkyl groups may further have a substituent. Examples of the substituent include an alkyl group, an alkoxy group, a halogen atom, a hydroxy group, an amino group, a thiol group, a silyl group, an ester group, an aryl group, a heteroaryl group, and other known substituents. Examples of a halogen-substituted alkyl group include a ω-bromoalkyl group and a perfluoroalkyl group. Examples of a hydroxy-substituted alkyl group include a methylol group and a butylol group. Examples of an amino-substituted alkyl group include primary and secondary amino groups such as a dimethylamino group, a diphenylamino group, a methylphenylamino group, a methylamino group, and an ethylamino group. Examples of a thiol-substituted alkyl group include a mercapto group and an alkylthio group. Examples of a silyl-substituted alkyl group include a trimethylsilyl group, a triethylsilyl group, a tripropylsilyl group, a triisopropylsilyl group, a dimethylisopropylsilyl group, and a dimethyl-tert-butylsilyl group. Examples of an ester-substituted alkyl group include a methoxycarbonyl group, an ethoxycarbonyl group, a propoxycarbonyl group, an isopropoxycarbonyl group, a tert-butoxycarbonyl group, a phenoxycarbonyl group, an acetyloxy group, and a benzoyloxy group.

The aryl group is, for example, an aromatic hydrocarbon group such as a phenyl group, a naphthyl group, a biphenyl group, a phenanthryl group, an anthryl group, a terphenyl group, a pyrenyl group, a fluorenyl group, or a perylenyl group or a heteroaryl group and may be unsubstituted or substituted. Examples of a substituent for substitution include substituents cited as examples of the substituent that the alkyl groups have.

In Formula (1), $R_{11}$ to $R_{13}$ may be alkyl groups containing tenor less carbon atoms or four or less carbon atoms from the viewpoint of solubility and the easiness of synthesis; $R_{14}$ may be an alkyl group containing ten or less carbon atoms; and each of $R_{15}$ to $R_{18}$ may be a phenyl group, a fluorophenyl group, or a trifluoromethylphenyl group.

In Formula (1), M, which is the central metal, may be Si or Sn from the viewpoint of the easiness of synthesis.

In Formula (1), at least one hydrogen atom contained in at least one selected from the group consisting of $R_9$ and $R_{10}$ may be substituted by a fluorine atom or a fluorine-containing group. The term "substituted by a fluorine atom" as used herein means that a fluorine atom is directly substituted to carbon contained in the skeleton of an alkyl group or an aryl group contained in $R_9$ and $R_{10}$. The term "substituted by a fluorine-containing group" as used herein means that carbon contained in the skeleton of an alkyl group or an aryl group contained in $R_9$ and $R_{10}$ has another substituent and a fluorine atom is directly substituted to the other substituent.

In the composition, when the phthalocyanine derivative, which is represented by Formula (1), is such that at least one hydrogen atom in $R_9$ and $R_{10}$ is substituted by the fluorine atom or the fluorine-containing group, electron-withdrawing properties of the axial ligands that the phthalocyanine derivative has are higher; hence, the energy density of a phthalocyanine ring is lower and both the HOMO level and the LUMO level are deeper. Thus, in a case where at least one hydrogen atom in $R_9$ and $R_{10}$ is substituted by the fluorine atom or the fluorine-containing group and the phthalocyanine derivative, which is represented by Formula (1), is used in a near-infrared photoelectric conversion element, the phthalocyanine derivative can further reduce the dark current.

The fluorine-containing group is, for example, an alkyl group, aryl group, or alkenyl group in which at least one hydrogen atom is substituted by a fluorine atom. Examples of the alkyl group and the aryl group are as described above. Examples of the fluorine-containing group include a fluoromethyl group, a difluoromethyl group, a trifluoromethyl group, a fluoroethyl group, a difluoroethyl group, a trifluoroethyl group, a tetrafluoroethyl group, a pentafluoroethyl group, a fluorophenyl group, a difluorophenyl group, a trifluorophenyl group, a trifluoromethylphenyl group, a tetrafluorophenyl group, and a pentafluorophenyl group.

The fluorine-containing group may further include an alkyl group, alkoxy group, a hydrogen atom, a hydroxy group, an amino group, a thiol group, a silyl group, an ester group, an aryl group, a heteroaryl group, and another known substituent.

From the viewpoint of the easiness of synthesis, $R_9$ and $R_{10}$ may be represented by Formula (5), $R_{17}$ and $R_{18}$ in Formula (5) may be independently an aryl group, and at least one hydrogen atom contained in at least one selected from the group consisting of R17 and R18 may be substituted by a fluorine atom or a fluorine-containing group. In particular, R17 and R18 may be independently a phenyl group and at least one hydrogen atom contained in at least one selected from the group consisting of R17 and R18 may be substituted by a fluorine atom or a trifluoromethyl group. Examples of R17 and R18 include a 2-fluorophenyl group, a 3-fluorophenyl group, a 4-fluorophenyl group, a 3,5-difluorophenyl group, a pentafluorophenyl group, a 3-trifluoromethylphenyl group, a 4-trifluoromethylphenyl group, and a 3,5-bis(trifluoromethyl)phenyl group.

The phthalocyanine derivative, which is represented by Formula (1), is further described below in detail. When the phthalocyanine derivative, which is represented by Formula (1), is a compound represented by one of Formulas (6) to (11), the phthalocyanine derivative can be readily synthesized. This enables the composition to be relatively readily obtained such that the composition has high light absorption characteristics in a longer-wavelength near-infrared region and can reduce the dark current. When at least one hydrogen atom in R17 and R18 is substituted by a fluorine atom or a fluorine-containing group and the phthalocyanine derivative, which is represented by Formula (1), is a compound represented by one of Formulas (12) to (15), the phthalocyanine derivative can be readily synthesized. This enables the composition to be relatively readily obtained such that the composition can further reduce the dark current.

In this embodiment, in Formula (1), $R_1$ to $R_8$ may be pentyl groups, which contain five carbon atoms; M may be Si; and each of $R_9$ and $R_{10}$ may be the substituent represented by Formula (2). In Formula (2), $R_{11}$ to $R_{13}$ may be independently an alkyl group containing ten or less carbon atoms or may be the same alkyl group. In this case, supposing that $R_{11}$ to $R_{13}$ are represented by X, the phthalocyanine derivative, which is represented by Formula (1), is a compound represented by Formula (6) below. When each of $R_{11}$ to $R_{13}$ is, for example, a butyl group, which contains four carbon atoms, the phthalocyanine derivative, which is represented by Formula (1), is such a compound that X in Formula (6) is a butyl group.

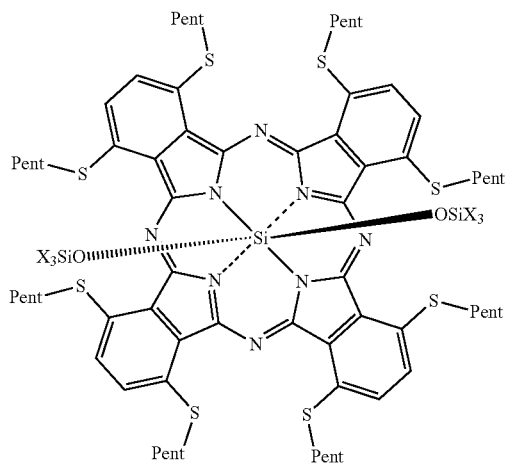

(6)

In this embodiment, in Formula (1), $R_1$ to $R_8$ may be pentyl groups, which contain five carbon atoms; M may be Sn; and each of $R_9$ and $R_{10}$ may be the substituent represented by Formula (2). In Formula (2), $R_{11}$ to $R_{13}$ may be independently an alkyl group containing ten or less carbon atoms or may be the same alkyl group. In this case, supposing that $R_{11}$ to $R_{13}$ are represented by X, the phthalocyanine derivative, which is represented by Formula (1), is a compound represented by Formula (7) below. When each of $R_{11}$ to $R_{13}$ is, for example, a hexyl group, which contains six carbon atoms, the phthalocyanine derivative, which is represented by Formula (1), is such a compound that X in Formula (7) is a hexyl group.

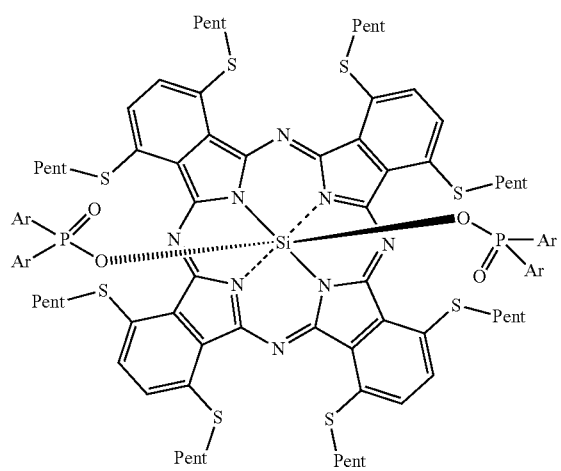

(8)

In this embodiment, in Formula (1), $R_1$ to $R_8$ may be ethyl groups, which contain two carbon atoms; M may be Si; and each of $R_9$ and $R_{10}$ may be the substituent represented by Formula (2). In Formula (2), $R_{11}$ to $R_{13}$ may be independently an alkyl group containing ten or less carbon atoms or may be the same alkyl group. In this case, supposing that $R_{11}$ to $R_{13}$ are represented by X, the phthalocyanine derivative, which is represented by Formula (1), is a compound represented by Formula (9) below. When each of $R_{11}$ to $R_{13}$ is, for example, a butyl group, which contains four carbon atoms, the phthalocyanine derivative, which is represented by Formula (1), is such a compound that X in Formula (9) is a butyl group.

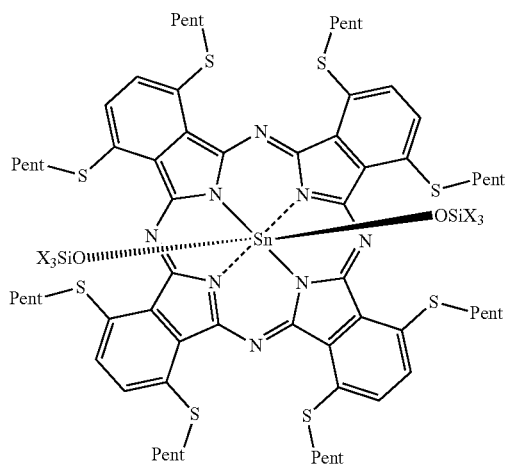

(7)

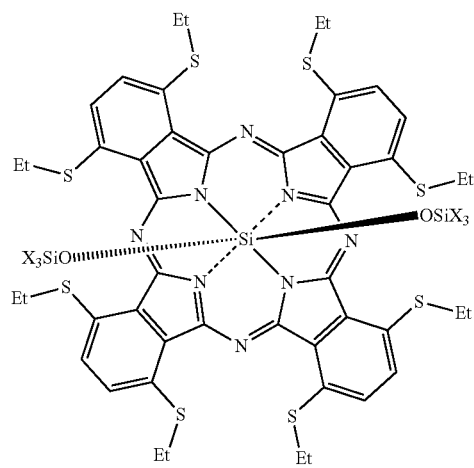

(9)

In this embodiment, in Formula (1), $R_1$ to $R_8$ may be pentyl groups, which contain five carbon atoms; M may be Si; and each of $R_9$ and $R_{10}$ may be the substituent represented by Formula (5). In Formula (5), $R_{17}$ and $R_{18}$ may be independently an aryl group or may be the same aryl group. In this case, supposing that $R_{17}$ and $R_{18}$ are represented by Ar, the phthalocyanine derivative, which is represented by Formula (1), is a compound represented by Formula (8) below. When each of $R_{17}$ and $R_{18}$ is, for example, a phenyl group, the phthalocyanine derivative, which is represented by Formula (1), is such a compound that Ar in Formula (8) is a phenyl group.

In this embodiment, in Formula (1), $R_1$ to $R_8$ may be ethyl groups, which contain two carbon atoms; M may be Si; and each of $R_9$ and $R_{10}$ may be the substituent represented by Formula (5). In Formula (5), $R_{17}$ and $R_{18}$ may be independently an aryl group or may be the same aryl group. In this case, supposing that $R_{17}$ and $R_{18}$ are represented by Ar, the phthalocyanine derivative, which is represented by Formula (1), is a compound represented by Formula (10) below. When each of $R_{17}$ and $R_{18}$ is, for example, a phenyl group, the phthalocyanine derivative, which is represented by Formula (1), is such a compound that Ar in Formula (10) is a phenyl group.

(10)

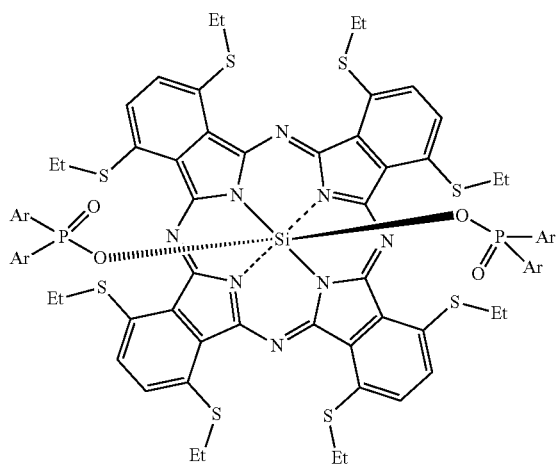

In this embodiment, in Formula (1), $R_1$ to $R_8$ may be isopropyl groups, which contain three carbon atoms; M may be Sn; and each of $R_9$ and $R_{10}$ may be the substituent represented by Formula (2). In Formula (2), $R_{11}$ to $R_{13}$ may be independently an alkyl group containing ten or less carbon atoms or may be the same alkyl group. In this case, supposing that $R_{11}$ to $R_{13}$ are represented by X, the phthalocyanine derivative, which is represented by Formula (1), is a compound represented by Formula (11) below. When each of $R_{11}$ to $R_{13}$ is, for example, a hexyl group, which contains six carbon atoms, the phthalocyanine derivative, which is represented by Formula (1), is such a compound that X in Formula (11) is a hexyl group.

(11)

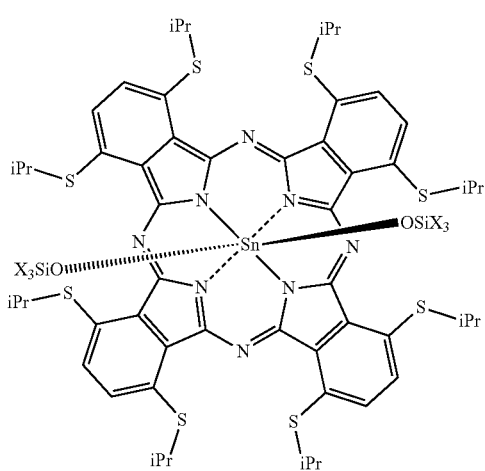

In this embodiment, in Formula (1), $R_1$ to $R_8$ may be pentyl groups, which contain five carbon atoms; M may be Si; and each of $R_9$ and $R_{10}$ may be the substituent represented by Formula (5). In Formula (5), $R_{17}$ to $R_{18}$ may be 4-fluorophenyl groups. In this case, the phthalocyanine derivative, which is represented by Formula (1), is a compound represented by the following formula:

(12)

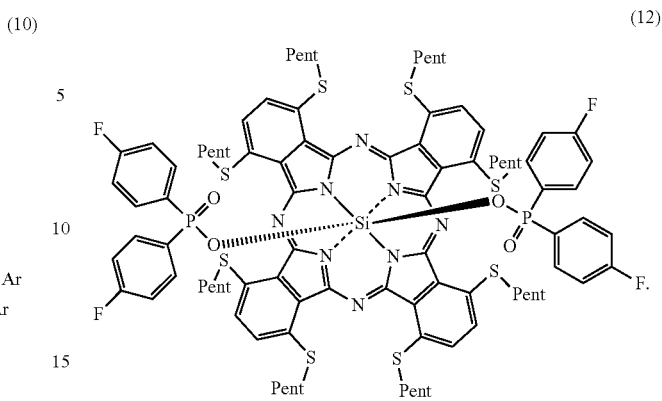

In this embodiment, in Formula (1), $R_1$ to $R_8$ may be pentyl groups, which contain five carbon atoms; M may be Si; and each of $R_9$ and $R_{10}$ may be the substituent represented by Formula (5). In Formula (5), $R_{17}$ to $R_{18}$ may be 3,5-difluorophenyl groups. In this case, the phthalocyanine derivative, which is represented by Formula (1), is a compound represented by the following formula:

(13)

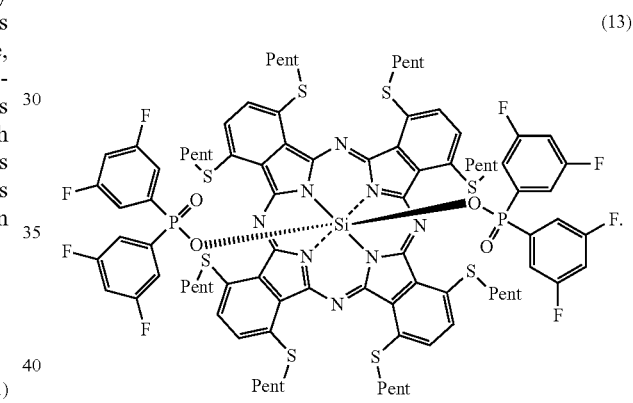

In this embodiment, in Formula (1), $R_1$ to $R_8$ may be pentyl groups, which contain five carbon atoms; M may be Si; and each of $R_9$ and $R_{10}$ may be the substituent represented by Formula (5). In Formula (5), $R_{17}$ to $R_{18}$ may be 4-trifluoromethylphenyl groups. In this case, the phthalocyanine derivative, which is represented by Formula (1), is a compound represented by the following formula:

(14)

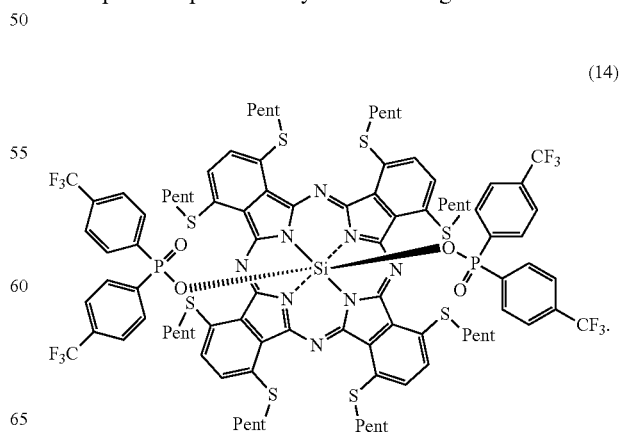

In this embodiment, in Formula (1), $R_1$ to $R_8$ may be pentyl groups, which contain five carbon atoms; M may be Si; and each of $R_9$ and $R_{10}$ may be the substituent represented by Formula (5). In Formula (5), $R_{17}$ to $R_{18}$ may be 3,5-bistrifluorophenyl groups. In this case, the phthalocyanine derivative, which is represented by Formula (1), is a compound represented by the following formula:

In this embodiment, in a case where Sn is used as a central metal, after a phthalocyanine derivative having no central metal is synthesized, Sn is introduced into the center of the phthalocyanine ring using a reagent containing $SnCl_2$. On the other hand, in a case where Si is used as a central metal, the phthalocyanine ring is formed and Si is introduced into

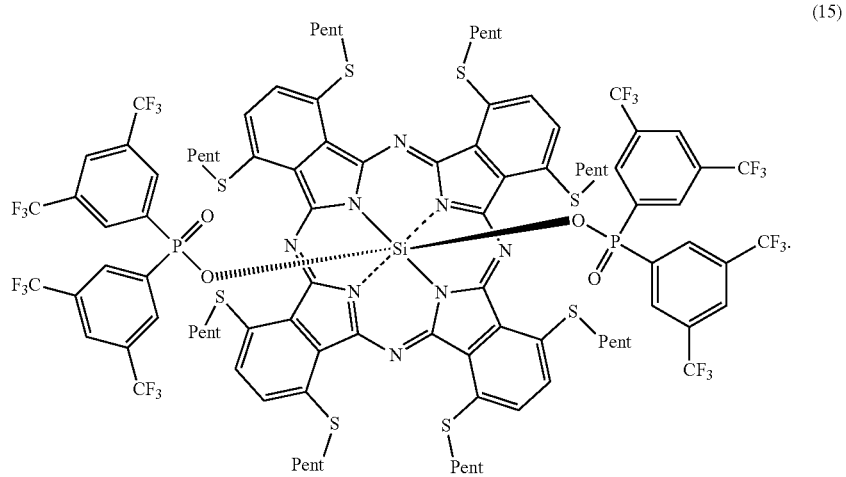

(15)

A method for synthesizing the phthalocyanine derivative, which is represented by Formula (1), in this embodiment is described below.

A reaction for the formation of a phthalocyanine ring of the phthalocyanine derivative, which is represented by Formula (1), can be carried out in accordance with Hirofusa Shirai and Nagao Kobayashi, "Phthalocyanine—Chemistry and Function", IPC, 1997, pp. 1-62 (Non-Patent Document 4).

Examples of a typical method for synthesizing the phthalocyanine derivative include a Weiler method, phthalonitrile method, lithium method, subphthalocyanine method, and chlorinated phthalonitrile method described in Non-Patent Document 4. In this embodiment, any reaction conditions may be used in a phthalocyanine ring-forming reaction. In the phthalocyanine ring-forming reaction, Sn or Si, which serves as a central metal in phthalocyanine, may be added. After a phthalocyanine derivative having no central metal is synthesized, Sn or Si may be introduced.

A reaction solvent used may be any solvent and is preferably a high-boiling point solvent. In order to promote the phthalocyanine ring-forming reaction, acid or base may be used and, in particular, base is preferably used. The optimum reaction conditions vary depending on the structure of a target phthalocyanine derivative and may be set with reference to detailed reaction conditions described in Non-Patent Document 4.

Raw materials used to synthesize the above phthalocyanine derivative may be derivatives such as naphthalic anhydride, naphthalimide, naphthalic acid, salts of naphthalic acid, naphthalic diamide, naphthalonitrile, and 1,3-diiminobenzoisoindoline. These raw materials may be synthesized by any known methods.

the center thereof using an isoindoline derivative and a reagent containing $SiCl_4$ in combination.

Photoelectric Conversion Element

A photoelectric conversion element according to an embodiment of the present disclosure is described below with reference to FIG. 1. FIG. 1 is a schematic sectional view of a near-infrared photoelectric conversion element 10A that is an example of the photoelectric conversion element.

The near-infrared photoelectric conversion element 10A includes a pair of electrodes, that is, an upper electrode 4 and a lower electrode 2 and also includes a near-infrared photoelectric conversion film 3 which is placed between the upper electrode 4 and the lower electrode 2 and which contains the above-mentioned composition.

The near-infrared photoelectric conversion element 10A is supported with, for example, a support substrate 1.

The support substrate 1 is transparent to near-infrared light and therefore light enters the photoelectric conversion element 10A through the support substrate 1. The support substrate 1 may be a substrate for use in general photoelectric conversion elements and may be, for example, a glass substrate, a quartz substrate, a semiconductor substrate, a plastic substrate, or the like. The expression "transparent to near-infrared light" means that something is substantially transparent to near-infrared light and the transmittance of light in the near-infrared region is, for example, 60% or more. The transmittance of light in the near-infrared region may be 80% or more and 90% or more.

Components of the photoelectric conversion element 10A are described below.

The near-infrared photoelectric conversion film 3 is prepared using, for example, a composition containing a phthalocyanine derivative represented by the following formula:

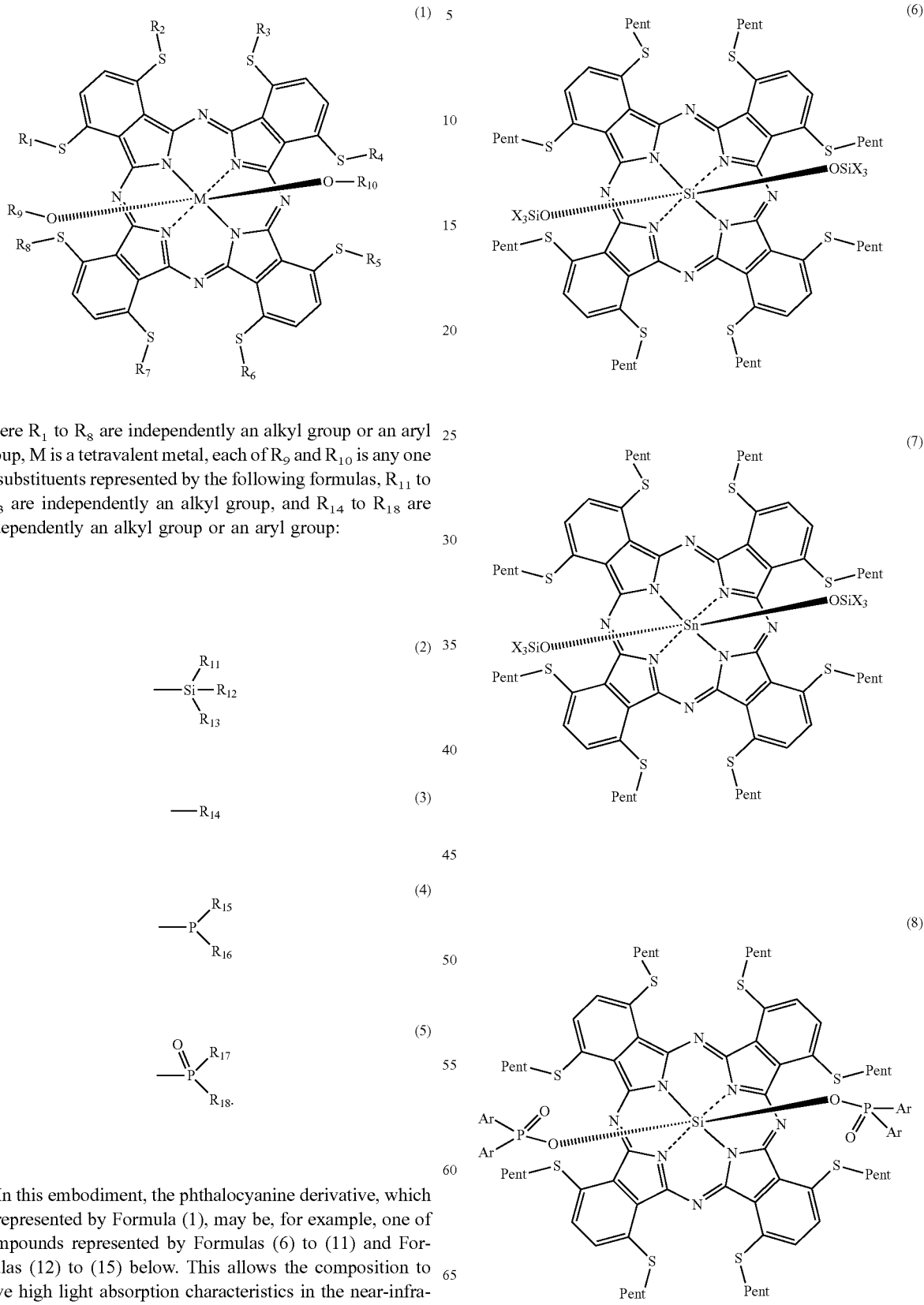

where $R_1$ to $R_8$ are independently an alkyl group or an aryl group, M is a tetravalent metal, each of $R_9$ and $R_{10}$ is any one of substituents represented by the following formulas, $R_{11}$ to $R_{13}$ are independently an alkyl group, and $R_{14}$ to $R_{18}$ are independently an alkyl group or an aryl group:

In this embodiment, the phthalocyanine derivative, which is represented by Formula (1), may be, for example, one of compounds represented by Formulas (6) to (11) and Formulas (12) to (15) below. This allows the composition to have high light absorption characteristics in the near-infrared region.

(9)
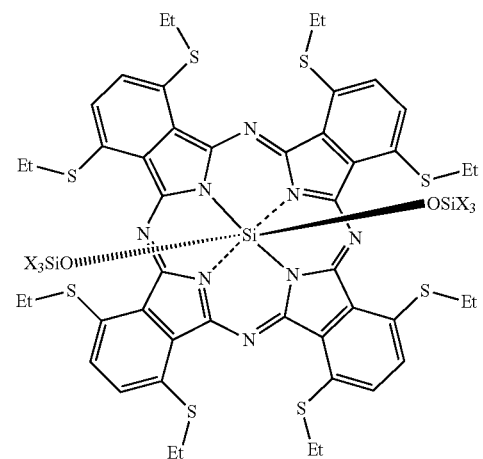
(10)
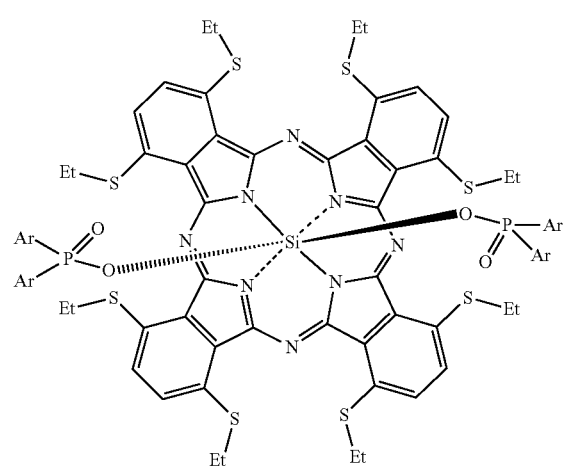
(11)
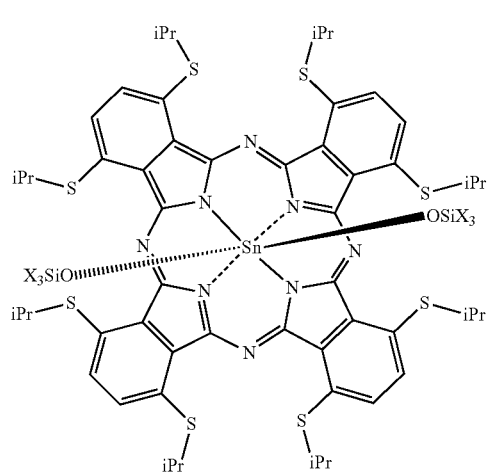
(12)
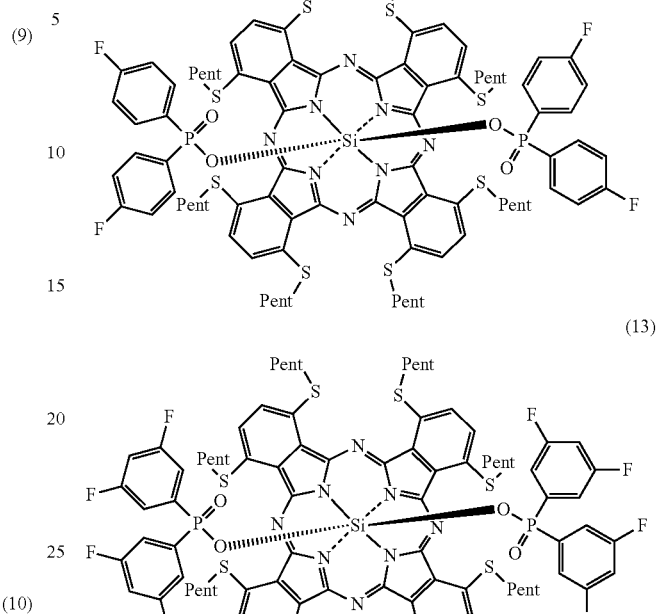
(13)
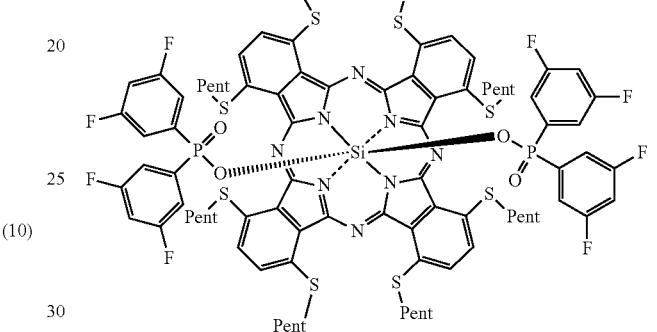
(14)
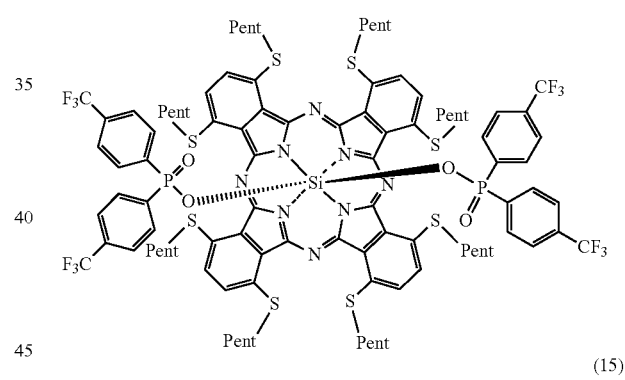
(15)
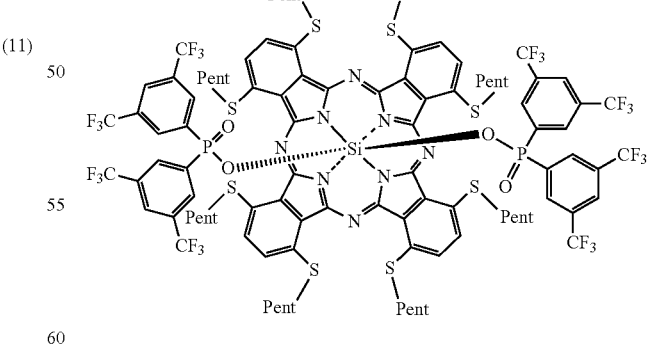
The following method can be used to prepare the photoelectric conversion film 3: for example, a coating method by spin coating, a vacuum vapor deposition method in which a film material is evaporated by heating under vacuum and is deposited on a substrate, or the like. In a case where preventing the contamination of impurities and forming multiple layers for increased functionality with a higher degree of freedom are taken into account, a vapor deposition method may be used. An evaporation system used may be a commercially available one. The temperature of an evaporation source during vapor deposition may be 100° C. to 500° C. or may be 150° C. to 400° C. The degree of vacuum during vapor deposition may be $1\times10^{-6}$ Pa to 1 Pa or may be $1\times10^{-6}$ Pa to $1\times10^{-4}$ Pa. Furthermore, the following method may be used: a method in which the rate of evaporation is increased by adding fine metal particles or the like to the evaporation source.

The blending ratio between materials for the photoelectric conversion film 3 is expressed on a weight basis in the case of the coating method or on a volume basis in the case of the vapor deposition method. In particular, in the coating method, the blending ratio is determined using the weight of each material used to prepare a solution. In the vapor deposition method, the blending ratio between the materials is determined in such a manner that the thickness of a layer of each deposited material is monitored with a thickness meter during vapor deposition.

For the blending ratio between the above materials, in, for example, the near-infrared photoelectric conversion element 10A and a near-infrared photoelectric conversion element 10B (described below with reference to FIG. 2), the concentration of the composition in the near-infrared photoelectric conversion film 3 may be 5% by weight to 25% by weight. This enables the near-infrared photoelectric conversion elements 10A and 10B to ensure both the reduction of the dark current and sensitivity in the near-infrared region.

Studies by the inventors have shown that when a composition contains a naphthalocyanine derivative which contains tin (Sn) as a central metal and which has an α-side chain and axial ligands, the concentration of the composition in a near-infrared photoelectric conversion film is preferably 5% by weight to 25% by weight. In the naphthalocyanine derivative, electrons move from an electron cloud spreading over naphthalocyanine to an acceptor-type organic compound (for example, fullerene (C60)). Therefore, it is conceivable that replacing a naphthalocyanine ring with a phthalocyanine ring has no significant influence on the photoelectric conversion efficiency.

In this embodiment, the absorption maximum wavelength in the absorption spectrum of the near-infrared photoelectric conversion film 3 is 803 nm or more and may be 820 nm or more or may be 860 nm or more. This allows the near-infrared photoelectric conversion film 3 to have high light absorption characteristics over a wide range of the near-infrared region.

The ionization potential of the near-infrared photoelectric conversion film 3 is 5.1 eV or more. This reduces the dark current in the near-infrared photoelectric conversion film 3.

At least one of the upper electrode 4 and the lower electrode 2 is a transparent electrode made of a conducting material transparent to near-infrared light. A bias voltage is applied to each of the lower electrode 2 and the photoelectric conversion film 3 through a wiring line (not shown). For example, the polarity of the bias voltage is set such that, among charges generated in the photoelectric conversion film 3, electrons move to the upper electrode 4 and holes move to the lower electrode 2. Alternatively, the polarity of the bias voltage may be set such that, among charges generated in the photoelectric conversion film 3, holes move to the upper electrode 4 and electrons move to the lower electrode 2.

The bias voltage may be applied such that the value obtained by dividing the applied voltage by the distance between the lower electrode 2 and the upper electrode 4, that is, the electric field generated in the photoelectric conversion element 10A is within a range of $1.0\times10^3$ V/cm to $1.0\times10^7$ V/cm or within a range of $1.0\times10^4$ V/cm to $1.0\times10^7$ V/cm. Adjusting the magnitude of the bias voltage as described above allows charges to efficiently move to the upper electrode 4, thereby enabling signals to be extracted outside depending on the charges.

A material for the lower electrode 2 and the upper electrode 4 may be a transparent conducting oxide (TCO) which has high transmittance for light in the near-infrared region and low resistance. A metal thin film made of Au or the like can be used as a transparent electrode and has an extremely increased resistance in some cases as compared to a transparent electrode that is prepared so as to have a transmittance of 60% to 80% in order to obtain a transmittance of 90% or more for light in the near-infrared region. Therefore, the TCO is more effective in obtaining transparent electrodes which are highly transparent to near-infrared light and which have low resistance than metal materials such as Au. The TCO is not particularly limited. Examples of the TCO include indium tin oxide (ITO), indium zinc oxide (IZO), aluminum-doped zinc oxide (AZO), fluorine-doped tin oxide (FTO), $SnO_2$, $TiO_2$, and $ZnO_2$. The lower electrode 2 and the upper electrode 4 may be prepared in such a manner that the TCO and a metal material such as Au are appropriately used alone or in combination depending on desired transmittance.

The material for the lower electrode 2 and the upper electrode 4 is not limited to the above-mentioned conducting material transparent to near-infrared light and may be another material.

Various methods are used to prepare the lower electrode 2 and the upper electrode 4 depending on a material used. In the case of using, for example, ITO, the following method may be used: an electron beam method, a sputtering method, a resistive heating evaporation method, a chemical reaction method such as a sol-gel method, a coating method using a dispersion of indium tin oxide, or the like. In this case, after an ITO film is formed, the ITO film may be subjected to a UV-ozone treatment, a plasma treatment, or the like.

According to the photoelectric conversion element 10A, photoelectric conversion is induced in the photoelectric conversion film 3 by near-infrared light entering the photoelectric conversion film 3 through the support substrate 1 and the lower electrode 2. This allows holes and electrons of generated hole-electron pairs to be collected by the lower electrode 2 and the upper electrode 4, respectively. Thus, near-infrared light entering the photoelectric conversion element 10A can be detected by measuring, for example, the potential of the lower electrode 2.

The photoelectric conversion element 10A may further include an electron-blocking layer 5 and hole-blocking layer 6 described below. The injection of electrons into the photoelectric conversion film 3 from the lower electrode 2 and the injection of holes into the photoelectric conversion film 3 from the upper electrode 4 can be suppressed by sandwiching the photoelectric conversion film 3 between the electron-blocking layer 5 and the hole-blocking layer 6. This enables the dark current to be reduced. Incidentally, details of the electron-blocking layer 5 and the hole-blocking layer 6 are described below.

Figure 2:
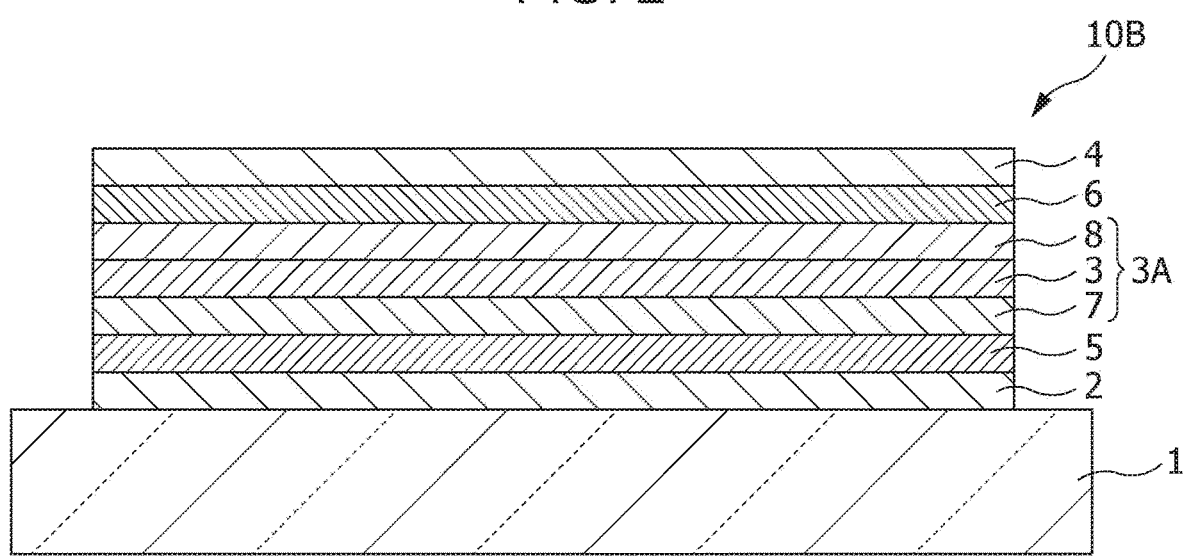
FIG. 2 is a schematic sectional view of another example of the photoelectric conversion element.
Figure 3:
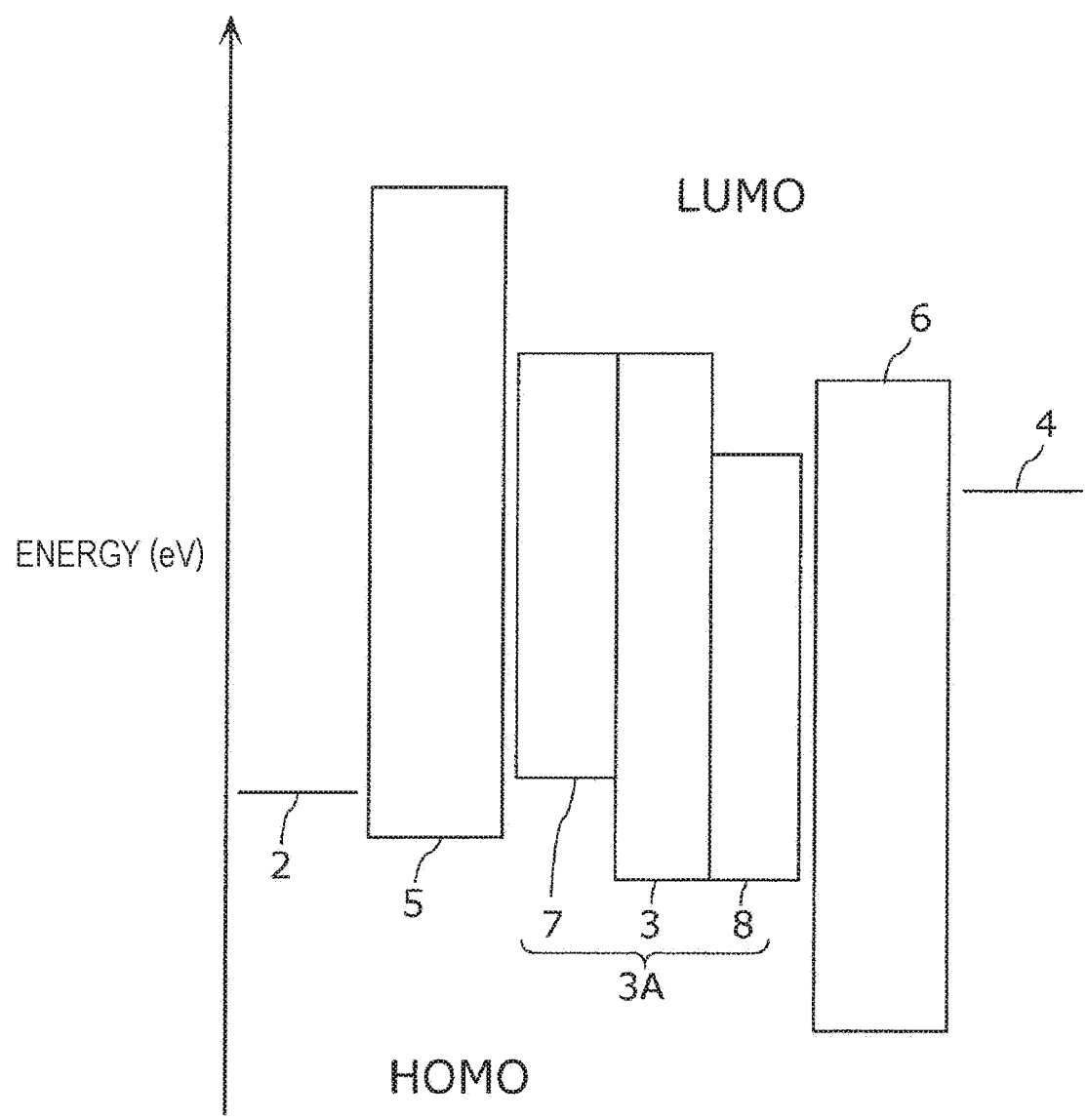
FIG. 3 is an energy band diagram of a near-infrared photoelectric conversion element shown in FIG. 2.

Next, another example of the photoelectric conversion element is described with reference to FIGS. 2 and 3. FIG. 2 is a schematic sectional view of the near-infrared photoelectric conversion element 10B, which is another example of the photoelectric conversion element. FIG. 3 shows an example of an energy band diagram of the near-infrared photoelectric conversion element 10B. In the near-infrared photoelectric conversion element 10, which is shown in FIG. 2, the same components as those of the photoelectric conversion element 10A, which is shown in FIG. 1, are given the same reference numerals.

As shown in FIG. 2, the near-infrared photoelectric conversion element 10B includes at least a lower electrode 2, an upper electrode 4, and a photoelectric conversion layer 3A placed between the lower electrode 2 and the upper electrode 4. The photoelectric conversion layer 3A includes, for example, a near-infrared photoelectric conversion film 3, a p-type semiconductor layer 7 functioning as a hole transport layer, and an n-type semiconductor layer 8 functioning as an electron transport layer. The near-infrared photoelectric conversion film 3 is placed between the p-type semiconductor layer 7 and the n-type semiconductor layer 8. The near-infrared photoelectric conversion element 10B further includes an electron-blocking layer 5 placed between the lower electrode 2 and the photoelectric conversion layer 3A and a hole-blocking layer 6 placed between the upper electrode 4 and the photoelectric conversion layer 3A. The near-infrared photoelectric conversion film 3 is as described above in the description of the near-infrared photoelectric conversion element 10A, which is shown in FIG. 1, and is not described in detail herein.

The photoelectric conversion layer 3A includes the near-infrared photoelectric conversion film 3, the p-type semiconductor layer 7 functioning, and the n-type semiconductor layer 8. Herein, at least one of a p-type semiconductor contained in the p-type semiconductor layer 7 and an n-type semiconductor contained in the n-type semiconductor layer 8 may be an organic semiconductor below.

The photoelectric conversion layer 3A may contain the above-mentioned composition and at least one of an organic p-type semiconductor and an organic n-type semiconductor.

The photoelectric conversion layer 3A may include a bulk heterojunction structure layer containing a mixture of the p-type semiconductor and n-type semiconductor. When the photoelectric conversion layer 3A includes the bulk heterojunction structure layer, the disadvantage that the carrier diffusion length in the photoelectric conversion layer 3A is short can be compensated for and the photoelectric conversion efficiency can be enhanced.

The photoelectric conversion layer 3A may further include a bulk heterojunction structure layer between the p-type semiconductor layer 7 and the n-type semiconductor layer 8. Sandwiching the bulk heterojunction structure layer between the p-type semiconductor layer 7 and the n-type semiconductor layer 8 allows the rectification of holes and electrons to be higher than that in the bulk heterojunction structure layer and reduces the loss due to the recombination of separated holes and electrons, thereby enabling higher photoelectric conversion efficiency to be obtained. The bulk heterojunction structure layer is as described in Japanese Patent No. 5553727, in which a bulk hetero-type active layer is described in detail.

In the bulk heterojunction structure layer, the contact of the p-type semiconductor with the n-type semiconductor generates charges even in a dark state in some cases. Therefore, reducing the contact of the p-type semiconductor with the n-type semiconductor enables the dark current to be reduced. When the bulk heterojunction structure layer contains a large amount of the n-type semiconductor, such as a fullerene derivative, from the viewpoint of charge mobility, element resistance can be reduced. In this case, the volume ratio and weight ratio of the n-type semiconductor to the p-type semiconductor in the bulk heterojunction structure layer may be four or more. However, the reduction in proportion of the p-type semiconductor in the bulk heterojunction structure layer reduces the sensitivity in the near-infrared region. Therefore, the volume ratio of the n-type semiconductor to the p-type semiconductor in the bulk heterojunction structure layer need not be too large from the viewpoint of sensitivity. The volume ratio of the n-type semiconductor to p-type semiconductor in the bulk heterojunction structure layer may be, for example, 20 or less. When the volume ratio of the n-type semiconductor to p-type semiconductor in the bulk heterojunction structure layer is from four to 20 as disclosed in Japanese Unexamined Patent Application Publication No. 2016-225456, both the reduction of the dark current and the sensitivity in the near-infrared region can be ensured.

The organic p-type semiconductor is a donor organic semiconductor, is mainly typified by a hole-transporting organic compound, and refers to an organic compound having the property of donating an electron. In particular, the organic p-type semiconductor refers to one of two organic compounds that has lower ionization potential in a case where the two organic compounds are used in contact with each other. Thus, the donor organic semiconductor used may be any organic compound having an electron-donating property. For example, the following compounds can be used: triarylamine compounds; benzidine compounds; pyrazoline compounds; styrylamine compounds; hydrazone compounds; triphenylmethane compounds; carbazole compounds; polysilane compounds; thiophene compounds; phthalocyanine compounds; cyanine compounds; merocyanine compounds; oxonol compounds; polyamine compounds; indole compounds; pyrrole compounds; pyrazole compounds; polyarylene compounds; condensed aromatic compounds such as naphthalene derivatives, anthracene derivatives, phenanthrene derivatives, tetracene derivatives, pyrene derivatives, perylene derivatives, and fluoranthene derivatives; and metal complexes containing a nitrogen-containing heterocyclic compound as a ligand. The donor organic semiconductor used is not limited to these compounds and may be an organic compound with an ionization potential lower than that of an organic compound used as an acceptor organic semiconductor as described above.

The organic n-type semiconductor is an acceptor organic semiconductor, is mainly typified by an electron-transporting organic compound, and refers to an organic compound having the property of accepting an electron. In particular, the organic n-type semiconductor refers to one of two organic compounds that has higher electron affinity in a case where the two organic compounds are used in contact with each other. Thus, the acceptor organic compound used may be any organic compound having an electron-accepting property. For example, the following compounds are cited: fullerenes; fullerene derivatives; condensed aromatic compounds such as naphthalene derivatives, anthracene derivatives, phenanthrene derivatives, tetracene derivatives, pyrene derivatives, perylene derivatives, and fluoranthene derivatives; nitrogen-, oxygen-, and/or sulfur-containing five- to seven-membered heterocyclic compounds such as pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrrolidine, pyrrolopyridine, thiadiazolopyridine, dibenzazepine, and tribenzazepine; polyarylene compounds; fluorenone compounds; cyclopentadiene compounds; silyl compounds; and metal complexes containing a nitrogen-containing heterocyclic compound as a ligand. The acceptor organic semiconductor used is not limited to these compounds and may be an organic compound with an electron affinity higher than that of an organic compound used as a donor organic semiconductor as described above.

The electron-blocking layer 5 is placed to reduce the dark current due to the injection of electrons from the lower electrode 2 and suppresses the injection of electrons into the photoelectric conversion layer 3A from the lower electrode 2. The electron-blocking layer 5 may contain the above-mentioned p-type semiconductor, the above-mentioned hole-transporting organic compound, or an inorganic substance such as a metal oxide. As shown in FIG. 3, the electron-blocking layer 5 has a HOMO energy level lower than that of the p-type semiconductor layer 7 of the photoelectric conversion layer 3A and a LUMO energy level higher than that of the p-type semiconductor layer 7 of the photoelectric conversion layer 3A. In other words, the photoelectric conversion layer 3A has a HOMO energy level higher than that of the electron-blocking layer 5 and a LUMO energy level lower than that of the electron-blocking layer 5 in the vicinity of the interface between the photoelectric conversion layer 3A and the electron-blocking layer 5.

The hole-blocking layer 6 is placed to reduce the dark current due to the injection of holes from the upper electrode 4 and suppresses the injection of holes into the photoelectric conversion layer 3A from the upper electrode 4. A material for the hole-blocking layer 6 may be, for example, an organic substance such as copper phthalocyanine, 3,4,9,10-perylenetetracarboxylic dianhydride (PTCDA), an acetylacetonate complex, bathocuproine (BCP), or tris(8-quinolinolato) aluminum (Alq); an organic-metal compound; or an inorganic substance such as MgAg or MgO. The hole-blocking layer 6 may have high transmittance for near-infrared light, may contain a material having no absorption in the visible region, or may have a small thickness so as not to prevent the light absorption of the photoelectric conversion film 3. The thickness of the hole-blocking layer 6 depends on the configuration of the photoelectric conversion layer 3A, the thickness of the upper electrode 4, or the like and may be, for example, 2 nm to 50 nm. The hole-blocking layer 6 may contain the above-mentioned n-type semiconductor or electron-transporting organic compound.

In the case of using the electron-blocking layer 5, the material for the lower electrode 2 is selected from the above-mentioned materials in consideration of adhesion to the electron-blocking layer 5, electron affinity, ionization potential, stability, and the like. This applies to the upper electrode 4.

As shown in FIG. 3, when the work function of the upper electrode 4 is relatively large (for example, 4.8 eV), a barrier to the movement of holes to the photoelectric conversion film 3 during the application of a bias voltage is low. Therefore, the holes are likely to be injected into the photoelectric conversion layer 3A from the upper electrode 4 and, as a result, it is conceivable that the dark current is large.

Imaging Device

Figure 4:
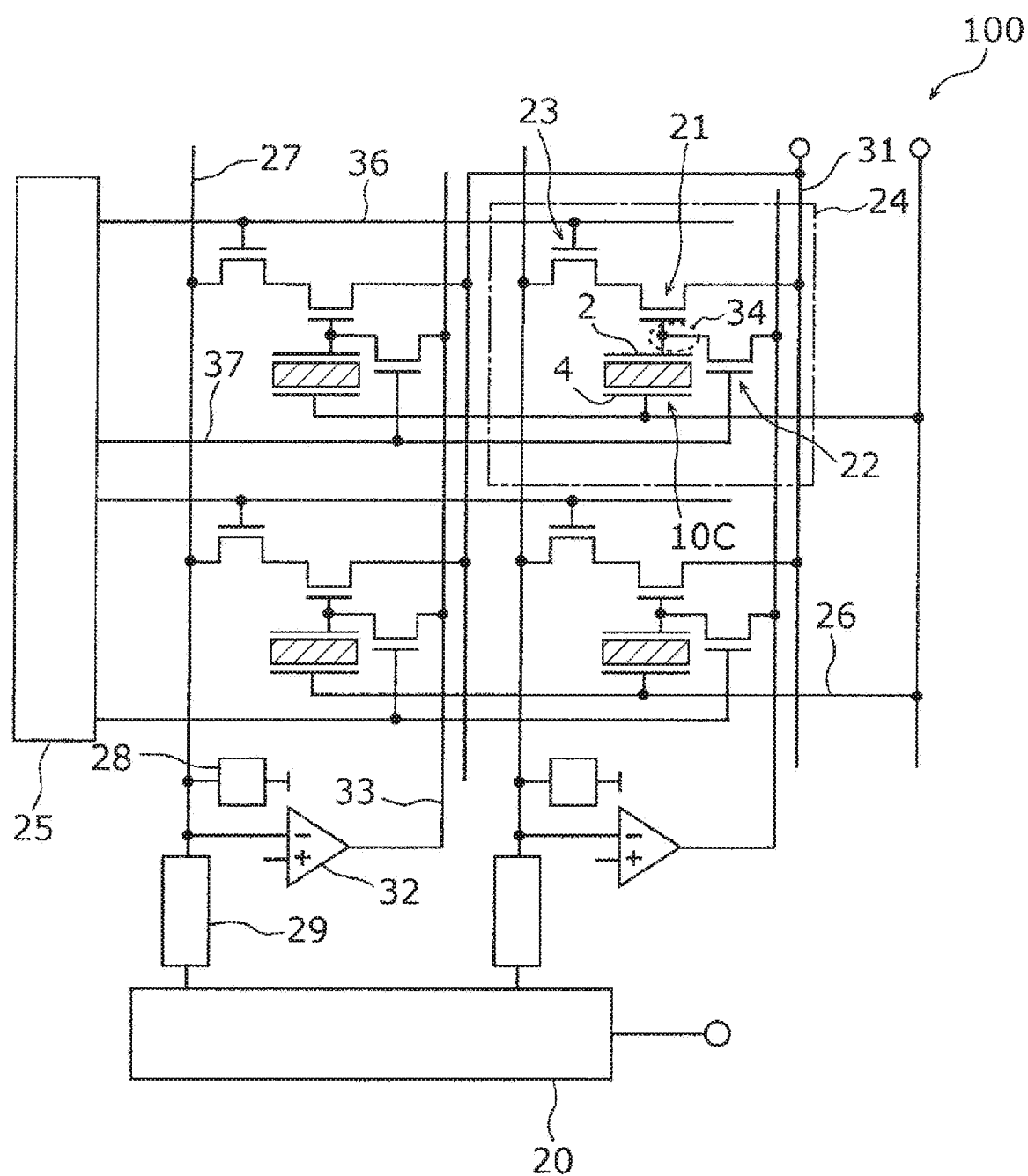
FIG. 4 is a diagram showing an example of the circuit configuration of an imaging device according to an embodiment of the present disclosure.
Figure 5:
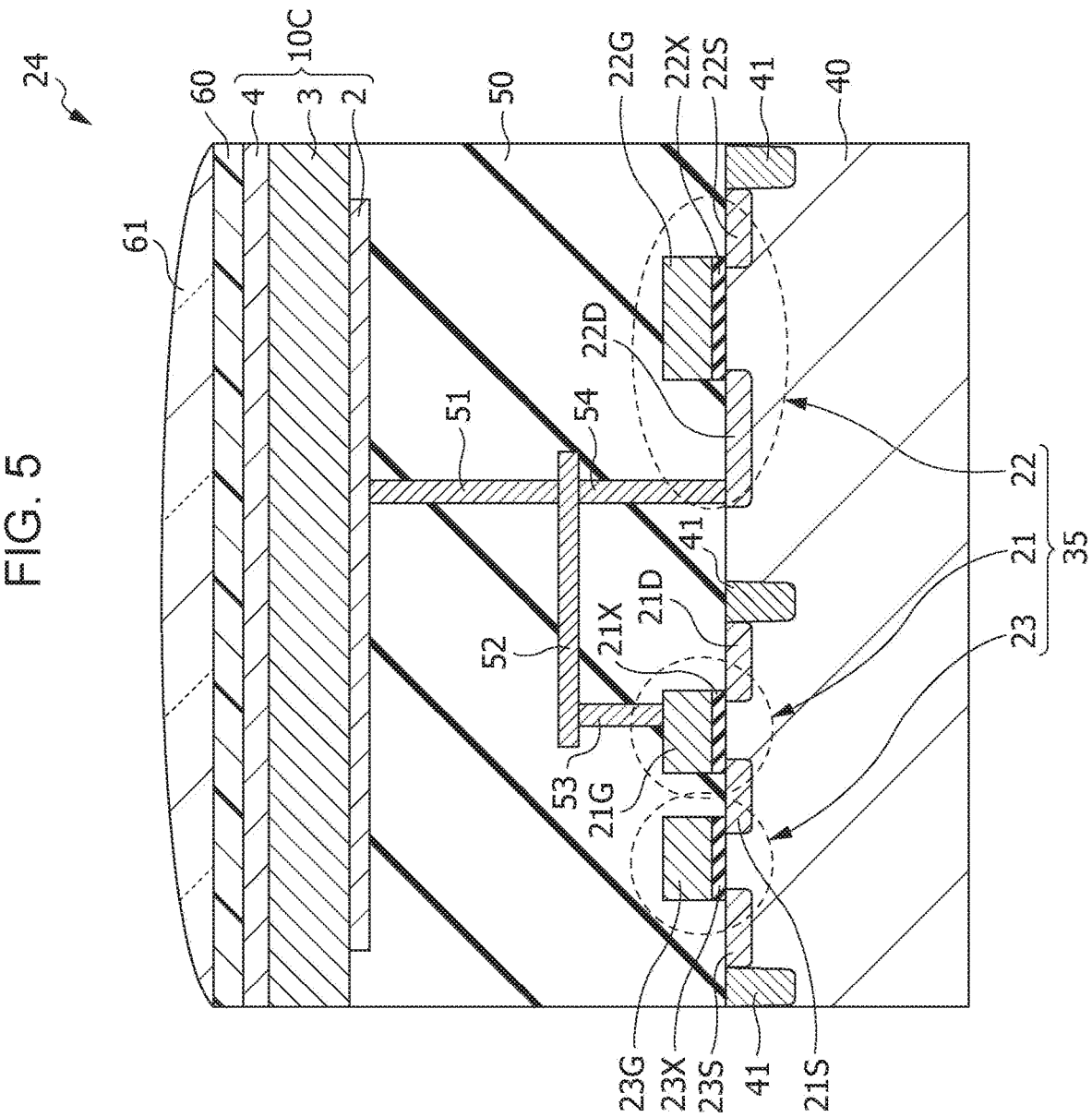
FIG. 5 is a schematic sectional view of an example of the device structure of pixels in the imaging device.

An imaging device 100 according to an embodiment of the present disclosure is described below with reference to FIGS. 4 and 5. FIG. 4 is a diagram showing an example of the circuit configuration of the imaging device 100. FIG. 5 is a schematic sectional view of an example of the device structure of pixels 24 in the imaging device 100.

As shown in FIGS. 4 and 5, the imaging device 100 includes a semiconductor substrate 40 which is a substrate and the pixels 24. Each of the pixels 24 includes a charge detection circuit 35 placed at a surface of the semiconductor substrate 40, a photoelectric converter 10C placed above the semiconductor substrate 40, and a charge storage node 34 electrically connected to the charge detection circuit 35 and the photoelectric converter 10C. The photoelectric converter 10C of each pixel 24 includes the above-mentioned photoelectric conversion element 10A or 10B.

As shown in FIG. 4, the imaging device 100 includes the pixels 24 and peripheral circuits such as a vertical scanning circuit 25 and a horizontal signal read-out circuit 20. The imaging device 100 is an organic image sensor implemented in the form of a one-chip integrated circuit and includes a pixel array including the two-dimensionally arranged pixels 24.

The pixels 24 are arranged two-dimensionally, that is, in row and column directions, on the semiconductor substrate 40 to form a photosensitive region (a so-called pixel region). FIG. 4 shows an example in which the pixels 24 are arranged in a matrix with two rows and two columns. In FIG. 4, a circuit (for example, a pixel electrode control circuit) for individually setting the sensitivity of the pixels 24 is not shown for convenience of illustration. The imaging device 100 may be a line sensor. In this case, the pixels 24 may be one-dimensionally arranged. The terms "row direction" and "column direction" as used herein refer to the direction in which a row extends and the direction in which a column extends, respectively. That is, in the plane of FIG. 4, a vertical direction is a column direction and a horizontal direction is a row direction.

As shown in FIG. 4, each pixel 24 includes the photoelectric converter 10C and the charge storage node 34, which is electrically connected to the charge detection circuit 35. The charge detection circuit 35 (see FIG. 5) includes an amplification transistor 21, a reset transistor 22, and an address transistor 23.

The photoelectric converter 10C includes a lower electrode 2 placed as a pixel electrode and an upper electrode 4 placed as a counter electrode. The above-mentioned photoelectric conversion element 10A or 10B (see FIG. 1 or 2, respectively) may be used in the photoelectric converter 10C. A predetermined bias voltage is applied to the upper electrode 4 through a counter electrode signal line 26.

The lower electrode 2 is connected to a gate electrode of the amplification transistor 21. Signal charges collected by the lower electrode 2 are stored in the charge storage node 34. The charge storage node 34 is located between the lower electrode 2 and the gate electrode of the amplification transistor 21. In this embodiment, signal charges are holes. Signal charges may be electrons.

The signal charges stored in the charge storage node 34 are applied to the gate electrode of the amplification transistor 21 in the form of a voltage corresponding to the amount of the signal charges. The amplification transistor 21 amplifies this voltage, which is selectively read out as a signal voltage by the address transistor 23. The reset transistor 22 includes source/drain electrodes connected to the lower electrode 2 and resets the signal charges stored in the charge storage node 34. In other words, the reset transistor 22 resets the potential of the gate electrode of the amplification transistor 21 and the potential of the lower electrode 2.

In order to selectively perform the above-mentioned operations in the pixels 24, the imaging device 100 includes power supply lines 31, vertical signal lines 27, address signal lines 36, and reset signal lines 37 and these lines are connected to the pixels 24. In particular, the power supply lines 31 are connected to source/drain electrodes of the amplification transistor 21 and the vertical signal lines 27 are connected to source/drain electrodes of the address transistor 23. Each address signal line 36 is connected to a gate electrode of the address transistor 23. Each reset signal line 37 is connected to a gate electrode of the reset transistor 22.

The peripheral circuits include the vertical scanning circuit 25, the horizontal signal read-out circuit 20, a plurality of column signal-processing circuits 29, a plurality of load circuits 28, and a plurality of differential amplifiers 32. The vertical scanning circuit 25 is also referred to as a row scanning circuit. The horizontal signal read-out circuit 20 is also referred to as a column scanning circuit. The column signal-processing circuits 29 are also referred to as row signal storage circuits. The differential amplifiers 32 are also referred to as feed-back amplifiers.

The vertical scanning circuit 25 is connected to the address signal lines 36 and the reset signal lines 37, selects the pixels 24 placed in each row on a row basis, reads out the signal voltage, and resets the potential of the lower electrode 2. The power supply lines 31 supply a predetermined power supply voltage to each pixel 24. The horizontal signal read-out circuit 20 is electrically connected to the column signal-processing circuits 29. The column signal-processing circuits 29 are electrically connected to the pixels 24 placed in each column through the vertical signal lines 27 corresponding to the column. Each of the load circuits 28 is electrically connected to a corresponding one of the vertical signal lines 27. The load circuits 28 and the amplification transistors 21 form source follower circuits.

The differential amplifiers 32 are placed so as to correspond to each column. A negative-side input terminal of each of the differential amplifiers 32 is connected to a corresponding one of the vertical signal lines 27. Output terminals of the differential amplifiers 32 are connected to the pixels 24 through feed-back lines 33 corresponding to the column.

The vertical scanning circuit 25 applies row selection signals controlling the turning on and off of the address transistors 23 to the gate electrodes of the address transistors 23 through the address signal lines 36. This allows a row that is intended to be read out to be scanned and selected. Signal voltages are read out from the pixels 24 in the selected row to the vertical signal lines 27. Furthermore, the vertical scanning circuit 25 applies reset signals controlling the turning on and off of the reset transistors 22 to the gate electrodes of the reset transistors 22 through the reset signal lines 37. This allows a row of the pixels 24 that are intended to be reset to be selected. The vertical signal lines 27 transmit the signal voltages read out from the pixels 24 selected by the vertical scanning circuit 25 to the column signal-processing circuits 29.

The column signal-processing circuits 29 perform noise reduction signal processing typified by correlated double sampling, analog-digital conversion, and the like.

The horizontal signal read-out circuit 20 sequentially reads out signals from the column signal-processing circuits 29 to a horizontal common signal line (not shown).

The differential amplifiers 32 are connected to the drain electrodes of the reset transistors 22 through the feed-back lines 33. Thus, when the address transistors 23 and the reset transistors 22 are in the conduction state, negative terminals of the differential amplifiers 32 receive outputs from the address transistors 23. The differential amplifiers 32 perform a feed-back operation such that the gate potential of each amplification transistor 21 is equal to a predetermined feed-back voltage. In this operation, the output voltage of each differential amplifier 32 is equal to 0 V or a positive voltage close to 0 V. The term "feed-back voltage" refers to the output voltage of the differential amplifier 32.

FIG. 5 is a schematic sectional view of an example of the device structure of pixels 24 in the imaging device 100.

As shown in FIG. 5, each pixel 24 includes the semiconductor substrate 40, the charge detection circuit 35, the photoelectric converter 10C, and the charge storage node 34 (see FIG. 4).

The semiconductor substrate 40 may be an insulating substrate provided with a semiconductor layer placed on a surface on the side where a photosensitive region (a so-called pixel region) is formed and is, for example, a p-type silicon substrate. The semiconductor substrate 40 includes impurity regions (herein, n-type regions) 21D, 21S, 22D, 22S, and 23S and an isolation region 41 for electrically separating the pixels 24. The isolation region 41 is placed between the impurity region 21D and the impurity region 22D. This suppresses the leakage of the signal charges stored in the charge storage node 34. The isolation region 41 is formed by, for example, the implantation of acceptor ions under predetermined conditions.

The impurity regions 21D, 21S, 22D, 22S, and 23S are typically diffusion layers formed in the semiconductor substrate 40. As shown in FIG. 5, the amplification transistor 21 includes the impurity regions 21S and 21D and a gate electrode 21G. The impurity region 21S and the impurity region 21D function as, for example, a source region and drain region, respectively, of the amplification transistor 21. A channel region of the amplification transistor 21 is formed between the impurity regions 21S and 21D.

Likewise, the address transistor 23 includes the impurity regions 23S and 21S and a gate electrode 23G connected to one of the address signal lines 36. In this example, the amplification transistor 21 and the address transistor 23 share the impurity region 21S and therefore are electrically connected to each other. The impurity region 23S functions as, for example, a source region of the address transistor 23. The impurity region 23S has a connection to one of the vertical signal lines 27 as shown in FIG. 4.

The reset transistor 22 includes the impurity regions 22D and 22S and a gate electrode 22G connected to one of the reset signal lines 37. The impurity region 22S functions as, for example, a source region of the reset transistor 22. The impurity region 22S has a connection to one of the reset signal lines 37 as shown in FIG. 4.

An interlayer insulating layer 50 is placed on the semiconductor substrate 40 so as to cover the amplification transistor 21, the address transistor 23, and the reset transistor 22.

Wiring layers (not shown) may be placed in the interlayer insulating layer 50. The wiring layers are formed typically from a metal such as copper and may partly include, for example, wiring lines such as the above-mentioned vertical signal lines 27. The number of insulating layers in the interlayer insulating layer 50 and the number of the wiring layers placed in the interlayer insulating layer 50 can be arbitrarily set.

The following components are placed in the interlayer insulating layer 50: a contact plug 54 connected to the impurity region 22D of the reset transistor 22, a contact plug 53 connected to the gate electrode 21G of the amplification transistor 21, a contact plug 51 connected to the lower electrode 2, and a wiring line 52 connecting the contact plugs 51, 54, and 53 together. This electrically connects the impurity region 22D, which functions as a drain electrode of the reset transistor 22, to the gate electrode 21G of the amplification transistor 21.

The charge detection circuit 35 detects signal charges captured by the lower electrode 2 and outputs a signal voltage. The charge detection circuit 35 includes the amplification transistor 21, the reset transistor 22, and the address transistor 23 and is placed at a surface of the semiconductor substrate 40.

The amplification transistor 21 is placed in the semiconductor substrate 40 and includes the impurity region 21D, which functions as a drain electrode; the impurity region 21S, which functions as a source electrode; a gate insulating layer 21X placed on the semiconductor substrate 40; and the gate electrode 21G, which is placed on the gate insulating layer 21X.

The reset transistor 22 is placed in the semiconductor substrate 40 and includes the impurity region 22D, which functions as a drain electrode; the impurity region 22S, which functions as a source electrode; a gate insulating layer 22X placed on the semiconductor substrate 40; and the gate electrode 22G, which is placed on the gate insulating layer 22X.

The address transistor 23 is placed in the semiconductor substrate 40 and includes the impurity region 21S, which functions as a drain electrode; the impurity region 23S, which functions as a source electrode; a gate insulating layer 23X placed on the semiconductor substrate 40; and the gate electrode 23G, which is placed on the gate insulating layer 23X. The impurity region 21S is shared by the amplification transistor 21 and the address transistor 23, whereby the amplification transistor 21 and the address transistor 23 are connected in series.

The above-mentioned photoelectric converter 10C is placed on the interlayer insulating layer 50. In other words, in this embodiment, the pixels 24, which form the pixel array, are placed on the semiconductor substrate 40. The pixels 24 are two-dimensionally arranged on the semiconductor substrate 40 to form the photosensitive region. The pixel pitch that is the distance between the two neighboring pixels 24 may be, for example, about 2 μm.

The photoelectric converter 10C includes the above-mentioned photoelectric conversion element 10A or 10B.

The photoelectric converter 10C is overlaid with a color filter 60. The color filter 60 is overlaid with a micro-lens 61. The color filter 60 is, for example, an on-chip color filter formed by patterning and is made of a photosensitive resin containing a dye or pigment dispersed therein or a similar resin. The micro-lens 61 is placed in the form of, for example, an on-chip micro-lens and is made of an ultraviolet photosensitive material or the like.

The imaging device 100 can be manufactured by a general semiconductor manufacturing process. In particular, when the semiconductor substrate 40 used is a silicon substrate, various silicon semiconductor processes can be used to manufacture the imaging device 100.

In light of the above, according to the present disclosure, the following element and device can be achieved using a composition which has high light absorption characteristics in a longer-wavelength near-infrared region and which can reduce the dark current: a photoelectric conversion element and imaging device having high light absorption characteristics over a wide range of the near-infrared region.

EXAMPLES

The present disclosure is further described below in detail with reference to examples. The present disclosure is not in any way limited to the examples.

A composition containing a compound obtained in Example 1, Example 2, Example 3, Example 4, Example 5, Example 6, Example 7, Example 8, or Example 9 was used to form a near-infrared photoelectric conversion film in Example 10, Example 11, Example 12, Example 13, Example 14, Example 15, Example 16, Example 17, or Example 18, respectively. The near-infrared photoelectric conversion film obtained in Example 10, Example 11, Example 12, Example 13, Example 14, Example 15, Example 16, Example 17, or Example 18 was used to prepare a near-infrared photoelectric conversion element in Example 19, Example 20, Example 21, Example 22, Example 23, Example 24, Example 25, Example 26, or Example 27, respectively.

Hereinafter, $C_2H_5$ is represented by Et, iso-$C_3H_7$ is represented by iPr, $C_4H_9$ is represented by Bu, $C_5H_{11}$ is represented by Pent, $C_6H_{13}$ is represented by Hex, and $C_{32}H_{18}N_8$ is represented by Pc in some cases.

Phthalocyanine Derivative

A phthalocyanine derivative contained in a composition according to the present disclosure is further described below in detail with reference to Examples 1 to 9.

Example 1

Synthesis of (S-Pent)$_8$PcSi(OSiBu$_3$)$_2$

A compound, (S-Pent)$_8$PcSi(OSiBu$_3$)$_2$, represented by the following formula was synthesized in accordance with Steps (1) to (3) below:

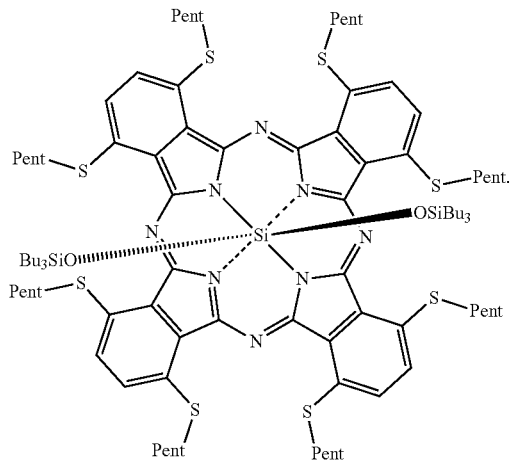

(1) Synthesis of Compound (A-2)

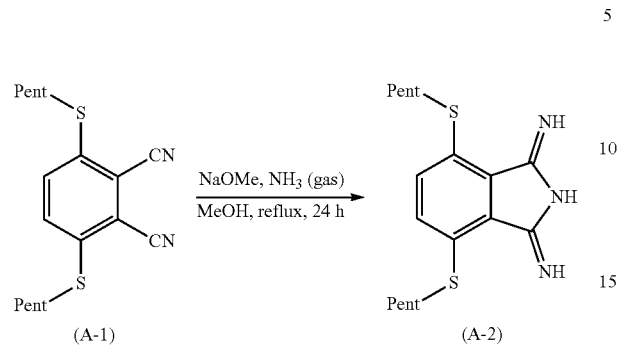

A raw material, that is 3,6-dipentathio-4,5-dicyanobenzene (Compound (A-1)) was synthesized with reference to a synthesis method described in Gcineka Mbambisa et al., "Synthesis and electrochemical properties of purple manganese(III) and red titanium(IV) phthalocyanine complexes octa-substituted at non-peripheral positions with pentylthio groups", Polyhedron, 2007, vol. 26, Issue 18, pp. 5355-5364 (Non-Patent Document 5).

To a 1,000 mL reaction vessel, 7.2 g of 3,6-dipentathio-4,5-dicyanobenzene (Compound (A-1)), 450 mL of dehydrated methanol, and 1.5 g of a 38% solution of sodium methoxide in methanol (MeONa/MeOH) were added, followed by stirring for 24 hours under heating and reflux with an ammonia ($NH_3$) gas being injected into the reaction vessel. After the progress of reaction was confirmed by thin layer chromatography (TLC), the reaction vessel was cooled to room temperature. Subsequently, city water was added to the reaction vessel, followed by separatory washing. Thereafter, crystals were precipitated by cooling a solvent and were filtered out. Subsequently, the filtered-out crystals were washed with methanol (MeOH), whereby a solid was obtained. The obtained solid was dried by heating at 60° C. for two days under reduced pressure, whereby a solid target compound, that is, Compound (A-2) was obtained. The amount of the obtained target compound was 2.4 g and the yield thereof was 32%.

(2) Synthesis of Compound (A-3)

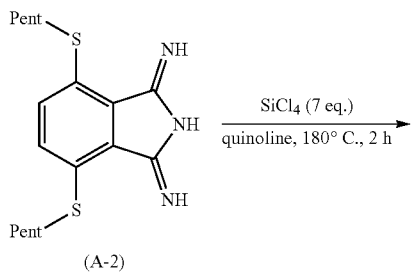

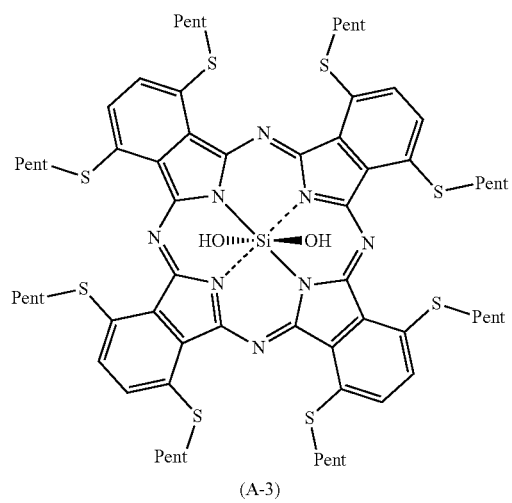

In an argon atmosphere, 1.05 g (3 mmol) of an S-Pent isoindoline derivative (Compound (A-2)) was dissolved in 6 mL of quinoline, followed by adding 2.4 mL (21 mmol) of silicon tetrachloride to the solution at room temperature. A reaction system was heated to 180° C., followed by stirring for two hours. The ultraviolet-visible absorption spectrum (UV-vis spectrum) of a reaction solution was measured after two hours of reaction, whereby the concentration of products was confirmed. Subsequently, the reaction solution was cooled to room temperature and a small amount of water was added to the reaction solution, whereby reaction was stopped. Subsequently, a small amount of methanol and a large amount (up to 50 mL) of chloroform were added to the reaction solution, followed by stirring at room temperature for one hour. Subsequently, a produced insoluble mixture was removed by Celite filtration and was washed with chloroform until filtrate became transparent. An organic layer was collected from the obtained filtrate by extraction and was washed with water. Subsequently, the organic layer was dried with magnesium sulfate. After magnesium sulfate was removed from the organic layer by cotton-plug filtration, the organic layer was concentrated. After methanol (up to 30 mL) was added to an obtained concentrate and the resulting concentrate was left for half a day, a precipitate was filtered out. The precipitate was washed well with methanol and was then dried, whereby a purple powdery target compound, that is, Compound (A-3) was obtained. The amount of the obtained target compound was 420 mg and the yield thereof was 40%.

(3) Synthesis of (S-Pent)$_8$PcSi(OSiBu$_3$)$_2$ (Compound (A-4))

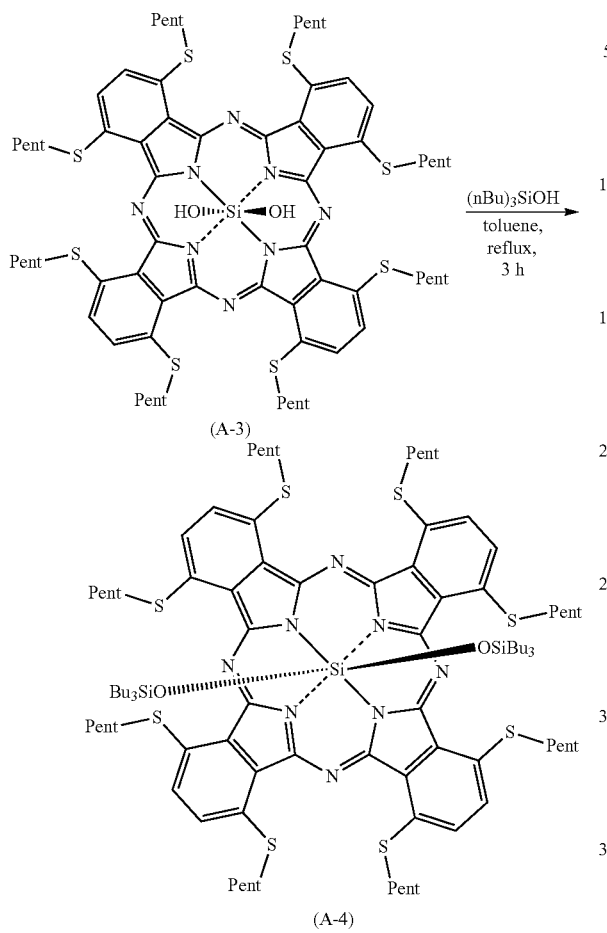

(A-3)

(A-4)

In an argon atmosphere, 70 mg (50.0 μmop of a Pc-silicon complex ((S-Pent)$_8$PcSi(OH)$_2$) (Compound (A-3)) was dissolved in 1.7 mL of dehydrated toluene and 320 mg (1.5 mmol) of (nBu)$_3$SiOH was added to the solution, followed by heating for three hours under reflux. After the termination of reaction was confirmed by TLC, a reaction solution was concentrated in an evaporator, whereby a crude product was obtained. The obtained crude product was purified by alumina column chromatography (a developing solvent: hexane/chloroform=2/1 (v/v)) twice, whereby a dark purple powdery target compound, that is, Compound (A-4) was obtained. The amount of the obtained target compound was 48.7 mg and the yield thereof was 55%.

The obtained compound was identified by proton nuclear magnetic resonance spectroscopy ($^1$HNMR) and matrix-assisted laser desorption/ionization time-of-flight mass spectrometry (MALDI-TOF MS). Results were as shown below.

$^1$HNMR (400 MHz, CDCl$_3$): δ (ppm)=7.85 (s, 8H), 3.34 (t, 16H, J=7.6 Hz), 2.02-1.96 (m, 16H), 1.65-1.59 (m, 16H), 1.48-1.41 (m, 16H), 0.95 (t, 24H, J=7.6 Hz), 0.20-0.16 (m, 12H), 0.13-0.09 (m, 18H), −1.03-−1.05 (m, 12H), −2.22-−2.26 (m, 12H)

MALDI-TOF-MS measured value: m/z=1,787.18 (M$^-$)

The chemical formula for the target compound is C$_{96}$H$_{150}$N$_8$O$_2$S$_8$Si$_3$ and the exact mass thereof is 1,786.90.

From the above results, it could be confirmed that the target compound was obtained by the above synthesis procedure.

Figure 6A:
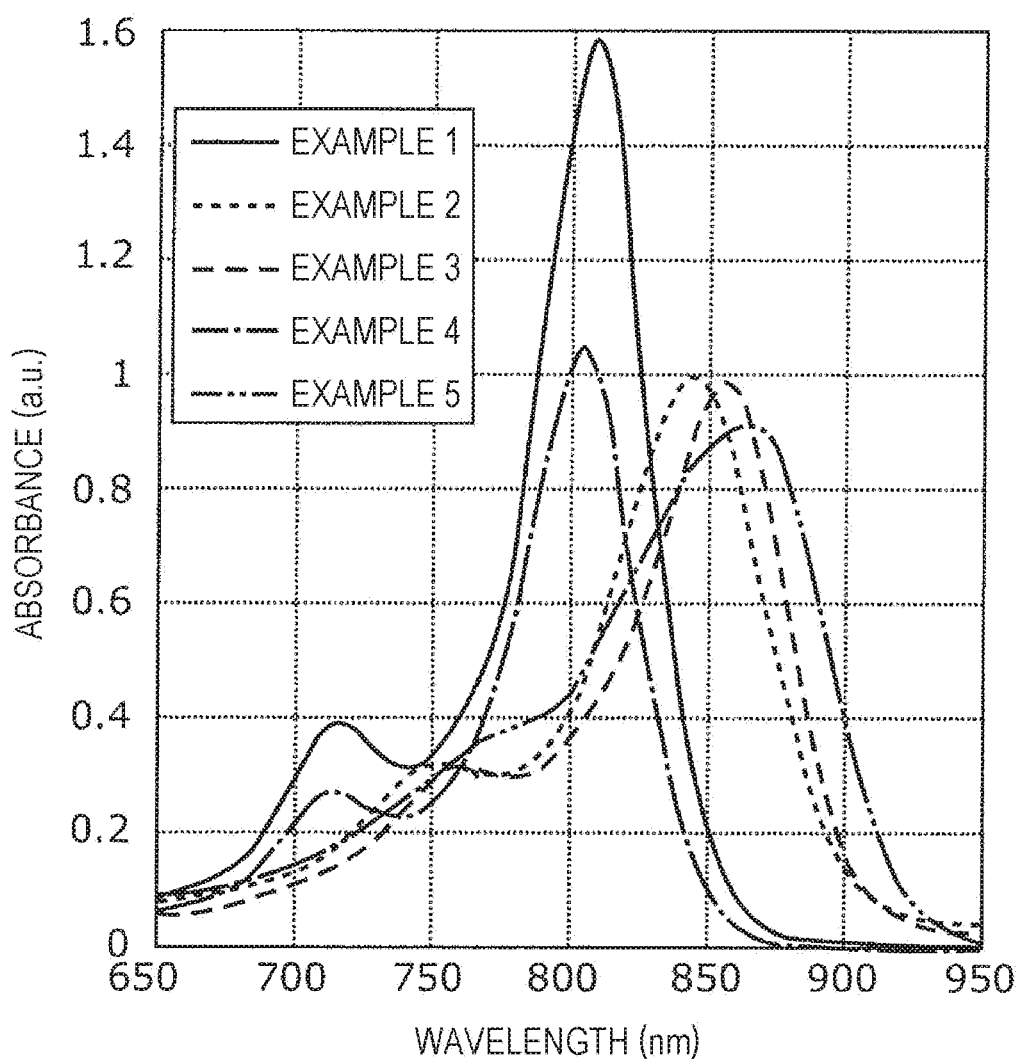
FIG. 6A is a graph showing the absorption spectrum of a phthalocyanine derivative obtained in each of Examples 1 to 5.

The obtained compound was dissolved in chloroform and was measured for absorption spectrum. Results were as shown in FIG. 6A. As shown in FIG. 6A, the wavelength of an absorption peak of the obtained compound in the near-infrared region was 806.5 nm. Thus, it was clear that the compound obtained in Example 1 was a material having an absorption maximum wavelength in the near-infrared region.

Example 2

Synthesis of (S-Pent)$_8$PcSi(OPOPh$_2$)$_2$

A compound, (S-Pent)$_8$PcSi(OPOPh$_2$)$_2$, represented by the following formula was synthesized in accordance with Steps (1), (2), and (4) below:

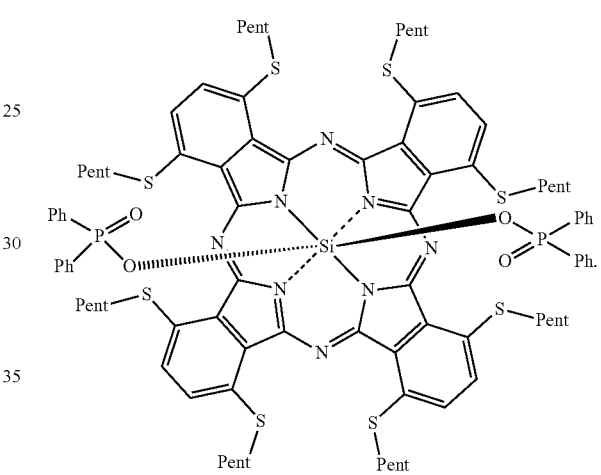

Steps (1) and (2) to synthesize (S-Pent)$_8$PcSi(OH)$_2$ (Compound (A-3)) were performed in the same manner as that used in Example 1.

(4) Synthesis of (S-Pent)$_8$PcSi(OPOPh$_2$)$_2$ (Compound (A-5))

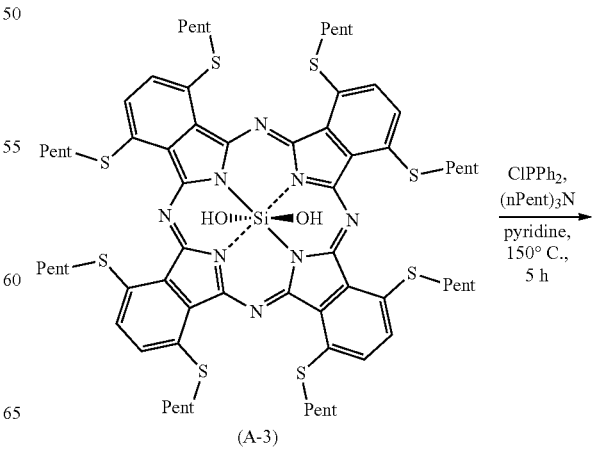

(A-3)

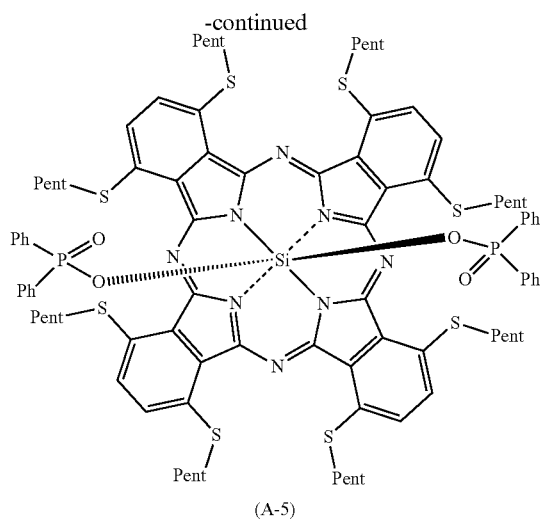

(A-5)

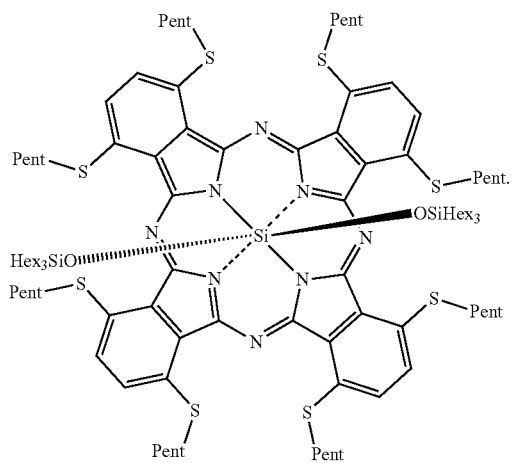

(5) Synthesis of Compound (A-6)

To a 200 mL reaction vessel filled with argon, 0.3 g of (S-Pent)$_8$PcSi(OH)$_2$ (Compound (A-3)) synthesized in Step (2) and 3.0 g of chlorodiphenylphosphine were added and were dissolved in 20 mL of dehydrated pyridine together with 3.0 g of tripentylamine, followed by stirring at 150° C. for five hours. After the progress of reaction was confirmed from a UV-vis spectrum, the reaction vessel was cooled to room temperature. Subsequently, the reaction mixture was extracted with dichloromethane, 100 mL of city water was added to the extract, and an organic layer was separated with a separatory funnel. A solvent was distilled off from the organic layer, whereby a solid was precipitated. The obtained solid was purified by silica gel column chromatography (a developing solvent: toluene/ethyl acetate=2/1 (v/v)), whereby a target compound, that is, Compound (A-5) was obtained. The amount of the obtained target compound was 80 mg and the yield thereof was 21%.

The obtained compound was identified by $^1$HNMR and MALDI-TOF MS. Results were as shown below.

$^1$HNMR (400 MHz, CD$_2$Cl$_2$): δ (ppm)=7.883 (8H), 6.63 (4H), 6.41 (8H), 5.15 (8H), 3.37 (16H), 2.03 (16H), 1.66 (16H), 1.50 (16H), 0.99 (24H)

MALDI-TOF-MS measured value: m/z=1,790.92 (M$^-$)

The chemical formula for the target compound is C$_{96}$H$_{116}$N$_8$O$_4$S$_8$P$_2$Si and the exact mass thereof is 1,790.61.

From the above results, it could be confirmed that the target compound was obtained by the above synthesis procedure.

The obtained compound was dissolved in tetrahydrofuran and was measured for absorption spectrum. Results are shown in FIG. 6A. As shown in FIG. 6A, the wavelength of an absorption peak of the obtained compound in the near-infrared region was 842 nm. Thus, it was clear that the compound obtained in Example 2 was a material having an absorption maximum wavelength in the near-infrared region.

Example 3

Synthesis of (S-Pent)$_8$PcSn(OSiHex$_3$)$_2$

A compound, (S-Pent)$_8$PcSn(OSiHex$_3$)$_2$, represented by the following formula was synthesized in accordance with Steps (5) to (7) below:

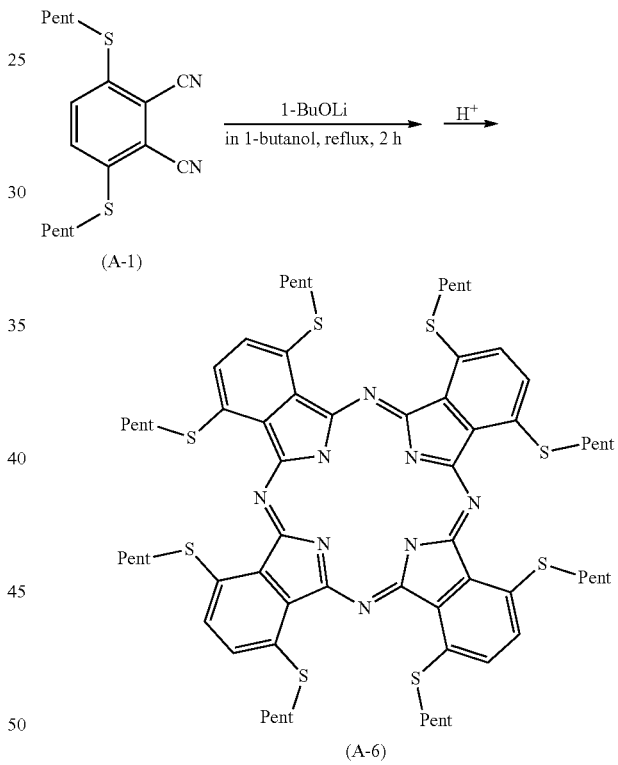

(A-6)

Into a 500 mL reaction vessel filled with argon, 50 mL of 1-butanol (dehydrated) was poured and 1.0 g of metallic lithium was charged, followed by stirring well. After reaction proceeded under ice cooling until a block of metallic lithium disappeared, a hot water bath was replaced with an oil bath and heating and reflux were continued for 30 minutes until all metallic lithium reacted and a solution became transparent and uniform.

Thereafter, the temperature of the oil bath was reduced to about 90° C. and 6.5 g of (S-Pent)$_2$CN$_2$Ph (Compound (A-1)) was added to the solution, followed by heating for two hours under reflux. Subsequently, after the solution was cooled to room temperature, a mixture of methanol, water, and concentrated sulfuric acid (150:5:0.5 (v/v)) was added to the solution such that Li* ions were replaced with H⁺ ions, whereby a precipitate containing a target compound was precipitated. The precipitate was filtered out and was then purified by silica gel column chromatography (a developing solvent: toluene), whereby the target compound, that is, Compound (A-6) was obtained. The amount of the obtained target compound was 3.8 g and the yield thereof was 62%.

(6) Synthesis of Compound (A-7)

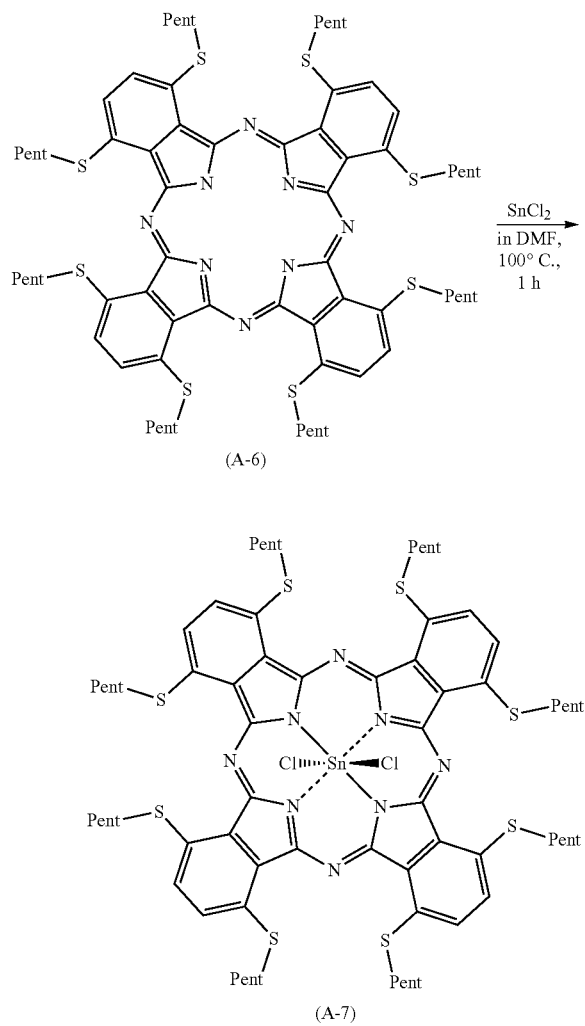

(7) Synthesis of (S-Pent)$_8$PcSn(OSiHex$_3$)$_2$ (Compound (A-8))

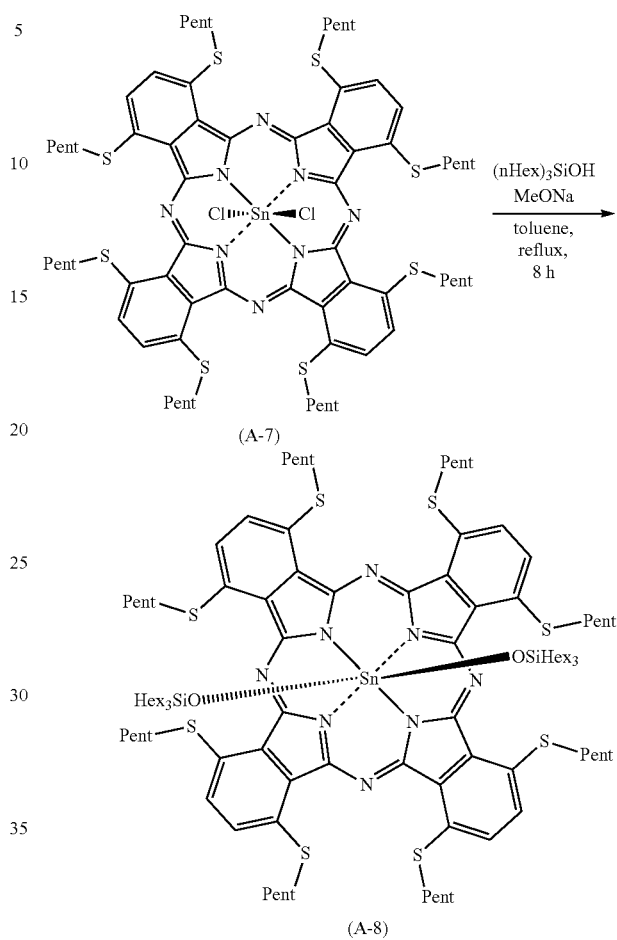

Into a 500 mL reaction vessel filled with argon, 150 mL of dehydrated N,N-dimethylformamide (DMF) was poured and 3.8 g of Compound (A-6) obtained in Step (5) was added, followed by stirring well. Into the reaction vessel, 8.0 g tin chloride (SnCl$_2$) anhydride was charged, followed by heating at 100° C. for one hour. After the reaction vessel was cooled to room temperature, methanol and water were poured into the reaction vessel, whereby a precipitate containing a target compound was precipitated. The precipitate was filtered out, was washed with 100 mL of methanol at 70° C. twice, and was washed with 50 mL of hexane at 60° C. once. The washed precipitate was dried by heating at 100° C. for two hours under reduced pressure, whereby a target compound, that is, Compound (A-7) was obtained. The amount of the obtained target compound was 1.5 g and the yield thereof was 82%.

Into a 500 mL reaction vessel filled with argon, 200 mL of dehydrated toluene was poured and 5.1 mL of trihexylsilanol and 510 mg of sodium methoxide were added. Subsequently, toluene reflux was carried out for one hour and the reaction vessel was cooled to room temperature. To the reaction vessel, 1.5 g of Compound (A-7) was added, followed by reflux for eight hours. After the reaction vessel was cooled to room temperature, 10 mL of water was added to the reaction vessel and an organic layer was separated by liquid separation. After the organic layer was distilled off wherever possible, methanol was added, whereby a solid was precipitated. The precipitated solid was washed with 100 mL of methanol at 60° C. and was dried by heating at 60° C. for three hours under reduced pressure, whereby a target compound, that is, Compound (A-8) was obtained. The amount of the obtained target compound was 1.6 g and the yield thereof was 78%.

The obtained compound was identified by $^1$HNMR and MALDI-TOF MS. Results were as shown below.

$^1$HNMR (400 MHz, CDCl$_3$): δ (ppm)=7.95 (8H), 3.41 (16H), 2.05 (16H), 1.68 (16H), 1.50 (16H), 1.00 (34H), 0.83 (12H), 0.67 (18H), 0.43 (12H), 0.17 (12H), −0.96 (12H), −2.08 (12H)

MALDI-TOF-MS measured value: m/z=2,047.17 (M⁻)

The chemical formula for the target compound is $C_{108}H_{174}N_8O_2S_8Si_2Sn$ and the exact mass thereof is 2,047.01.

From the above results, it could be confirmed that the target compound was obtained by the above synthesis procedure.

The obtained compound was dissolved in chloroform and was measured for absorption spectrum. Results are shown in FIG. 6A. As shown in FIG. 6A, the wavelength of an absorption peak of the obtained compound in the near-infrared region was 854 nm. Thus, it was clear that the compound obtained in Example 3 was a material having an absorption maximum wavelength in the near-infrared region.

Example 4

Synthesis of (S-Et)$_8$PcSi(OSiBu$_3$)$_2$

A compound, (S-Et)$_8$PcSi(OSiBu$_3$)$_2$, represented by the following formula was synthesized in accordance with Steps (8) to (11) below:

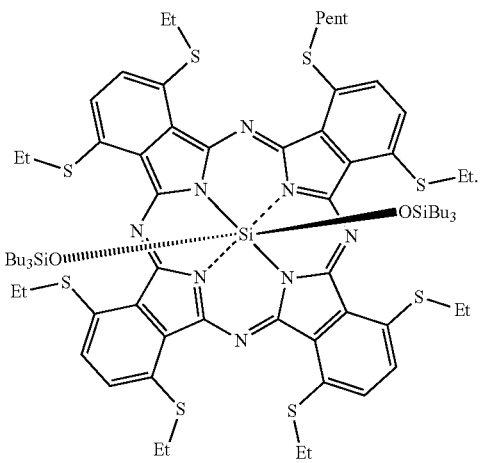

(8) Synthesis of Compound (A-10)

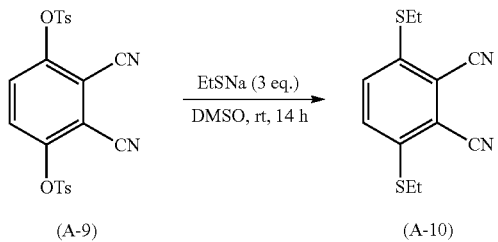

To 20 mL of a dimethyl sulfoxide (DMSO) solution containing 2.81 g (6 mmol) of 3,6-ditosyloxy-4,5-dicyanobenzene (Compound (A-9)), 1.51 g (18 mmol) of sodium ethanethiolate was gradually added at room temperature, followed by stirring for 14 hours. After a reaction solution was extracted with ethyl acetate, an organic layer was washed with water and a saturated saline solution, was dried with sodium sulfate, and was then concentrated under reduced pressure. A crude product was recrystallized in methanol, whereby an acicular crystalline target compound, that is, Compound (A-10) was obtained. The amount of the obtained target compound was 371 mg and the yield thereof was 25%.

$^1$HNMR (400 MHz, CDCl$_3$): δ (ppm)=7.49 (s, 2H), 3.04 (q, 4H, J=7.3 Hz), 1.35 (t, 6H, J=7.3 Hz)

(9) Synthesis of Compound (A-11)

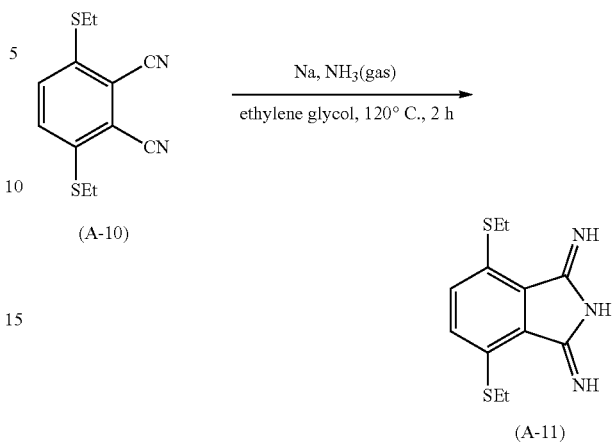

To ethylene glycol (10 mL) in which sodium (three pieces) was dissolved, 347 mg (1.4 mmol) of Compound (A-10) was added. A reaction solution was heated to 120° C. and was stirred for two hours with an ammonia gas being fed through the reaction solution. After the reaction solution was cooled to room temperature, the reaction solution was poured into 100 mL of ice water and a precipitate was collected by filtration, was washed well with water, and was then dried, whereby a yellow powdery target compound, that is, Compound (A-11) was obtained. The amount of the obtained target compound was 345 mg and the yield thereof was 93%. Although the target compound probably contained impurities, the target compound was used in the next reaction without being further purified.

(10) Synthesis of Compound (A-12)

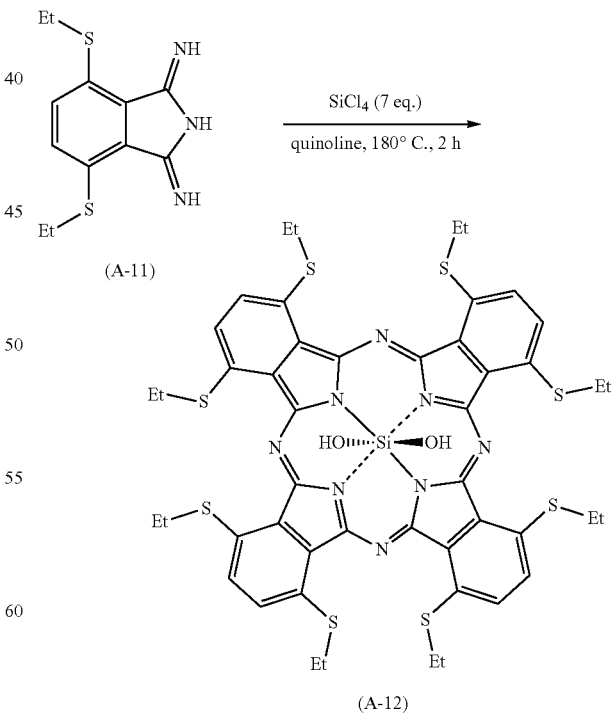

In an argon atmosphere, 0.45 mL (4.0 mmol) of silicon tetrachloride was gradually added to 1 mL of a quinoline solution containing 135 mg (0.50 mmol) of Compound (A-11) at room temperature. A reaction solution was heated to 180° C. and was stirred for two hours. After the reaction solution was cooled to room temperature, 1 mL of water and 1 mL of methanol were added to the reaction solution in that order such that reaction was stopped. Thereafter, chloroform (up to 30 mL) was added to the reaction solution, followed by stirring at room temperature for one hour. After insoluble matter was removed by Celite filtration, a filtrate was extracted with chloroform. An organic layer was washed with water and a saturated saline solution, was dried with magnesium sulfate, and was then concentrated under reduced pressure, whereby a crude product was obtained. Methanol (up to 10 mL) was added to the obtained crude product and the resulting crude product was left at room temperature for one day. A formed precipitate was filtered out, was washed with methanol, and was then dried under reduced pressure, whereby a dark purple powdery target compound, that is, Compound (A-12) was obtained. The amount of the obtained target compound was 54 mg and the yield thereof was 36%.

UV-vis (CHCl$_3$): λmax (nm)=297, 359, 539, 718, 807

(11) Synthesis of (S-Et)$_8$PcSi(OSiBu$_3$)$_2$ (Compound (A-13)

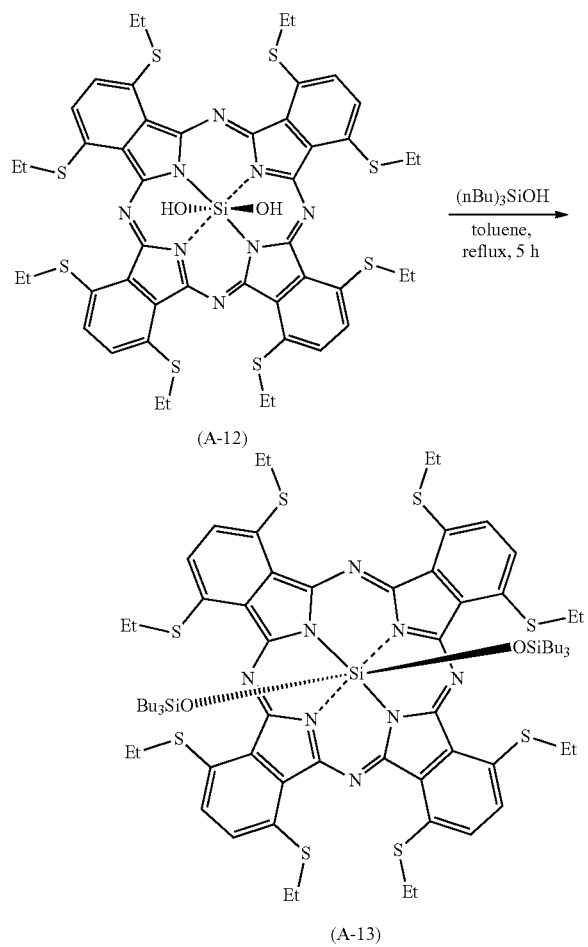

In an argon atmosphere, 50 mg (47 μmol) of Compound (A-12) was dissolved in 1.5 mL of dehydrated toluene and 307 mg (1.4 mmol) of tri butyl silanol (nBu$_3$SiOH) was added to the solution, followed by heating for five hours under reflux. After the termination of reaction was confirmed by TLC, a reaction solution was concentrated in an evaporator, whereby a crude product was obtained. Methanol (up to 5 mL) was added to the obtained crude product and the resulting crude product was left statically at room temperature for one day. A formed precipitate was filtered out, was washed with methanol, and was then dried under reduced pressure, whereby a dark purple powdery target compound, that is, Compound(A-13) was obtained. The amount of the obtained target compound was 57.3 mg and the yield thereof was 84%.

$^1$HNMR (400 MHz, CDCl$_3$): δ (ppm)=7.87 (s, 8H), 3.41 (q, 16H, J=7.3 Hz), 1.62 (t, 24H, J=7.3 Hz), 0.20-0.16 (n, 12H), 0.11 (t, 18H, J=6.4 Hz), −1.03-−1.07 (m, 12H), −2.22-−2.27 (m, 12H)

UV-vis (CHCl$_3$): λmax (nm)=296, 357, 532, 715, 803

From the above results, it could be confirmed that the target compound was obtained by the above synthesis procedure.

The obtained compound was dissolved in chloroform and was measured for absorption spectrum. Results are shown in FIG. 6A. As shown in FIG. 6A, the wavelength of an absorption peak of the obtained compound in the near-infrared region was 802.5 nm. Thus, it was clear that the compound obtained in Example 4 was a material having an absorption maximum wavelength in the near-infrared region.

Example 5

Synthesis of (S-iPr)$_8$PcSn(OSiHex$_3$)$_2$

A compound, (S-iPr)$_8$PcSn(OSiHex$_3$)$_2$, represented by the following formula was synthesized in accordance with Steps (12) to (16) below:

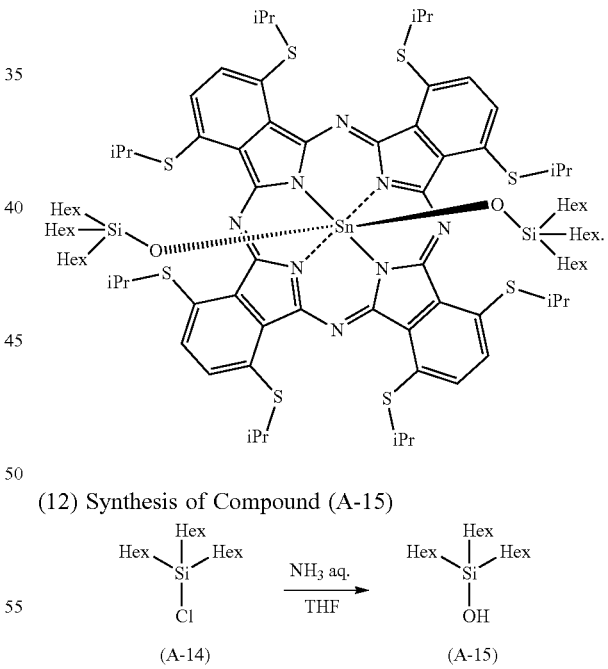

(12) Synthesis of Compound (A-15)

Hex-Si(Hex)(Hex)-Cl (A-14) → [NH$_3$ aq. / THF] → Hex-Si(Hex)(Hex)-OH (A-15)

Into a three-necked flask, 15 g of SiCl(C$_6$H$_{13}$)$_3$ (Compound (A-14)) and 75 mL of tetrahydrofuran (THF) were put. The three-necked flask was put into a cooling bath filled with water and ice and was cooled to 10° C. or lower. Into a dropping funnel, 75 mL of ammonia water was poured. All the ammonia water was added dropwise to the three-necked flask over ten minutes, followed by stirring at room temperature for two hours. Subsequently, 150 mL of ethyl acetate and 150 mL of city water were added to the three-necked flask, followed by stirring for ten minutes and then liquid separation using a separatory funnel, whereby an organic layer was separated. To a separated aqueous layer, 150 mL of ethyl acetate was added, followed by extracting reaction products in the aqueous layer with ethyl acetate. The extraction with ethyl acetate was carried out twice. To the organic layer obtained by separation and extraction, 150 mL of a saturated aqueous solution of ammonium chloride was added, followed by separatory washing three times. To the organic layer, 150 mL of city water was added, followed by separatory washing once. Subsequently, 150 mL of a saturated saline solution was added to the organic layer, followed by separatory washing. After the organic layer obtained by washing was dried with magnesium sulfate, the magnesium sulfate was filtered off. An obtained filtrate was concentrated under reduced pressure and obtained residue was dried at 60° C. under reduced pressure, whereby a target compound, that is, $(C_6H_{13})_3SiOH$ (Compound (A-15)) was obtained. The amount of the obtained target compound was 13.8 g and the yield thereof was 97%.

(13) Synthesis of Compound (A-16)

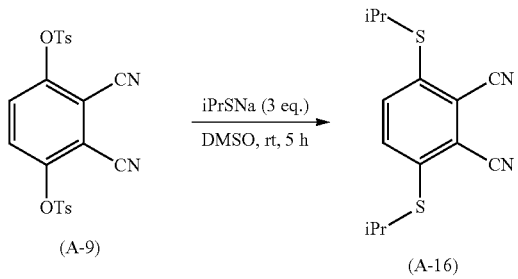

(A-9)                (A-16)

In an argon atmosphere, after 937 mg (2.0 mmol) of 3,6-ditosyloxy-4,5-dicyanobenzene (Compound (A-9)) was dissolved in 8 mL of DMSO, 654 mg (6.0 mmol) of iPrSNa was added to the solution, followed by stirring at room temperature for five hours. After water was added to the reaction mixture such that reaction was stopped, the reaction mixture was extracted with ethyl acetate. An organic layer was washed with water and a saturated saline solution, was dehydrated with sodium sulfate, and was then concentrated, whereby a crude product was obtained. The obtained crude product was purified by silica gel column chromatography (a developing solvent: hexane/ethyl acetate=3/1 (v/v)), whereby a yellow powdery target compound, that is, Compound (A-16) was obtained. The amount of the obtained target compound was 340 mg and the yield thereof was 62%.

$^1$HNMR (400 MHz, CDCl$_3$): δ (ppm)=7.56 (s, 2H), 3.57 (septet, 2H, J=6.8 Hz), 1.35 (d, 12H, J=6.8 Hz)

(14) Synthesis of Compound (A-17)

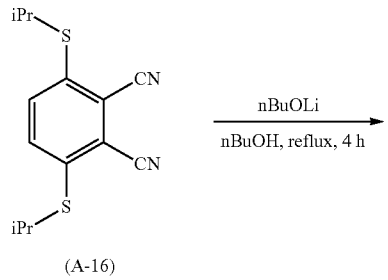

(A-16)

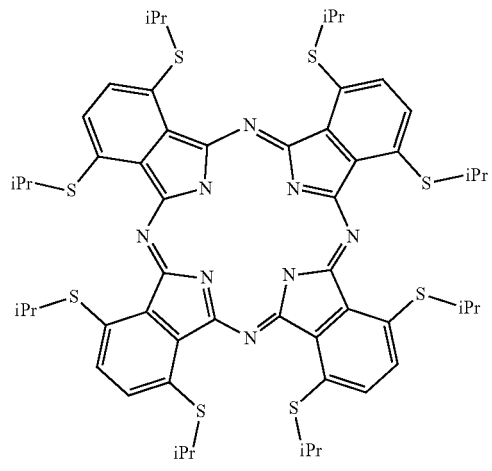

(A-17)

In an argon atmosphere, metallic Li (about four pieces) was added to 1 mL of 1-butanol (dehydrated), followed by heating for about ten minutes to 30 minutes under reflux until all Li was dissolved. To an obtained solution, 150 mg (0.54 mmol) of Compound (A-16) was added, followed by heating for four hours under reflux. After dilute hydrochloric acid (2M) was added to the reaction mixture such that reaction was stopped, the resulting reaction mixture was extracted with chloroform. An organic layer was washed with water and a saturated saline solution, was dehydrated with magnesium sulfate, and was then concentrated, whereby a crude product was obtained. The obtained crude product was purified by silica gel column chromatography (CHCl$_3$), whereby a dark red powdery target compound, that is, Compound (A-17) was obtained. The amount of the obtained target compound was 66 mg and the yield thereof was 44%.

$^1$HNMR (500 MHz, CDCl$_3$): δ (ppm)=7.87 (s, 8H), 4.04 (septet, 8H, J=6.5 Hz), 1.62 (d, 48H, J=6.5 Hz)

UV-vis (CHCl$_3$): λmax (nm)=802

(15) Synthesis of Compound (A-18)

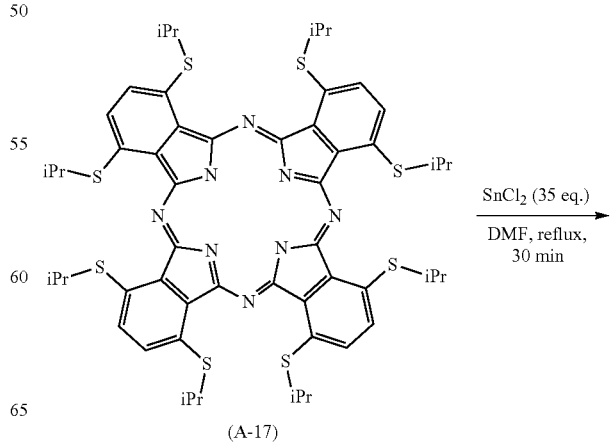

(A-17)

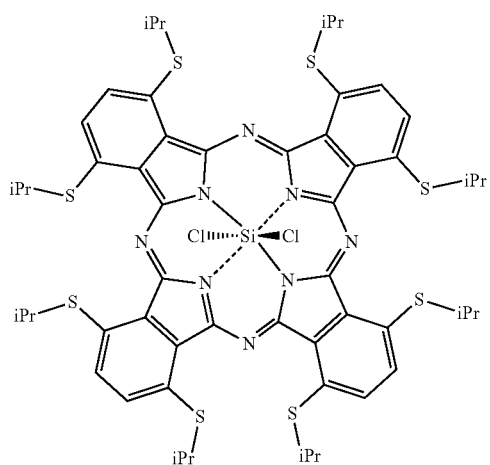

(A-18)

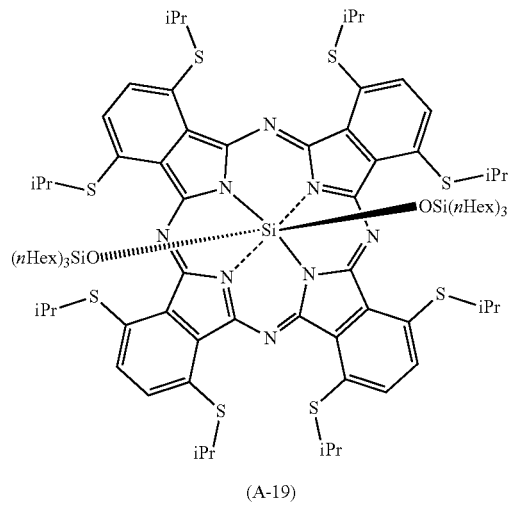

(A-19)

In an argon atmosphere, after 28.6 mg of Compound (A-17) was dissolved in 0.7 mL of dehydrated DMF, 0.1 mL of $SnCl_2$ was added to the solution, followed by heating for 30 minutes under reflux. After water was added to the reaction mixture such that reaction was stopped, the reaction mixture was extracted with chloroform. An organic layer was washed with water and a saturated saline solution, was dehydrated with magnesium sulfate, and was then concentrated, whereby a crude product was obtained. The obtained crude product was purified by silica gel column chromatography ($CHCl_3$/MeOH=20/1 (v/v)), whereby a dark blue powdery target compound, that is, Compound (A-18) was obtained. The amount of the obtained target compound was 14 mg.

UV-vis ($CHCl_3$):λmax (nm)=883

(16) Synthesis of (S-iPr)$_8$PcSn(OSiHex$_3$)$_2$ (Compound (A-19))

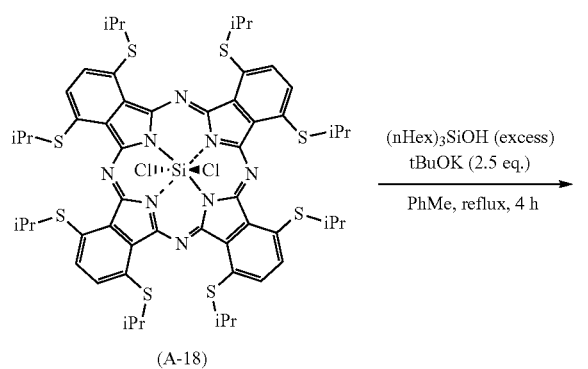

(A-18)

(nHex)$_3$SiOH (excess)
tBuOK (2.5 eq.)
⟶
PhMe, reflux, 4 h

In an argon atmosphere, 50 mg (38.6 μmol) of Compound (A-18) was dissolved in 2 mL of dehydrated toluene and 0.25 mL of (nHex)$_3$SiOH and 12.5 mg (0.1 mmol) of tBuOK were subsequently added to the solution, followed by heating for four hours under reflux. After the termination of reaction was confirmed from an absorption spectrum and by TLC, a reaction solution was concentrated in an evaporator and methanol was added to residue. Subsequently, insoluble matter was filtered out. The filtered-out insoluble matter was washed with methanol until the viscosity thereof became zero, whereby a dark blue powdery target compound, that is, Compound (A-19) was obtained. The amount of the obtained target compound was 32.7 mg and the yield thereof was 48%.

$^1$HNMR (500 MHz, $CDCl_3$): δ (ppm)=8.03 (s, 8H), 4.10 (septet, 8H, J=6.0 Hz), 1.67 (d, 48H, J=6.0 Hz), 0.84-0.79 (m, 12H), 0.62 (t, 18H, J=7.0 Hz), 0.43-0.40 (m, 12H), 0.14-0.11 (m, 12H), −0.98-−1.01 (m, 12H), −2.13-−2.16 (m, 12H)

UV-vis ($CHCl_3$): λmax (nm) (ε (molar absorption coefficient)×10$^{-4}$)=304 (6.4), 351 (4.9), 773sh (3.8), 865 (9.2)

From the above results, it could be confirmed that the target compound was obtained by the above synthesis procedure.

The obtained compound was dissolved in chloroform and was measured for absorption spectrum. Results are shown in FIG. 6A. As shown in FIG. 6A, the wavelength of an absorption peak of the obtained compound in the near-infrared region was 865 nm. Thus, it was clear that the compound obtained in Example 5 was a material having an absorption maximum wavelength in the near-infrared region.

Example 6

Synthesis of (S-Pent)$_8$PcSi(OPO(Ph-4-F)$_2$)$_2$

A compound, (S-Pent)$_8$PcSi(OPO(Ph-4-F)$_2$)$_2$, represented by the following formula was synthesized in accordance with Step (17) below:

(12)

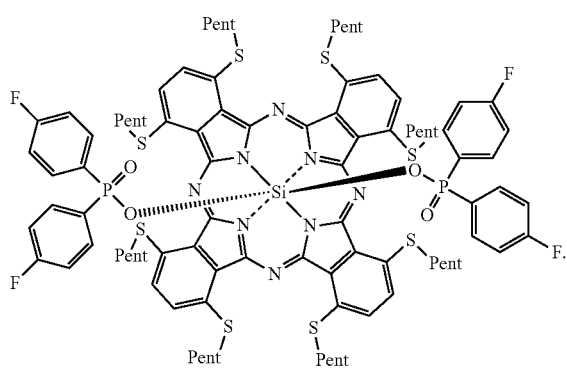

(17) Synthesis of (S-Pent)$_8$PcSi(OPO(Ph-4-F)$_2$)$_2$ (Compound (A-20))

room temperature, dichloromethane and distilled water were added to the reaction solution, and an organic layer was separated with a separatory funnel. Solvents were distilled off from the separated organic layer, whereby the organic layer was concentrated.

Obtained concentrate was purified by silica gel column chromatography (a developing solvent, a toluene-to-ethyl acetate ratio of 10:1), whereby a target compound, that is, Compound (A-20) was obtained. The amount of the obtained target compound was 48 mg and the yield thereof was 71%.

The obtained compound was identified by $^1$HNMR and MALDI-TOF MS. Results were as shown below.

$^1$HNMR (400 MHz, CDCl$_3$): δ (ppm)=7.875 (8H), 6.167 (8H), 5.22 (8H), 3.36 (16H), 2.03 (16H), 1.65 (16H), 1.50 (16H), 1.01 (24H)

MALDI-TOF-MS measured value: m/z=1,863.60 (M$^+$)

The chemical formula for the target compound is C$_{96}$H$_{112}$F$_4$N$_8$O$_4$P$_2$S$_8$Si and the exact mass thereof is 1,862.58.

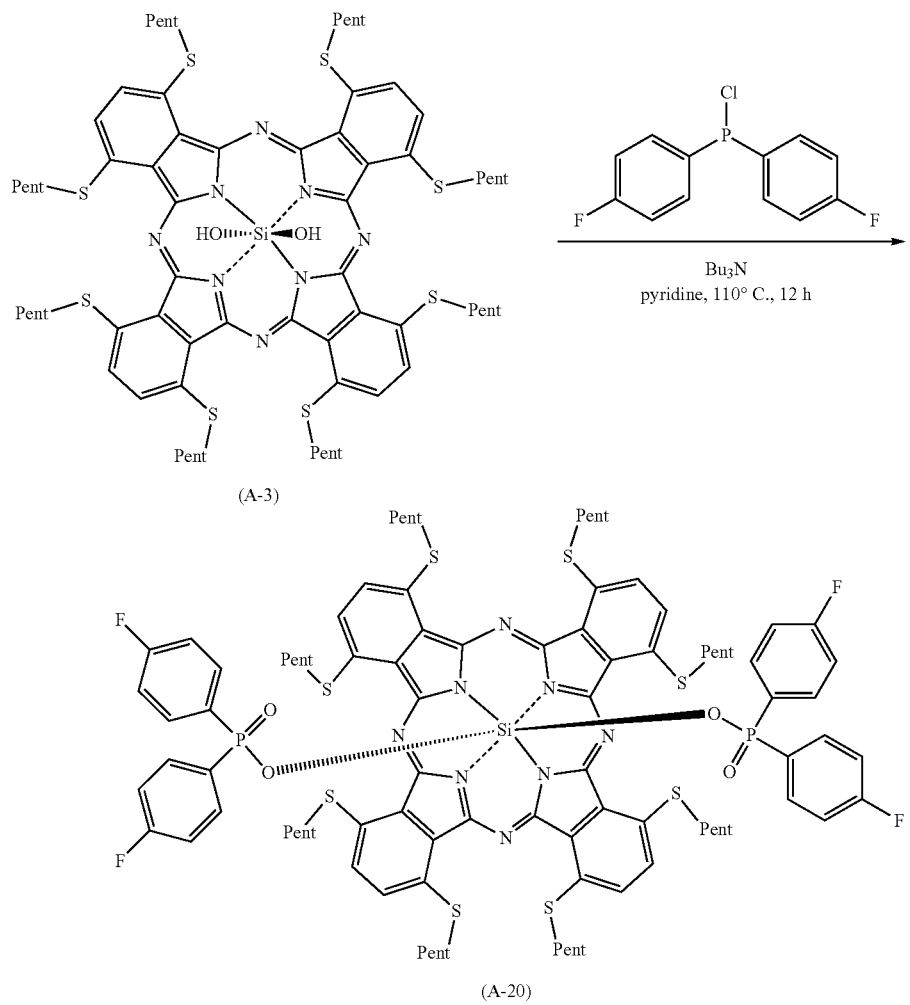

To a 10 mL reaction vessel filled with argon, 0.050 g of (S-Pent)$_8$PcSi(OH)$_2$ (Compound (A-3)) synthesized in Step (2) and 0.20 g of chlorobis(4-fluorophenyl)phosphine were added and 0.5 mL of tributylamine and 2 mL of dehydrated pyridine were further added, followed by stirring at 110° C. for 12 hours. Subsequently, a reaction solution was cooled to From the above results, it could be confirmed that the target compound was obtained by the above synthesis procedure.

The obtained compound was dissolved in chloroform and was measured for absorption spectrum. Results are shown by a continuous line in FIG. 6B. As shown by the continuous line in FIG. 6B, the wavelength of an absorption peak of the obtained compound in the near-infrared region was 868 nm. Thus, it was clear that the compound obtained in Example 6 was a material having an absorption maximum wavelength in the near-infrared region.

Example 7

Synthesis of (S-Pent)$_8$PcSi(OPO(Ph-3,5-diF)$_2$)$_2$

A compound, (S-Pent)$_8$PcSi(OPO(Ph-3,5-diF)$_2$)$_2$, represented by the following formula was synthesized in accordance with Steps (18) to (20) below:

(13)

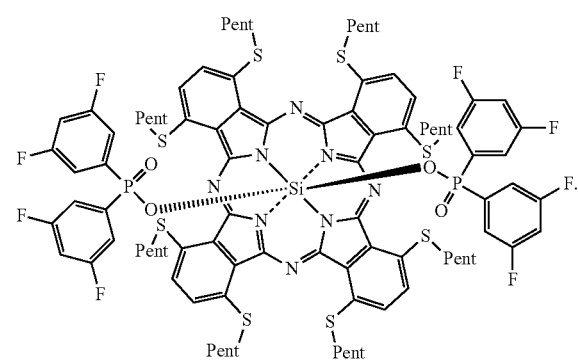

(18) Synthesis of Compound (A-22)

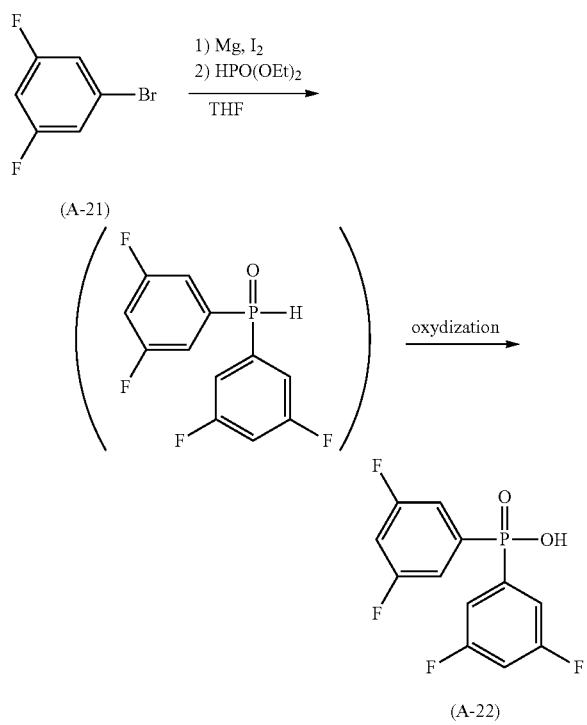

Into a 200 mL reaction vessel filled with argon, 40 mL of THF (dehydrated) was poured, 0.85 g of metallic magnesium was subsequently charged, and 7 mg of iodine was further added, followed by mixing. Next, a solution obtained by mixing 3.7 mL of 1-bromo-3,5-difluorobenzene (Compound (A-21)) with 16.3 mL of diethyl ether was added dropwise to the reaction vessel over 25 minutes. After the completion of dropwise addition, a reaction solution was stirred at room temperature for two hours. Thereafter, the reaction vessel was cooled to −5° C. and a solution obtained by mixing 1.9 mL of diethyl phosphite with THF (dehydrated) was added dropwise to the reaction vessel over 25 minutes. The reaction solution as is was stirred for 14 hours.

Thereafter, about 100 mL of a 0.3 M aqueous solution of HCl was added to the reaction solution. Subsequently, about 100 mL of ethyl acetate was added to the resulting reaction solution, followed by liquid separation using a separatory funnel. Reaction products were extracted from an aqueous layer with ethyl acetate. An extracted organic layer was dehydrated with MgSO$_4$ and was concentrated in such a manner that a solvent was distilled off from the organic layer.

Thereafter, the concentrate was dissolved in diethyl ether. After the solution was bubbled with air at room temperature for four hours, the solution was concentrated. The concentrated solution was stored in a cool, dark place, whereby a solid was precipitated. The precipitated solid was filtered out, whereby a target compound, that is, Compound (A-22) was obtained. The amount of the obtained target compound was 512 mg and the yield thereof was 12%.

The obtained compound was identified by $^1$HNMR and $^{19}$FNMR. Results were as shown below.

$^1$HNMR (400 MHz, CDCl$_3$): δ (ppm)=7.45 (6H)

$^{19}$FNMR (376 MHz, DMSO): δ (ppm)=108.3 (4F)

(19) Synthesis of Compound (A-23)

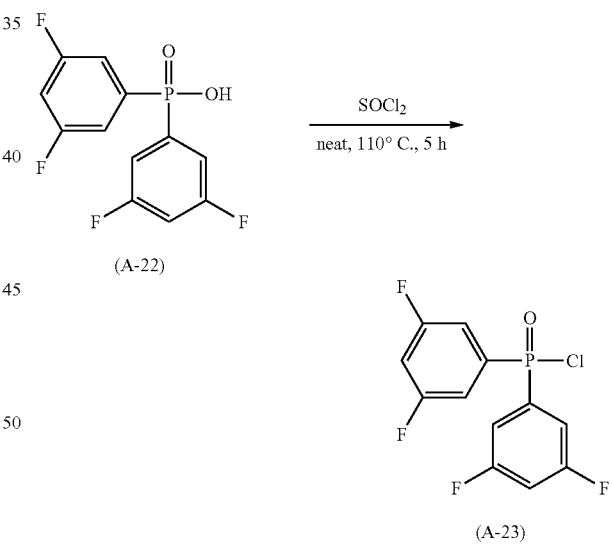

Into a 10 mL reaction vessel filled with argon, 150 mg of Compound (A-22) synthesized in Step (18) and 3 mL of thionyl chloride were put, followed by heating the reaction vessel at 110° C. for five hours under reflux. Thereafter, a reaction solution was naturally cooled and was concentrated. Furthermore, dehydrated toluene was added to the reaction solution and was azeotropically distilled with the reaction solution repeatedly five times, whereby a transparent liquid target compound, that is, Compound (A-23) was obtained. The amount of the obtained target compound was 139 mg and the yield thereof was 82%.

The obtained compound was identified by ¹HNMR, ¹⁹FNMR, and ³¹PNMR. Results were as shown below.

¹HNMR(400 MHz,CDCl$_3$):δ(ppm)=7.46(6H)

¹⁹FNMR(376 MHz,DMSO):δ(ppm)=108.3(4F)

³¹PNMR(162 MHz,DMSO):δ(ppm)=17.8(1P)

(20) Synthesis of (S-Pent)$_8$PcSi(OPO(Ph-3,5-diF)$_2$)$_2$ (Compound (A-24))

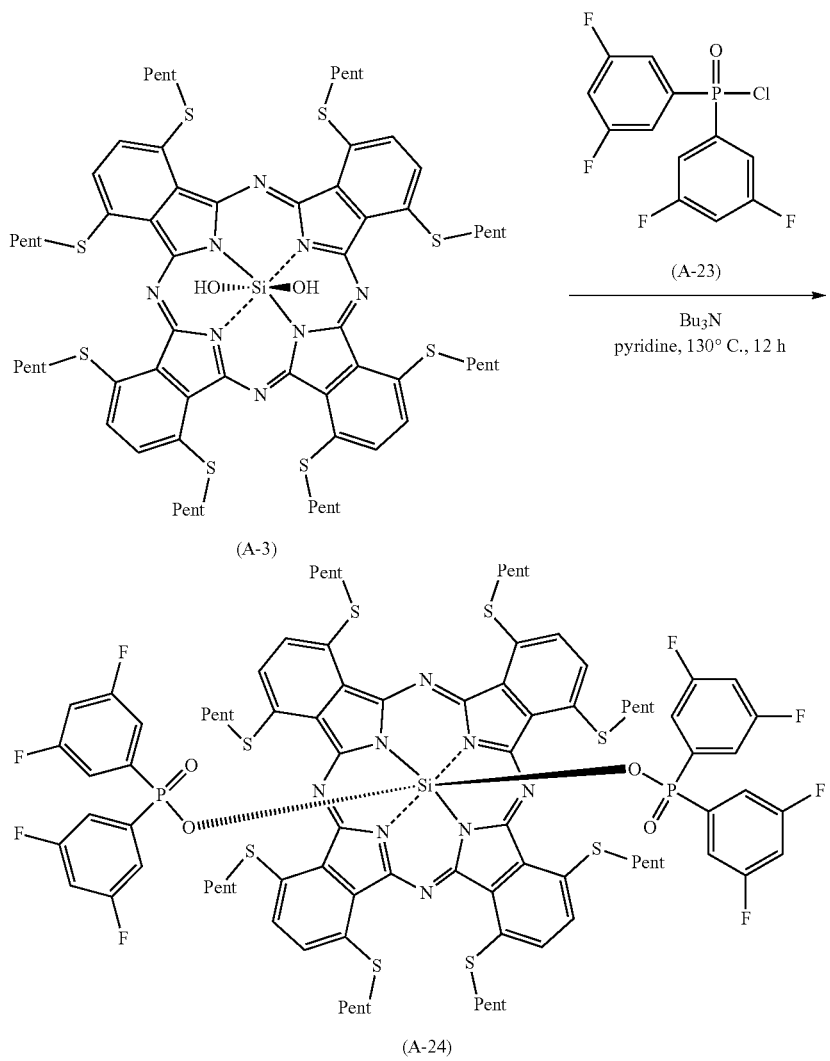

To a 10 mL reaction vessel filled with argon, 150 mg of (S-Pent)$_8$PcSi(OH)$_2$ (Compound (A-3)) synthesized in Step (2) and 405 mg of Compound (A-23) were added and 0.5 mL of tributylamine and 4 mL of dehydrated pyridine were further added, followed by stirring at 130° C. for 12 hours. Subsequently, a reaction solution was cooled to room temperature, chloroform and distilled water were added to the reaction solution, and an organic layer was separated using a separatory funnel. The separated organic layer was concentrated in such a manner that solvents were distilled off from the organic layer.

Obtained concentrate was purified by neutral alumina column chromatography (a developing solvent, a toluene-to-ethyl acetate ratio of 100:0 to 50:1). After the developing solvent was removed, the concentrate was washed with heptane, whereby a target compound, that is, Compound (A-24) was obtained. The amount of the obtained target compound was 117.1 mg and the yield thereof was 65%.

The obtained compound was identified by ¹HNMR and MALDI-TOF MS. Results were as shown below.

¹HNMR (400 MHz, CDCl$_3$): δ (ppm)=7.90 (8H), 6.22 (4H), 4.77 (8H), 3.34 (16H), 2.02 (16H), 1.66 (16H), 1.49 (16H), 0.99 (24H)

MALDI-TOF-MS measured value: m/z=1,935.51 (M⁺)

The chemical formula for the target compound is C$_{96}$H$_{108}$F$_8$N$_8$O$_4$P$_2$S$_8$Si and the exact mass thereof is 1,934.54.

From the above results, it could be confirmed that the target compound was obtained by the above synthesis procedure.

The obtained compound was dissolved in chloroform and was measured for absorption spectrum. Results are shown by a dotted line in FIG. 6B. As shown by the dotted line in FIG. 6B, the wavelength of an absorption peak of the obtained compound in the near-infrared region was 886 nm. Thus, it was clear that the compound obtained in Example 7 was a material having an absorption maximum wavelength in the near-infrared region.

Example 8
Synthesis of (S-Pent)$_8$PcSi(OPO(Ph-4-CF$_3$)$_2$)$_2$
A compound, (S-Pent)$_8$PcSi(OPO(Ph-4-CF$_3$)$_2$)$_2$, represented by the following formula was synthesized in accordance with Step (21) below:
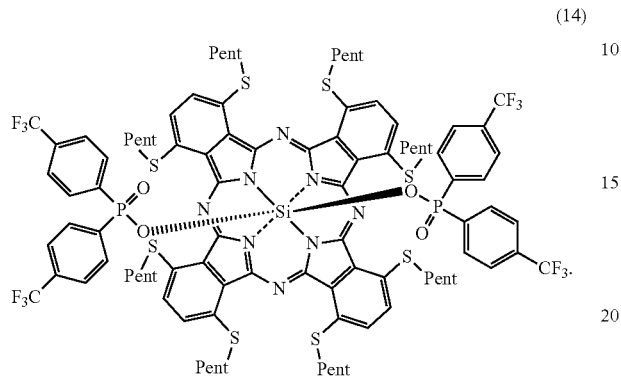
(14)
(21) Synthesis of (S-Pent)$_8$PcSi(OPO(Ph-4-CF$_3$)$_2$)$_2$ (Compound (A-25))
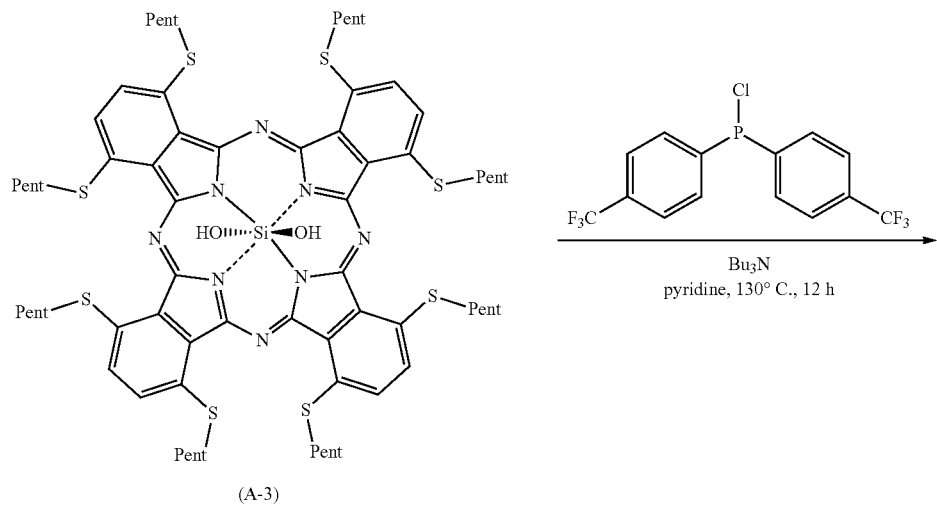
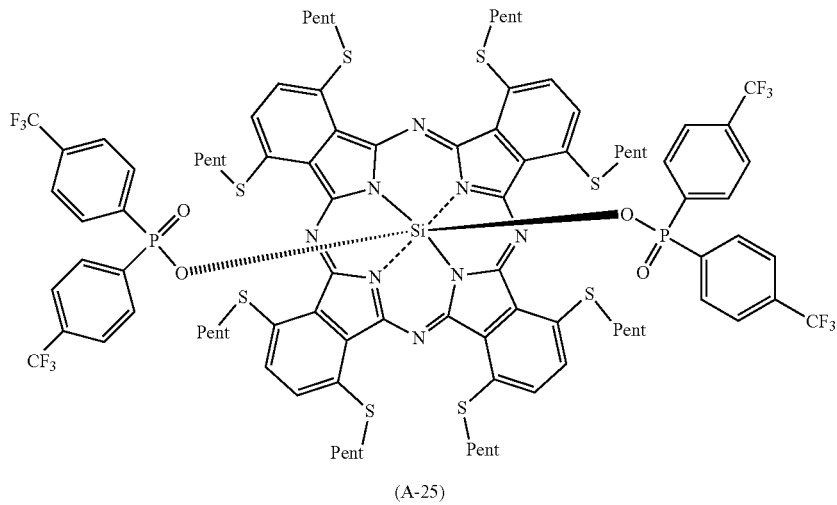

To a 20 mL reaction vessel filled with argon, 0.150 g of (S-Pent)$_8$PcSi(OH)$_2$ (Compound (A-3)) synthesized in Step (2) and 0.576 g of chlorobis(4-trifluoromethylphenyl)phosphine were added and 1.5 mL of tributylamine and 10 mL of dehydrated pyridine were further added, followed by stirring at 130° C. for 12 hours. Subsequently, a reaction solution was cooled to room temperature, chloroform and distilled water were added to the reaction solution, and an organic layer was separated using a separatory funnel. The separated organic layer was concentrated in such a manner that solvents were distilled off from the organic layer. Obtained concentrate was purified using preparative layer chromatography (PLC) silica gel (a developing solvent, a toluene-to-ethyl acetate ratio of 5:1). A purified substance was extracted from the silica gel with the developing solvent. After the extract was concentrated, recrystallization was performed in cold heptane, whereby a solid target compound, that is, Compound (A-25) was obtained. The amount of the obtained target compound was 144 mg and the yield thereof was 48%.

The obtained compound was identified by $^1$HNMR and MALDI-TOF MS. Results were as shown below.

$^1$HNMR (400 MHz, CDCl$_3$): δ (ppm)=7.86 (8H), 6.76 (8H), 5.42 (8H), 3.34 (16H), 2.05 (16H), 1.67 (16H), 1.49 (16H), 1.01 (24H)

MALDI-TOF-MS measured value: m/z=2,061.92 (M$^+$)

The chemical formula for the target compound is $C_{100}H_{112}F_{12}N_8O_4P_2S_8Si$ and the exact mass thereof is 2,062.56.

From the above results, it could be confirmed that the target compound was obtained by the above synthesis procedure.

The obtained compound was dissolved in chloroform and was measured for absorption spectrum. Results are shown by a dashed line in FIG. 6B. As shown by the dashed line in FIG. 6B, the wavelength of an absorption peak of the obtained compound in the near-infrared region was 882 nm. Thus, it was clear that the compound obtained in Example 8 was a material having an absorption maximum wavelength in the near-infrared region.

Example 9

Synthesis of (S-Pent)$_8$PcSi(OPO(Ph-3,5-bisCF$_3$)$_2$)$_2$

A compound, (S-Pent)$_8$PcSi(OPO(Ph-3,5-bisCF$_3$)$_2$)$_2$, represented by the following formula was synthesized in accordance with Step (22) below:

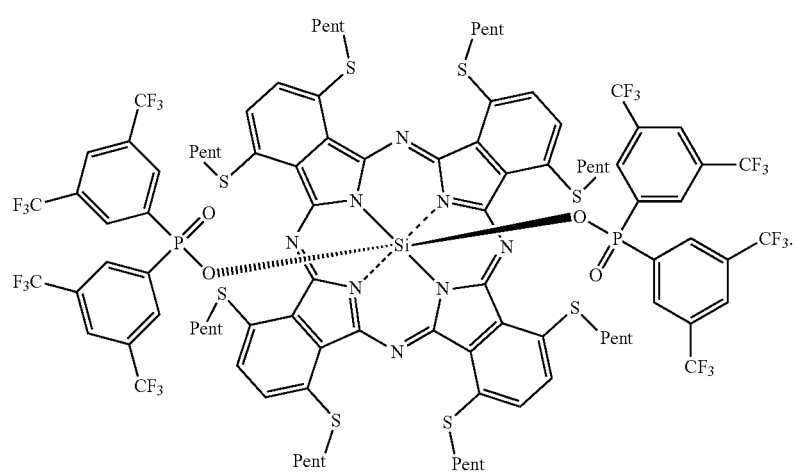

(15)

(22) Synthesis of (S-Pent)$_8$PcSi(OPO(Ph-3,5-bisCF$_3$)$_2$)$_2$ (Compound (A-26))

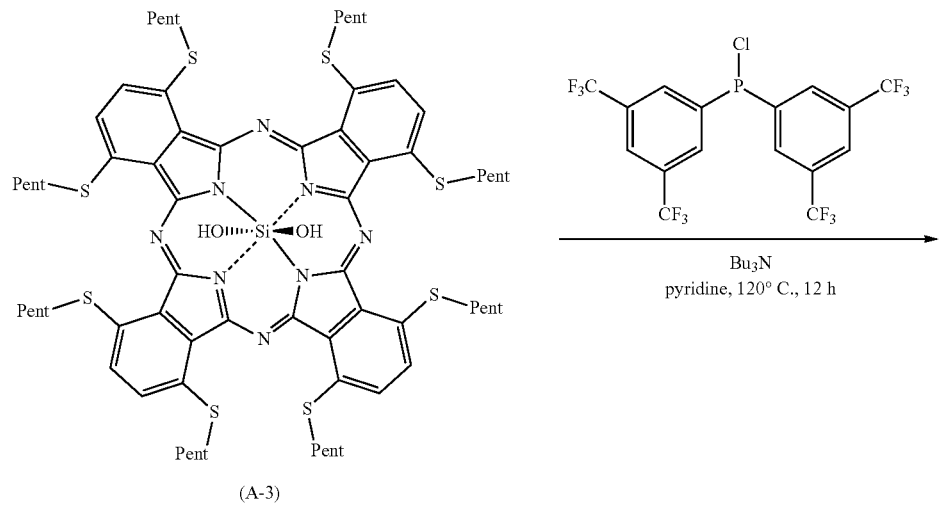

(A-3)

-continued

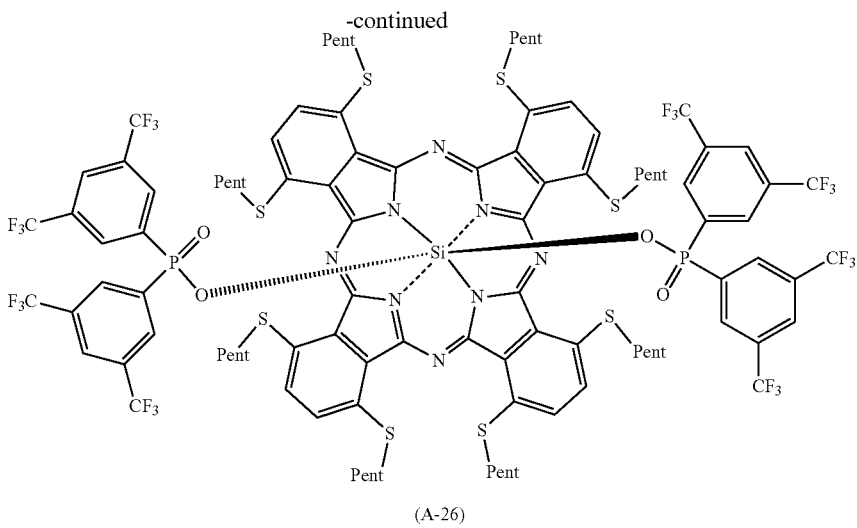

(A-26)

To a 10 mL reaction vessel filled with argon, 84.7 mg of (S-Pent)$_8$PcSi(OH)$_2$ (Compound (A-3)) synthesized in Step (2) and 0.66 g of chlorobis[3,5-bis(trifluoromethyl)phenyl] phosphine were added and 0.9 mL of tributylamine and 4 mL of dehydrated pyridine were further added, followed by stirring at 120° C. for 12 hours. Subsequently, a reaction solution was cooled to room temperature, chloroform and distilled water were added to the reaction solution, and an organic layer was separated using a separatory funnel. The separated organic layer was concentrated in such a manner that solvents were distilled off from the organic layer. Obtained concentrate was purified using PLC silica gel (a developing solvent, a toluene-to-ethyl acetate ratio of 20:1). A purified substance was extracted from the silica gel with the developing solvent. After the extract was concentrated, recrystallization was performed in cold heptane, whereby a solid target compound, that is, Compound (A-26) was obtained. The amount of the obtained target compound was 36.9 mg and the yield thereof was 26%.

The obtained compound was identified by $^1$HNMR and MALDI-TOF MS. Results were as shown below.

$^1$HNMR (400 MHz, CDCl$_3$):δ(ppm)=7.90 (8H), 7.33 (4H), 5.73 (8H), 3.29 (16H), 2.05 (16H), 1.68 (16H), 1.49 (16H), 1.04 (24H)

MALDI-TOF-MS measured value: m/z=2,334.36 (M+)

The chemical formula for the target compound is $C_{104}H_{108}F_{24}N_8O_4P_2S_8Si$ and the exact mass thereof is 2,334.51.

From the above results, it could be confirmed that the target compound was obtained by the above synthesis procedure. The obtained compound was dissolved in chloroform and was measured for absorption spectrum. Results are shown by a long dashed dotted line in FIG. 6B. As shown by the long dashed dotted line in FIG. 6B, the wavelength of an absorption peak of the obtained compound obtained in Example 9 was a material having an absorption maximum wavelength in the near-infrared region.

Near-Infrared Photoelectric Conversion Film

A near-infrared photoelectric conversion film according to the present disclosure is further described below in detail with reference to Examples 10 to 18.

Example 10

A support substrate, made of quartz glass, having a thickness of 0.7 mm was used. The support substrate was coated with a chloroform mixed solution prepared by mixing (S-Pent)$_8$PcSi(OSiBu$_3$)$_2$ obtained in Example 1 and a [6,6]-phenyl-C61-butyric acid methyl ester (PCBM) derivative at a weight ratio of 1:9 by a spin coating method, whereby a near-infrared photoelectric conversion film having a thickness of 196 nm and an ionization potential of 5.25 eV was obtained.

Method for Measuring Absorption Spectrum

The obtained near-infrared photoelectric conversion film was measured for absorption spectrum using a spectrophotometer, U4100, available from Hitachi High-Technologies Corporation. The wavelength used to measure the absorption spectrum was from 400 nm to 1,200 nm. Results were as shown in FIG. 7A.

Figure 7A:
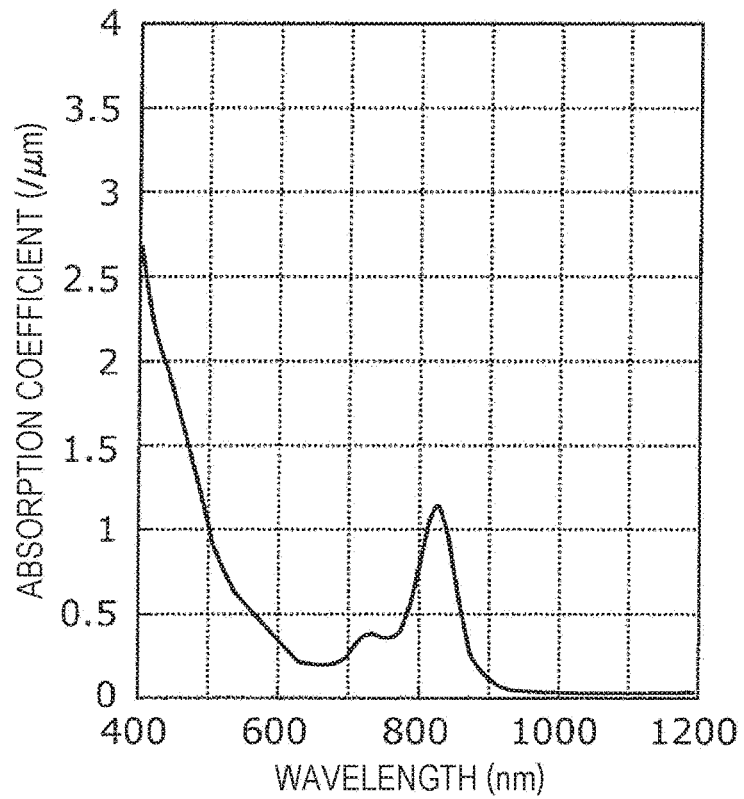
FIG. 7A is a graph showing the absorption spectrum of a near-infrared photoelectric conversion film obtained in Example 10.

As shown in FIG. 7A, the near-infrared photoelectric conversion film obtained in Example 10 had an absorption peak at about 824 nm.

Method for Measuring Ionization Potential

Figure 7B:
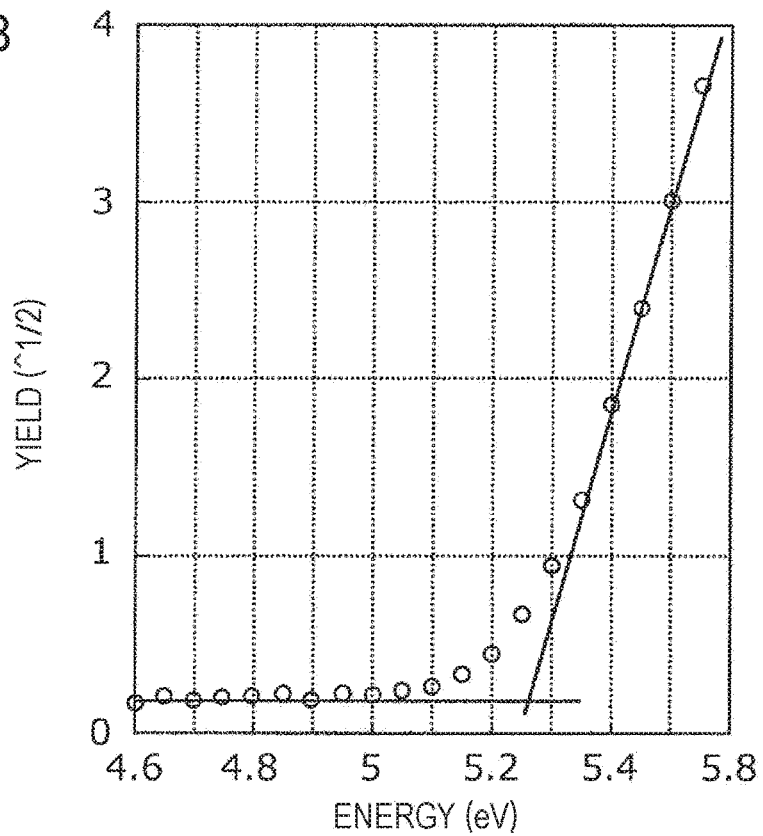
FIG. 7B is a graph showing results of the photoelectron spectroscopic measurement of the near-infrared photoelectric conversion film obtained in Example 10.

The near-infrared photoelectric conversion film obtained in Example 10 was measured for ionization potential. The ionization potential thereof was measured in such a manner that the compound obtained in Example 1 was formed into a film on an ITO substrate and the film was measured in air using a photoelectron spectrometer, AC-3, available from Riken Keiki Co., Ltd. Results were as shown in FIG. 7B.

The ionization potential is measured in terms of the number of photoelectrons detected by changing the energy of applied ultraviolet rays. Therefore, the energy position that photoelectrons begins to be detected can be taken as the ionization potential.

Example 11

Figure 8A:
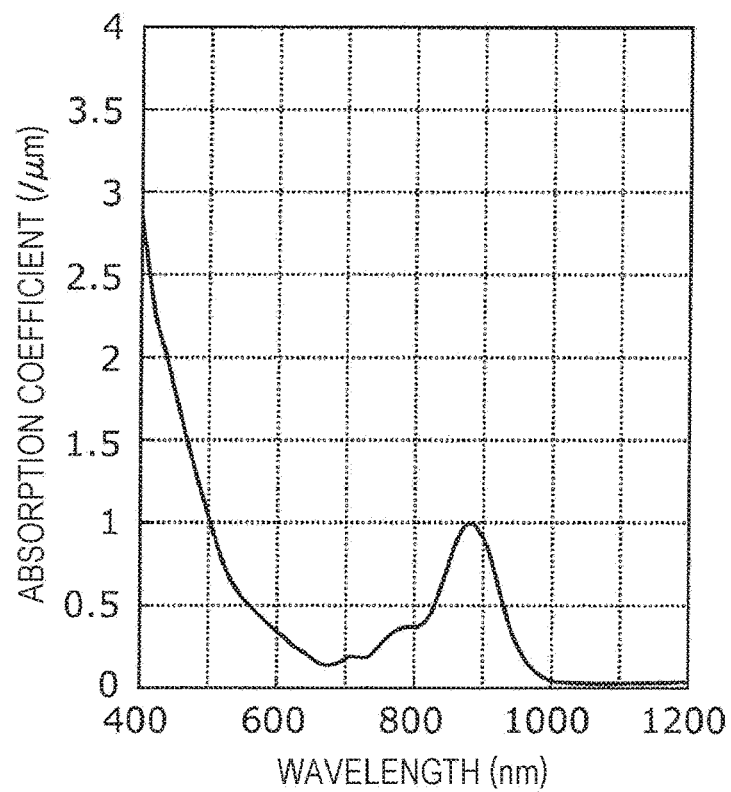
FIG. 8A is a graph showing the absorption spectrum of a near-infrared photoelectric conversion film obtained in Example 11.
Figure 8B:
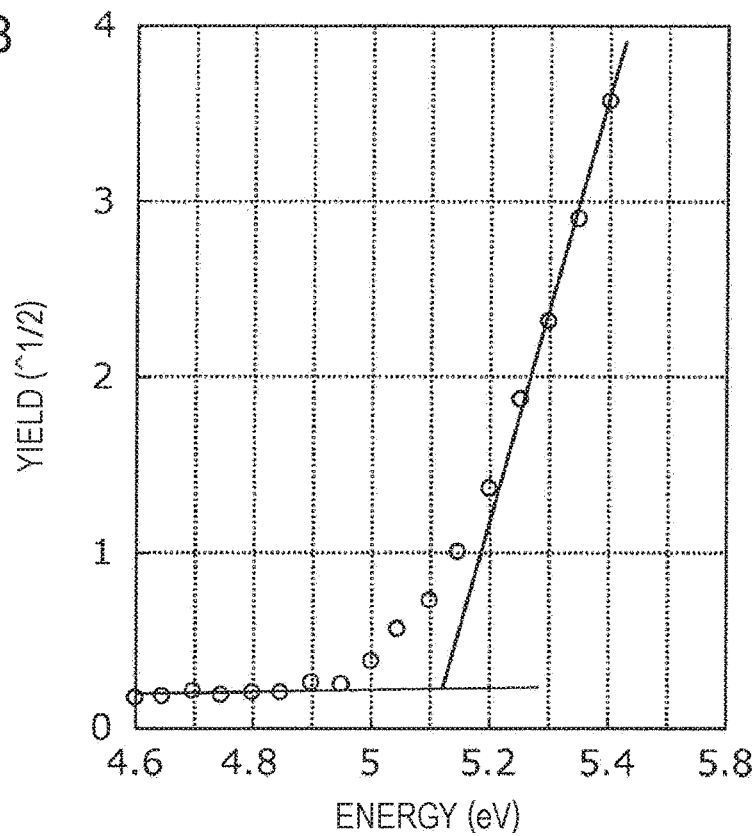
FIG. 8B is a graph showing results of the photoelectron spectroscopic measurement of the near-infrared photoelectric conversion film obtained in Example 11.

A support substrate, made of quartz glass, having a thickness of 0.7 mm was used. The support substrate was coated with a chloroform mixed solution prepared by mixing (S-Pent)$_8$PcSi(OPOPh$_2$)$_2$ obtained in Example 2 and a [6,6]-phenyl-C61-butyric acid methyl ester (PCBM) derivative at a weight ratio of 1:9 by a spin coating method, whereby a near-infrared photoelectric conversion film having a thickness of 187 nm and an ionization potential of 5.12 eV was obtained. The absorption spectrum of the obtained near-infrared photoelectric conversion film was measured in the same manner as that used in Example 10. Results were as shown in FIG. 8A. The ionization potential of the near-infrared photoelectric conversion film was measured in substantially the same manner as that used in Example 10 except that the compound obtained in Example 2 was used. Results were as shown in FIG. 8B.

As shown in FIG. 8A, the near-infrared photoelectric conversion film obtained in Example 11 had an absorption peak at about 896 nm.

Example 12

Figure 9A:
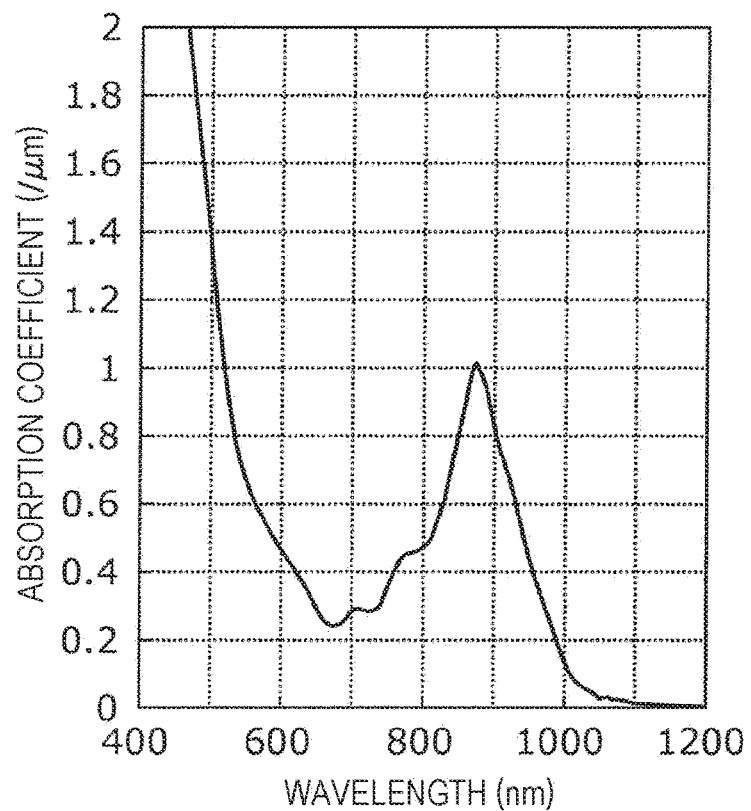
FIG. 9A is a graph showing the absorption spectrum of a near-infrared photoelectric conversion film obtained in Example 12.
Figure 9B:
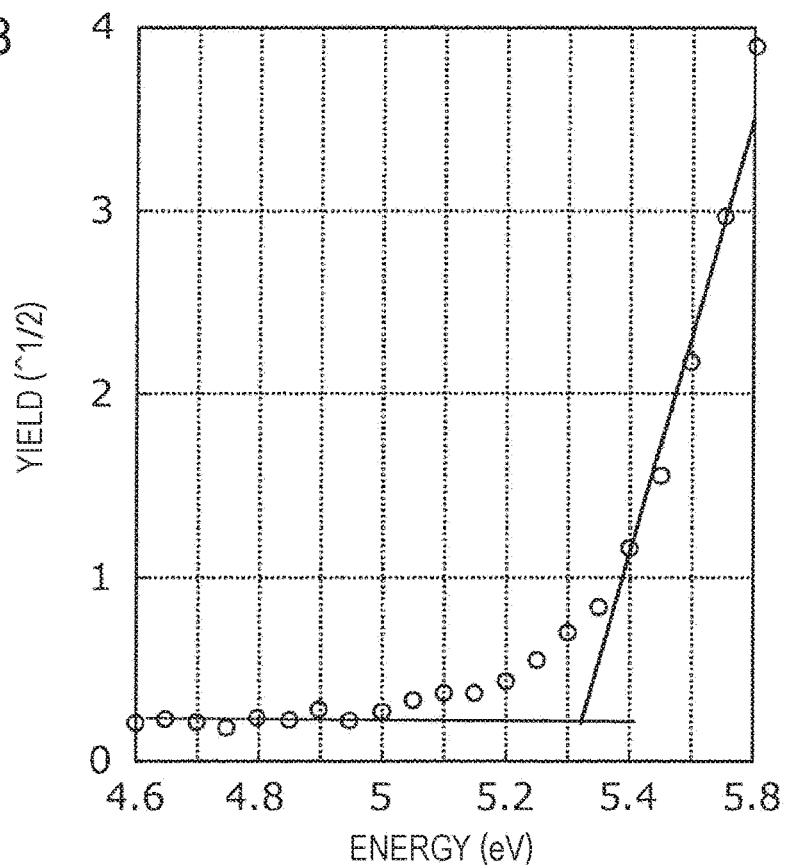
FIG. 9B is a graph showing results of the photoelectron spectroscopic measurement of the near-infrared photoelectric conversion film obtained in Example 12.

A support substrate, made of quartz glass, having a thickness of 0.7 mm was used. The support substrate was coated with a chloroform mixed solution prepared by mixing (S-Pent)$_8$PcSn(OSiHex$_3$)$_2$ obtained in Example 3 and a [6,6]-phenyl-C61-butyric acid methyl ester (PCBM) derivative at a weight ratio of 1:9 by a spin coating method, whereby a near-infrared photoelectric conversion film having a thickness of 267 nm and an ionization potential of 5.32 eV was obtained. The absorption spectrum of the obtained near-infrared photoelectric conversion film was measured in the same manner as that used in Example 10. Results were as shown in FIG. 9A. The ionization potential was measured in substantially the same manner as that used in Example 10 except that the compound obtained in Example 3 was used. Results were as shown in FIG. 9B.

As shown in FIG. 9A, the near-infrared photoelectric conversion film obtained in Example 12 had an absorption peak at about 882 nm.

Example 13

Figure 10A:
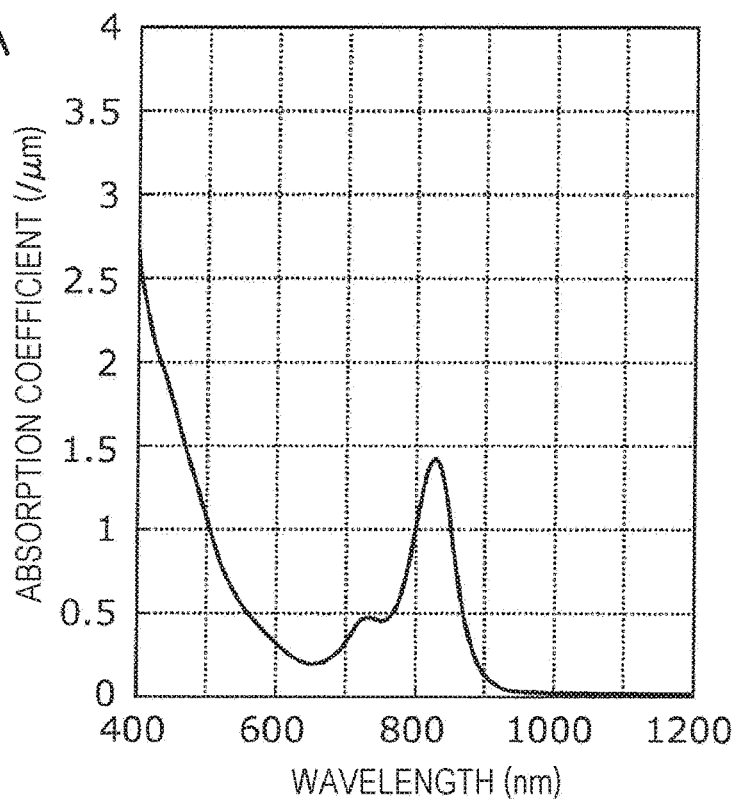
FIG. 10A is a graph showing the absorption spectrum of a near-infrared photoelectric conversion film obtained in Example 13.
Figure 10B:
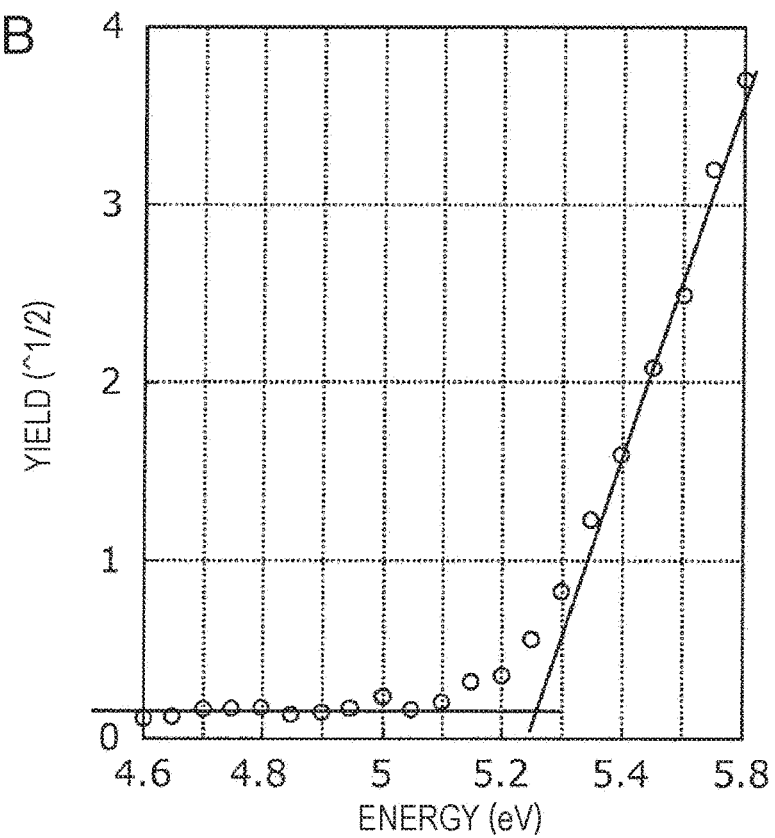
FIG. 10B is a graph showing results of the photoelectron spectroscopic measurement of the near-infrared photoelectric conversion film obtained in Example 13.

A support substrate, made of quartz glass, having a thickness of 0.7 mm was used. The support substrate was coated with a chloroform mixed solution prepared by mixing (S-Et)$_8$PcSi(OSiBu$_3$)$_2$ obtained in Example 4 and a [6,6]-phenyl-C61-butyric acid methyl ester (PCBM) derivative at a weight ratio of 1:9 by a spin coating method, whereby a near-infrared photoelectric conversion film having a thickness of 246 nm and an ionization potential of 5.25 eV was obtained. The absorption spectrum of the obtained near-infrared photoelectric conversion film was measured in the same manner as that used in Example 10. Results were as shown in FIG. 10A. The ionization potential was measured in substantially the same manner as that used in Example 10 except that the compound obtained in Example 4 was used. Results were as shown in FIG. 10B.

As shown in FIG. 10A, the near-infrared photoelectric conversion film obtained in Example 13 had an absorption peak at about 822 nm.

Example 14

Figure 11A:
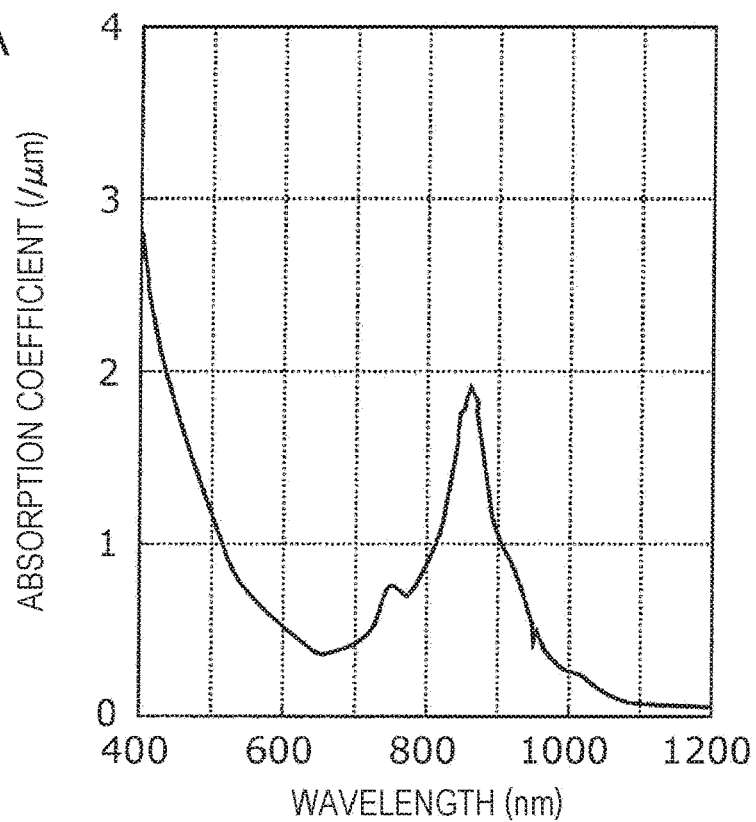
FIG. 11A is a graph showing the absorption spectrum of a near-infrared photoelectric conversion film obtained in Example 14.
Figure 11B:
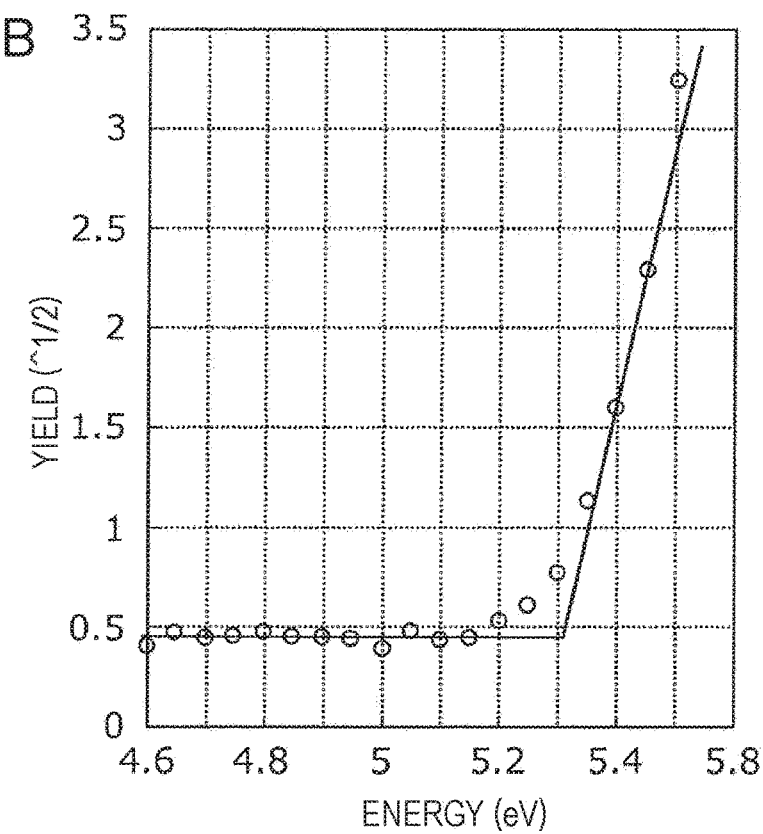
FIG. 11B is a graph showing results of the photoelectron spectroscopic measurement of the near-infrared photoelectric conversion film obtained in Example 14.

A support substrate, made of quartz glass, having a thickness of 0.7 mm was used. The support substrate was coated with a chloroform mixed solution prepared by mixing (S-iPr)$_8$PcSn(OSiHex$_3$)$_2$ obtained in Example 5 and a [6,6]-phenyl-C61-butyric acid methyl ester (PCBM) derivative at a weight ratio of 1:9 by a spin coating method, whereby a near-infrared photoelectric conversion film having a thickness of 280 nm and an ionization potential of 5.30 eV was obtained. The absorption spectrum of the obtained near-infrared photoelectric conversion film was measured in the same manner as that used in Example 10. Results were as shown in FIG. 11A. The ionization potential was measured in substantially the same manner as that used in Example 10 except that the compound obtained in Example 5 was used. Results were as shown in FIG. 11B.

As shown in FIG. 11A, the near-infrared photoelectric conversion film obtained in Example 14 had an absorption peak at about 860 nm.

Example 15

Figure 12A:
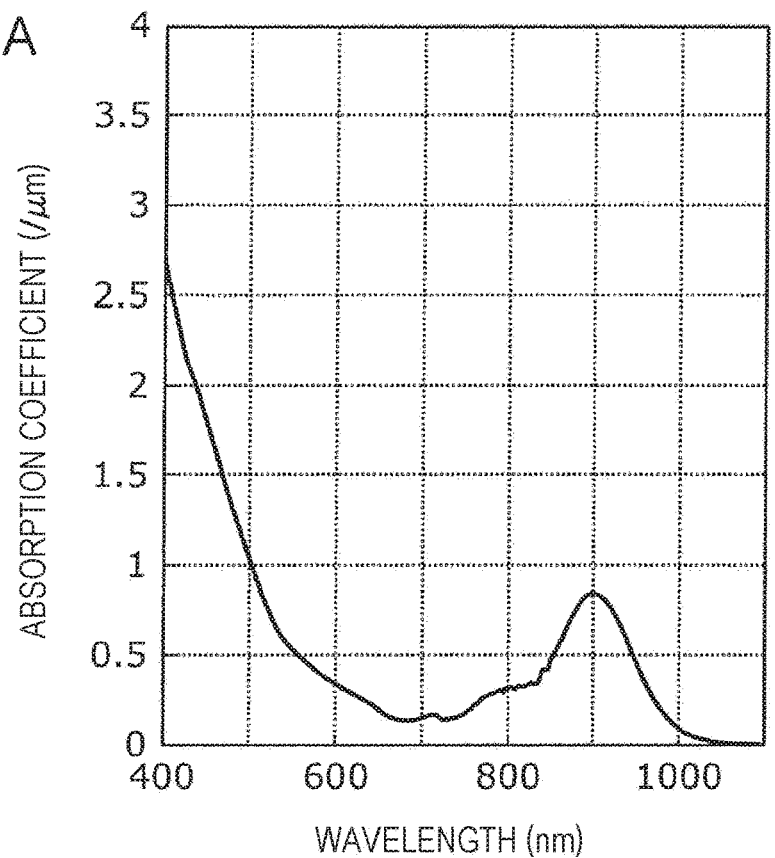
FIG. 12A is a graph showing the absorption spectrum of a near-infrared photoelectric conversion film obtained in Example 15.
Figure 12B:
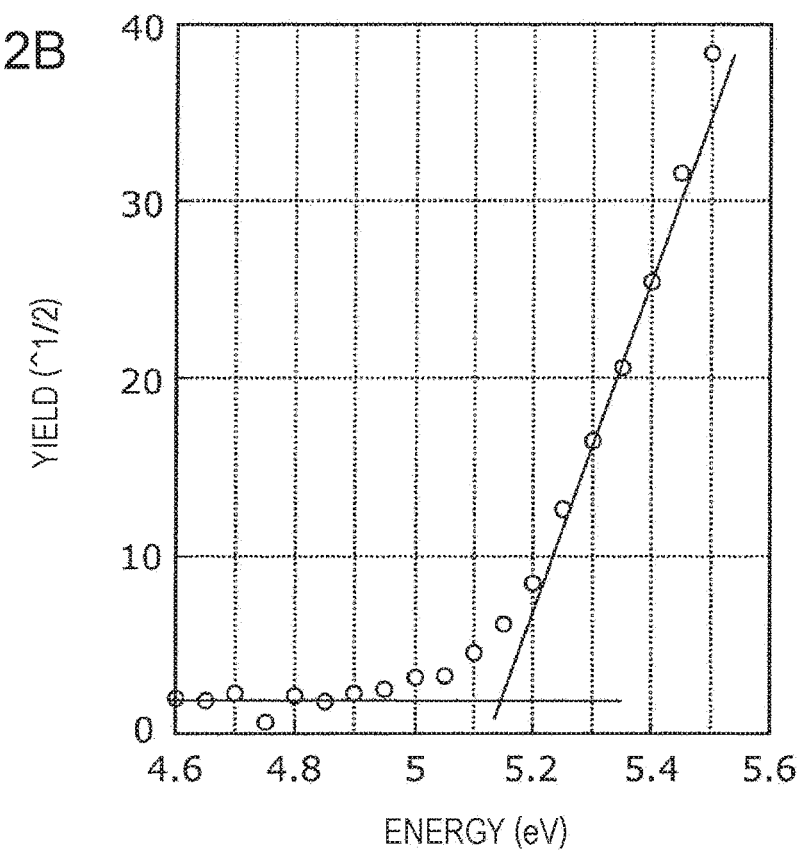
FIG. 12B is a graph showing results of the photoelectron spectroscopic measurement of the near-infrared photoelectric conversion film obtained in Example 15.

A support substrate, made of quartz glass, having a thickness of 0.7 mm was used. The support substrate was coated with a chloroform mixed solution prepared by mixing (S-Pent)$_8$PcSi(OPO(Ph-4-F)$_2$)$_2$ obtained in Example 6 and a [6,6]-phenyl-C61-butyric acid methyl ester (PCBM) derivative at a weight ratio of 1:9 by a spin coating method, whereby a near-infrared photoelectric conversion film having a thickness of 200 nm and an ionization potential of 5.15 eV was obtained. The absorption spectrum of the obtained near-infrared photoelectric conversion film was measured in the same manner as that used in Example 10. Results were as shown in FIG. 12A. The ionization potential was measured in substantially the same manner as that used in Example 10 except that the compound obtained in Example 6 was used. Results were as shown in FIG. 12B.

As shown in FIG. 12A, the near-infrared photoelectric conversion film obtained in Example 15 had an absorption peak at about 898 nm.

Example 16

Figure 13A:
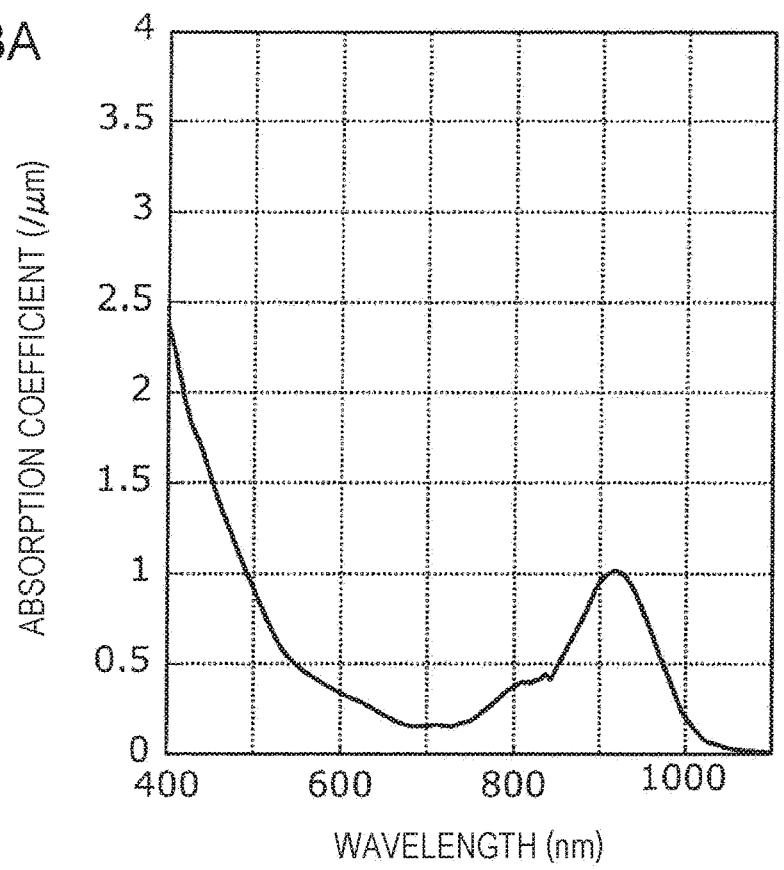
FIG. 13A is a graph showing the absorption spectrum of a near-infrared photoelectric conversion film obtained in Example 16.
Figure 13B:
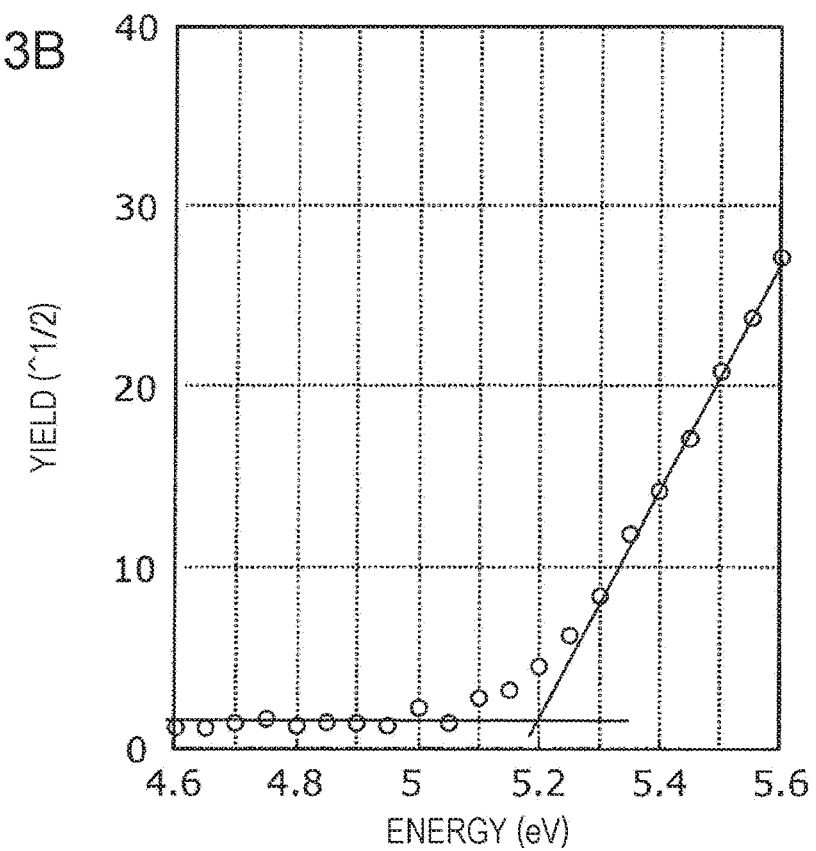
FIG. 13B is a graph showing results of the photoelectron spectroscopic measurement of the near-infrared photoelectric conversion film obtained in Example 16.

A support substrate, made of quartz glass, having a thickness of 0.7 mm was used. The support substrate was coated with a chloroform mixed solution prepared by mixing (S-Pent)$_8$PcSi(OPO(Ph-3,5-diF)$_2$)$_2$ obtained in Example 7 and a [6,6]-phenyl-C61-butyric acid methyl ester (PCBM) derivative at a weight ratio of 1:9 by a spin coating method, whereby a near-infrared photoelectric conversion film having a thickness of 217 nm and an ionization potential of 5.20 eV was obtained. The absorption spectrum of the obtained near-infrared photoelectric conversion film was measured in the same manner as that used in Example 10. Results were as shown in FIG. 13A. The ionization potential was measured in substantially the same manner as that used in Example 10 except that the compound obtained in Example 7 was used. Results were as shown in FIG. 13B.

As shown in FIG. 13A, the near-infrared photoelectric conversion film obtained in Example 16 had an absorption peak at about 920 nm.

Example 17

Figure 14A:
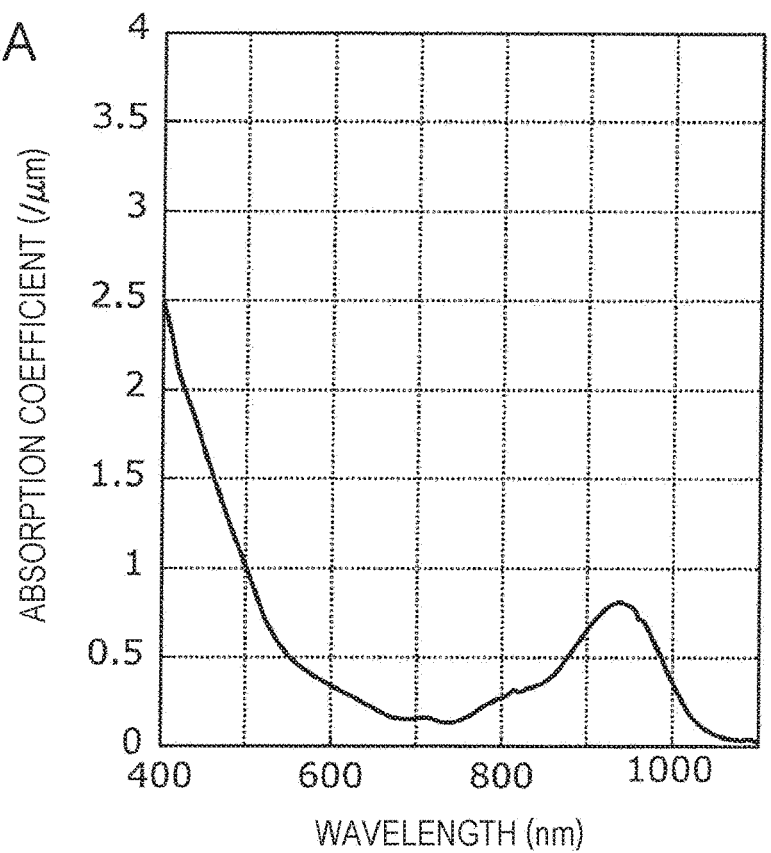
FIG. 14A is a graph showing the absorption spectrum of a near-infrared photoelectric conversion film obtained in Example 17.
Figure 14B:
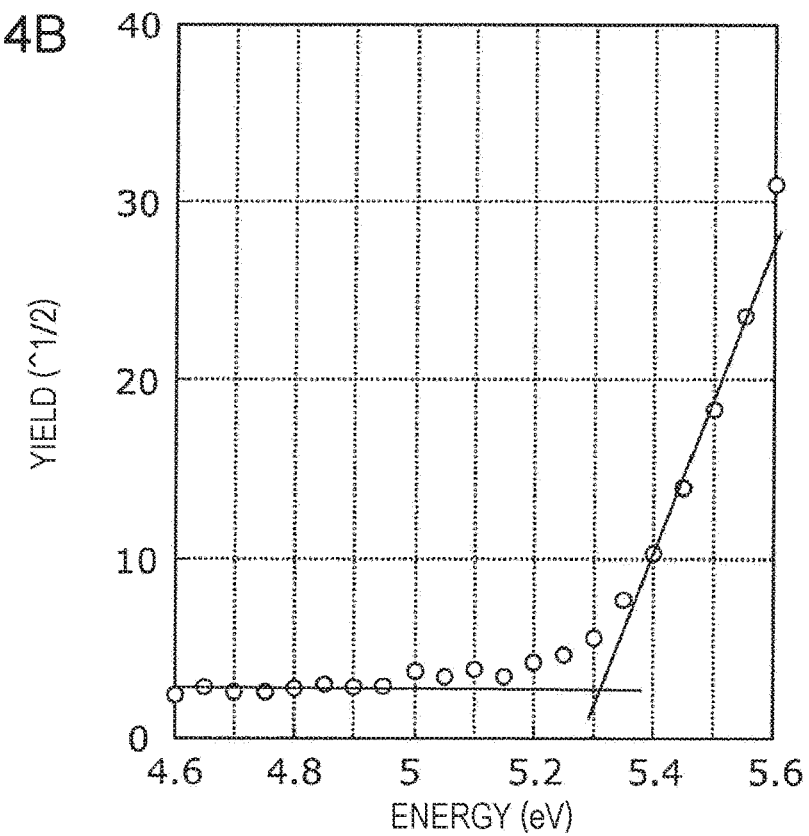
FIG. 14B is a graph showing results of the photoelectron spectroscopic measurement of the near-infrared photoelectric conversion film obtained in Example 17.

A support substrate, made of quartz glass, having a thickness of 0.7 mm was used. The support substrate was coated with a chloroform mixed solution prepared by mixing (S-Pent)$_8$PcSi(OPO(Ph-4-CF$_3$)$_2$)$_2$ obtained in Example 8 and a [6,6]-phenyl-C61-butyric acid methyl ester (PCBM) derivative at a weight ratio of 1:9 by a spin coating method, whereby a near-infrared photoelectric conversion film having a thickness of 206 nm and an ionization potential of 5.32 eV was obtained. The absorption spectrum of the obtained near-infrared photoelectric conversion film was measured in the same manner as that used in Example 10. Results were as shown in FIG. 14A. The ionization potential was measured in substantially the same manner as that used in Example 10 except that the compound obtained in Example 8 was used. Results were as shown in FIG. 14B.

As shown in FIG. 14A, the near-infrared photoelectric conversion film obtained in Example 17 had an absorption peak at about 940 nm.

Example 18

Figure 15A:
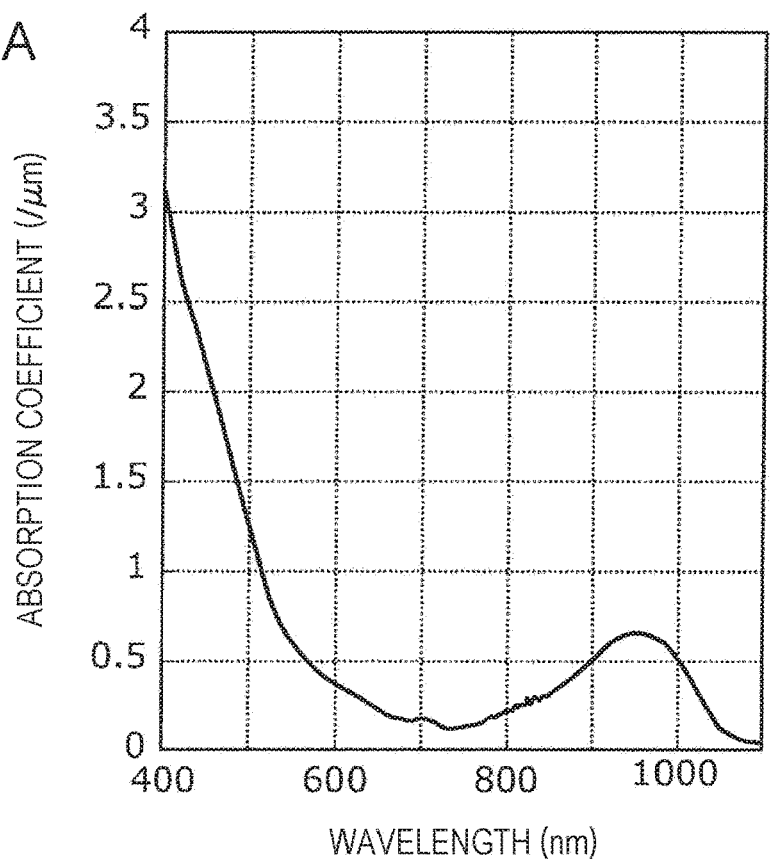
FIG. 15A is a graph showing the absorption spectrum of a near-infrared photoelectric conversion film obtained in Example 18.
Figure 15B:
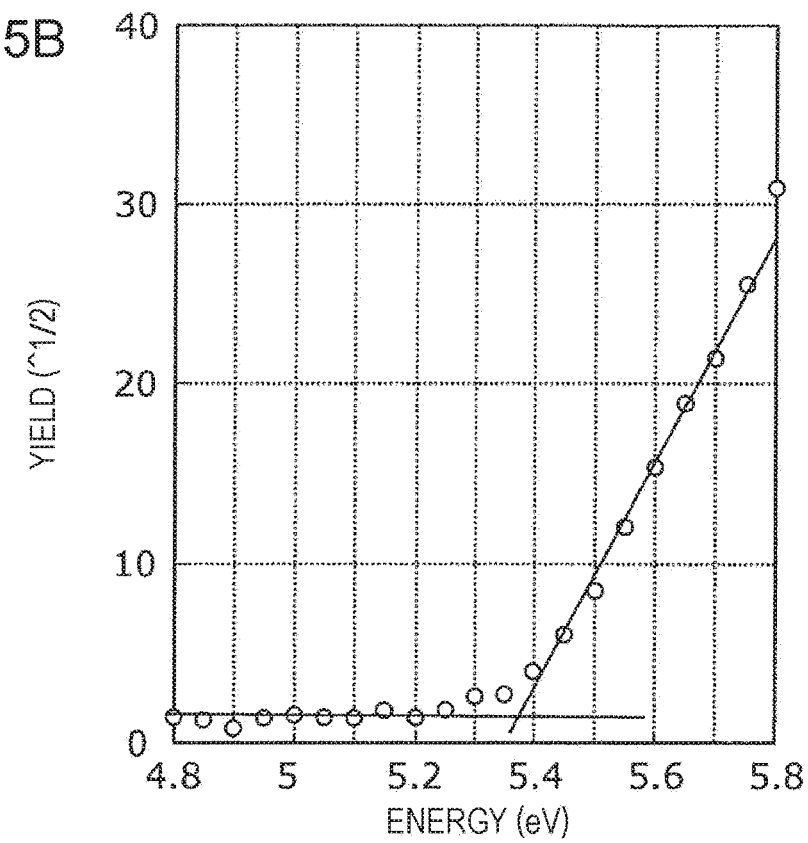
FIG. 15B is a graph showing results of the photoelectron spectroscopic measurement of the near-infrared photoelectric conversion film obtained in Example 18.

A support substrate, made of quartz glass, having a thickness of 0.7 mm was used. The support substrate was coated with a chloroform mixed solution prepared by mixing (S-Pent)$_8$PcSi(OPO(Ph-3,5-bisCF$_3$)$_2$)$_2$ obtained in Example 9 and a [6,6]-phenyl-C61-butyric acid methyl ester (PCBM) derivative at a weight ratio of 1:9 by a spin coating method, whereby a near-infrared photoelectric conversion film having a thickness of 241 nm and an ionization potential of 5.37 eV was obtained. The absorption spectrum of the obtained near-infrared photoelectric conversion film was measured in the same manner as that used in Example 10. Results were as shown in FIG. 15A. The ionization potential was measured in substantially the same manner as that used in Example 10 except that the compound obtained in Example 9 was used. Results were as shown in FIG. 15B.

As shown in FIG. 15A, the near-infrared photoelectric conversion film obtained in Example 18 had an absorption peak at about 956 nm.

Near-Infrared Photoelectric Conversion Element

A near-infrared photoelectric conversion element according to the present disclosure is further described below in detail with reference to Examples 19 to 27.

Example 19

A substrate used was a glass substrate, provided with an ITO electrode with a thickness of 150 nm, having a thickness of 0.7 mm. The ITO electrode was used as a lower electrode. The ITO electrode was coated with a chloroform mixed solution prepared by mixing (S-Pent)$_8$PcSi(OSiBu$_3$)$_2$ obtained in Example 1 and a PCBM derivative at a weight ratio of 1:9 by a spin coating method, whereby a photoelectric conversion layer, that is, a mixed film was formed so as to have a thickness of 196 nm. Furthermore, an Al electrode serving as an upper electrode was formed on the photoelectric conversion layer so as to have a thickness of 80 nm. The Al electrode was formed in a vacuum of 5.0×10$^{-4}$ Pa or less at a deposition rate of 1 Å/s.

Method for Measuring Spectral Sensitivity

The obtained near-infrared photoelectric conversion element was measured for spectral sensitivity using a long wavelength-sensitive spectral sensitivity measurement system, CEP-25RR, available from Bunkoukeiki Co., Ltd. In particular, the near-infrared photoelectric conversion element was introduced into a measurement jig capable of being hermetically sealed in a glove box under a nitrogen atmosphere and was measured for spectral sensitivity. Results were as shown in FIG. 16.

Figure 16:
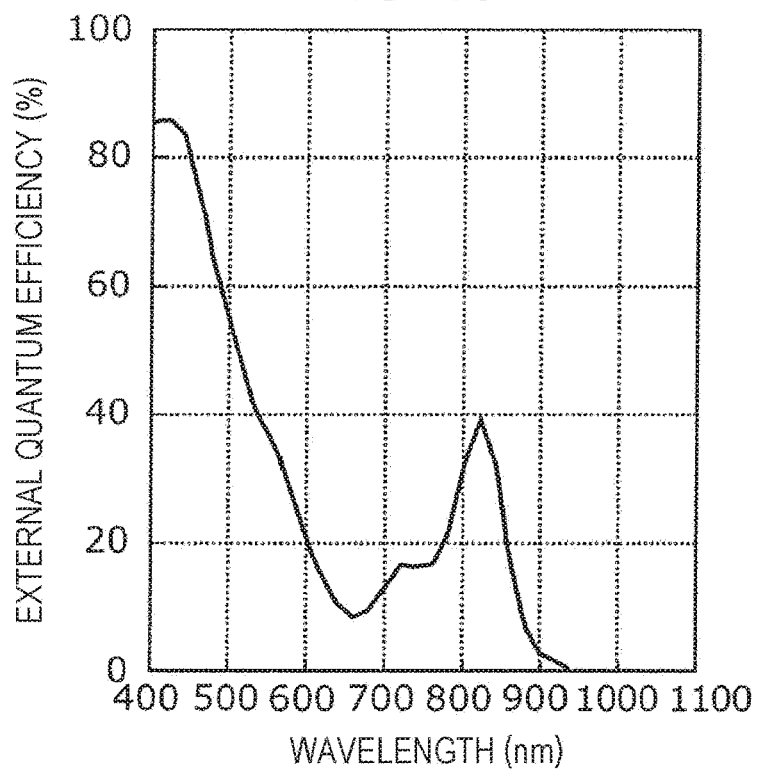
FIG. 16 is a graph showing measurement results of spectral sensitivity characteristics of a near-infrared photoelectric conversion film obtained in Example 19.

As shown in FIG. 16, the external quantum efficiency of the near-infrared photoelectric conversion element obtained in Example 19 in the near-infrared region was highest, about 39%, at a wavelength of about 820 nm.

Example 20

A near-infrared photoelectric conversion element including a near-infrared photoelectric conversion film with a thickness of 187 nm was obtained in substantially the same manner as that used in Example 19 except that (S-Pent)$_8$PcSi(OPOPh$_2$)$_2$ obtained in Example 2 was used as material for a photoelectric conversion layer instead of the compound obtained in Example 1. The spectral sensitivity of the obtained near-infrared photoelectric conversion element was measured in the same manner as that used in Example 19. Results were as shown in FIG. 17.

Figure 17:
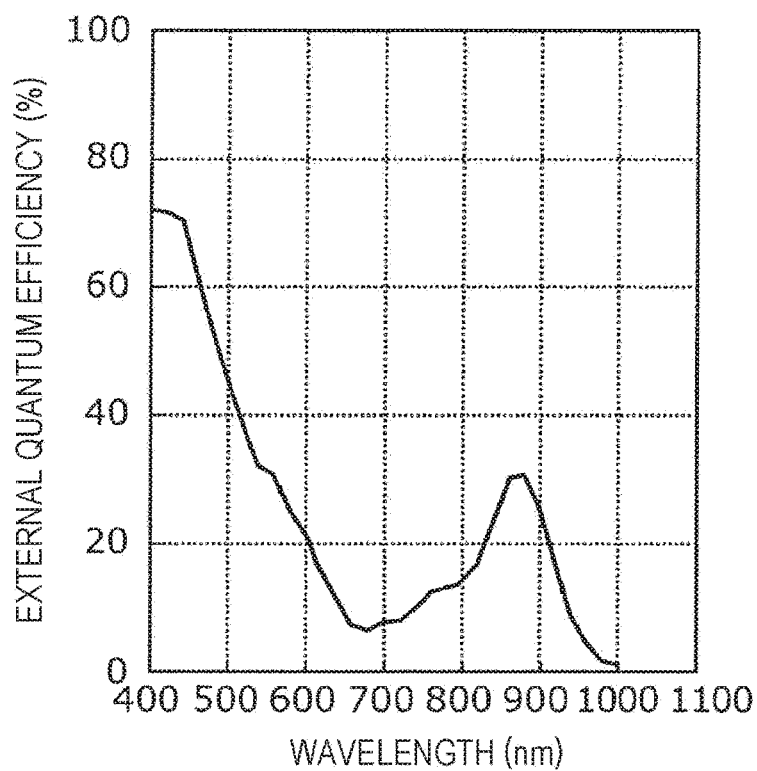
FIG. 17 is a graph showing measurement results of spectral sensitivity characteristics of a near-infrared photoelectric conversion film obtained in Example 20.

As shown in FIG. 17, the external quantum efficiency of the near-infrared photoelectric conversion element obtained in Example 20 in the near-infrared region was highest, about 30%, at a wavelength of about 880 nm.

Example 21

A near-infrared photoelectric conversion element including a near-infrared photoelectric conversion film with a thickness of 267 nm was obtained in substantially the same manner as that used in Example 19 except that (S-Pent)$_8$PcSn(OSiHex$_3$)$_2$ obtained in Example 3 was used as material for a photoelectric conversion layer instead of the compound obtained in Example 1. The spectral sensitivity of the obtained near-infrared photoelectric conversion element was measured in the same manner as that used in Example 19. Results were as shown in FIG. 18.

Figure 18:
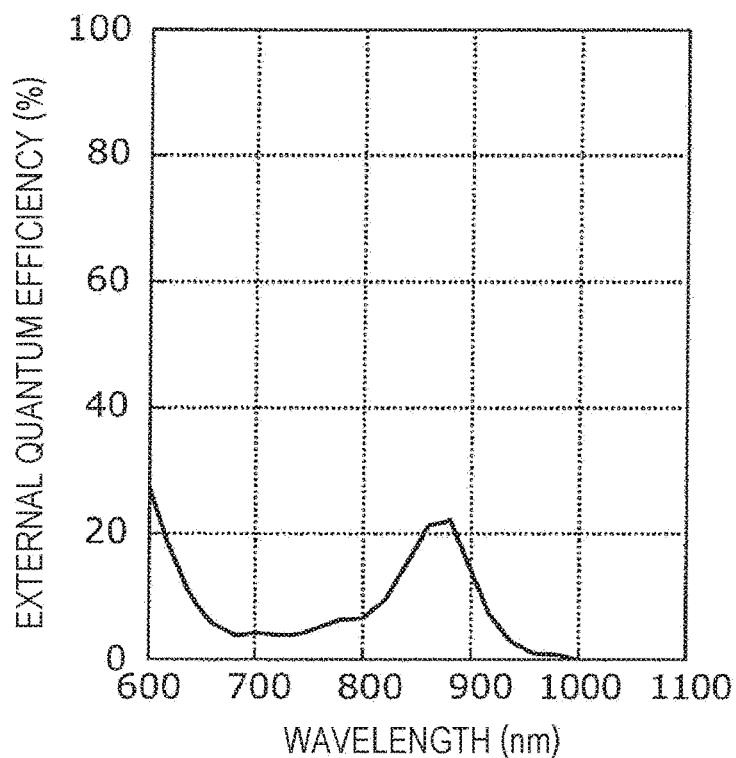
FIG. 18 is a graph showing measurement results of spectral sensitivity characteristics of a near-infrared photoelectric conversion film obtained in Example 21.

As shown in FIG. 18, the external quantum efficiency of the near-infrared photoelectric conversion element obtained in Example 21 in the near-infrared region was highest, about 22%, at a wavelength of about 880 nm.

Example 22

A near-infrared photoelectric conversion element including a near-infrared photoelectric conversion film with a thickness of 246 nm was obtained in substantially the same manner as that used in Example 19 except that (S-Et)$_8$PcSi(OSiBu$_3$)$_2$ obtained in Example 4 was used as material for a photoelectric conversion layer instead of the compound obtained in Example 1. The spectral sensitivity of the obtained near-infrared photoelectric conversion element was measured in the same manner as that used in Example 19. Results were as shown in FIG. 19.

Figure 19:
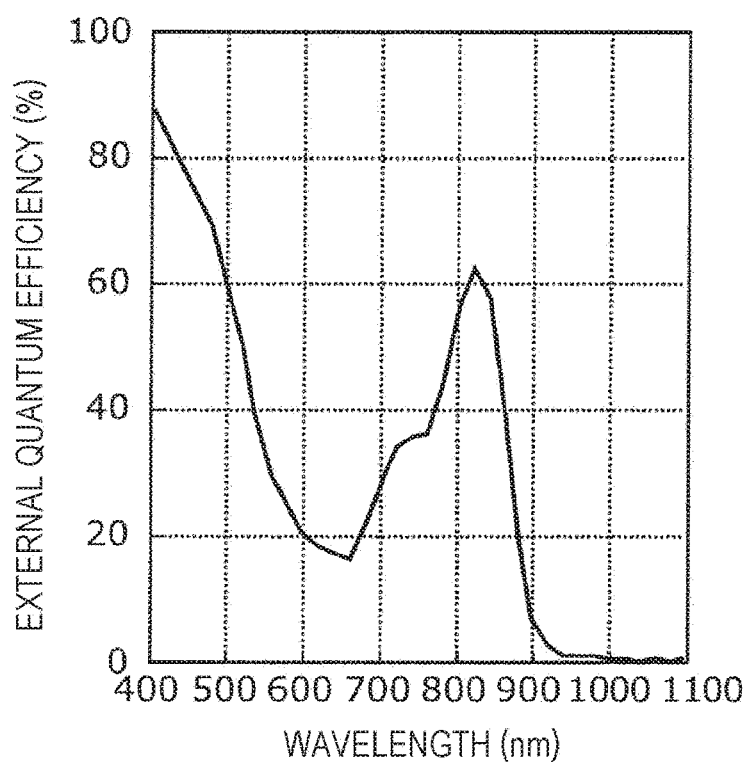
FIG. 19 is a graph showing measurement results of spectral sensitivity characteristics of a near-infrared photoelectric conversion film obtained in Example 22.

As shown in FIG. 19, the external quantum efficiency of the near-infrared photoelectric conversion element obtained in Example 22 in the near-infrared region was highest, about 62%, at a wavelength of about 820 nm.

Example 23

A near-infrared photoelectric conversion element including a near-infrared photoelectric conversion film with a thickness of 280 nm was obtained in substantially the same manner as that used in Example 19 except that (S-iPr)$_8$PcSn(OSiHex$_3$)$_2$ obtained in Example 5 was used as material for a photoelectric conversion layer instead of the compound obtained in Example 1. The spectral sensitivity of the obtained near-infrared photoelectric conversion element was measured in the same manner as that used in Example 19. Results were as shown in FIG. 20.

Figure 20:
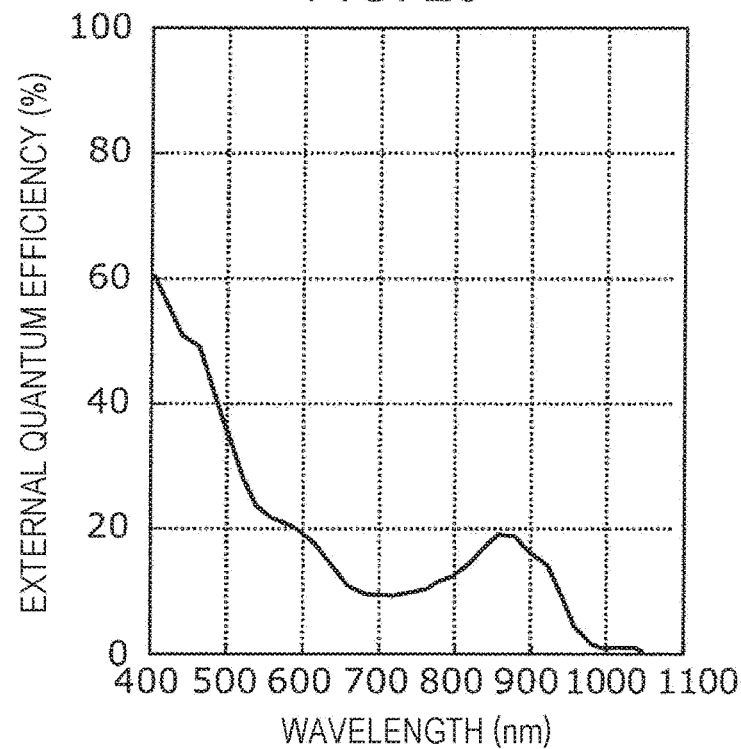
FIG. 20 is a graph showing measurement results of spectral sensitivity characteristics of a near-infrared photoelectric conversion film obtained in Example 23.

As shown in FIG. 20, the external quantum efficiency of the near-infrared photoelectric conversion element obtained in Example 23 in the near-infrared region was highest, about 19%, at a wavelength of about 860 nm.

Example 24

A near-infrared photoelectric conversion element including a near-infrared photoelectric conversion film with a thickness of 200 nm was obtained in substantially the same manner as that used in Example 19 except that (S-Pent)$_8$PcSi(OPO(Ph-4-F)$_2$)$_2$ obtained in Example 6 was used as material for a photoelectric conversion layer instead of the compound obtained in Example 1. The spectral sensitivity of the obtained near-infrared photoelectric conversion element was measured in the same manner as that used in Example 19. Results were as shown in FIG. 21.

Figure 21:
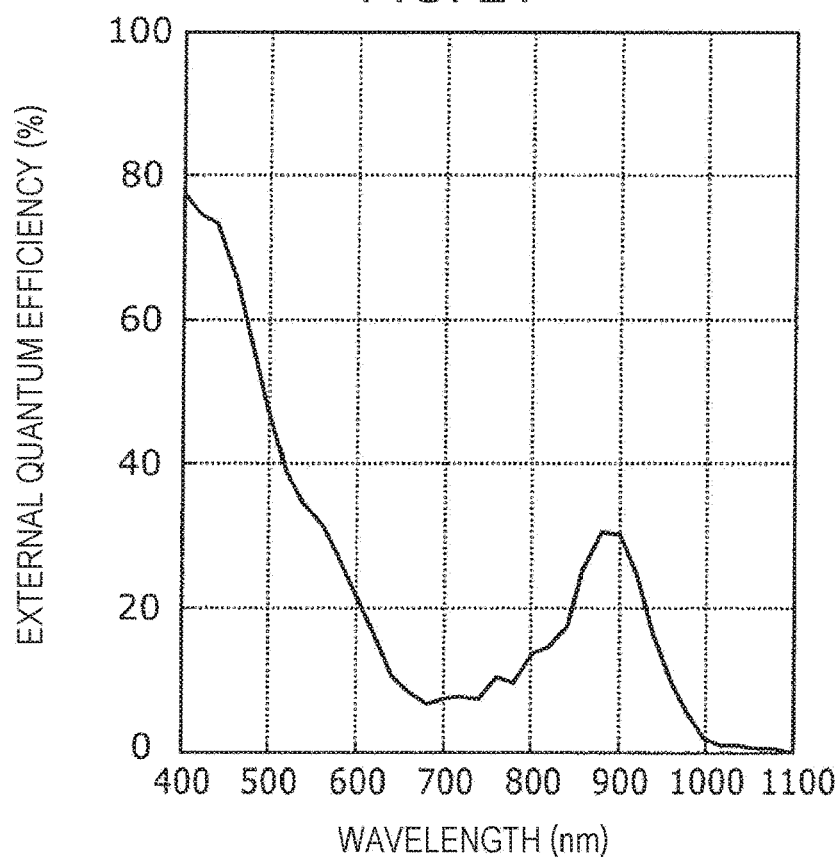
FIG. 21 is a graph showing measurement results of spectral sensitivity characteristics of a near-infrared photoelectric conversion film obtained in Example 24.

As shown in FIG. 21, the external quantum efficiency of the near-infrared photoelectric conversion element obtained in Example 24 in the near-infrared region was highest, about 31%, at a wavelength of about 880 nm.

Example 25

A near-infrared photoelectric conversion element including a near-infrared photoelectric conversion film with a thickness of 217 nm was obtained in substantially the same manner as that used in Example 19 except that $(S-Pent)_8PcSi(OPO(Ph-3,5-diF)_2)_2$ obtained in Example 7 was used as material for a photoelectric conversion layer instead of the compound obtained in Example 1. The spectral sensitivity of the obtained near-infrared photoelectric conversion element was measured in the same manner as that used in Example 19. Results were as shown in FIG. 22.

Figure 22:
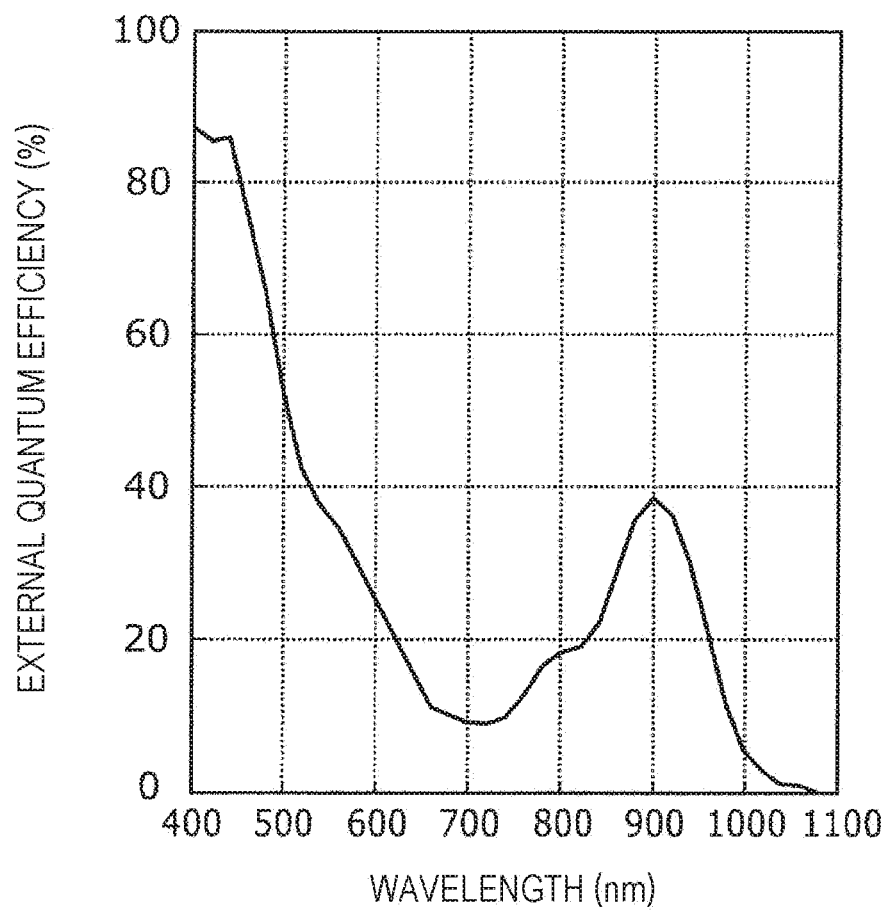
FIG. 22 is a graph showing measurement results of spectral sensitivity characteristics of a near-infrared photoelectric conversion film obtained in Example 25.

As shown in FIG. 22, the external quantum efficiency of the near-infrared photoelectric conversion element obtained in Example 25 in the near-infrared region was highest, about 39%, at a wavelength of about 900 nm.

Example 26

A near-infrared photoelectric conversion element including a near-infrared photoelectric conversion film with a thickness of 206 nm was obtained in substantially the same manner as that used in Example 19 except that $(S-Pent)_8PcSi(OPO(Ph-4-CF_3)_2)_2$ obtained in Example 8 was used as material for a photoelectric conversion layer instead of the compound obtained in Example 1. The spectral sensitivity of the obtained near-infrared photoelectric conversion element was measured in the same manner as that used in Example 19. Results were as shown in FIG. 23.

Figure 23:
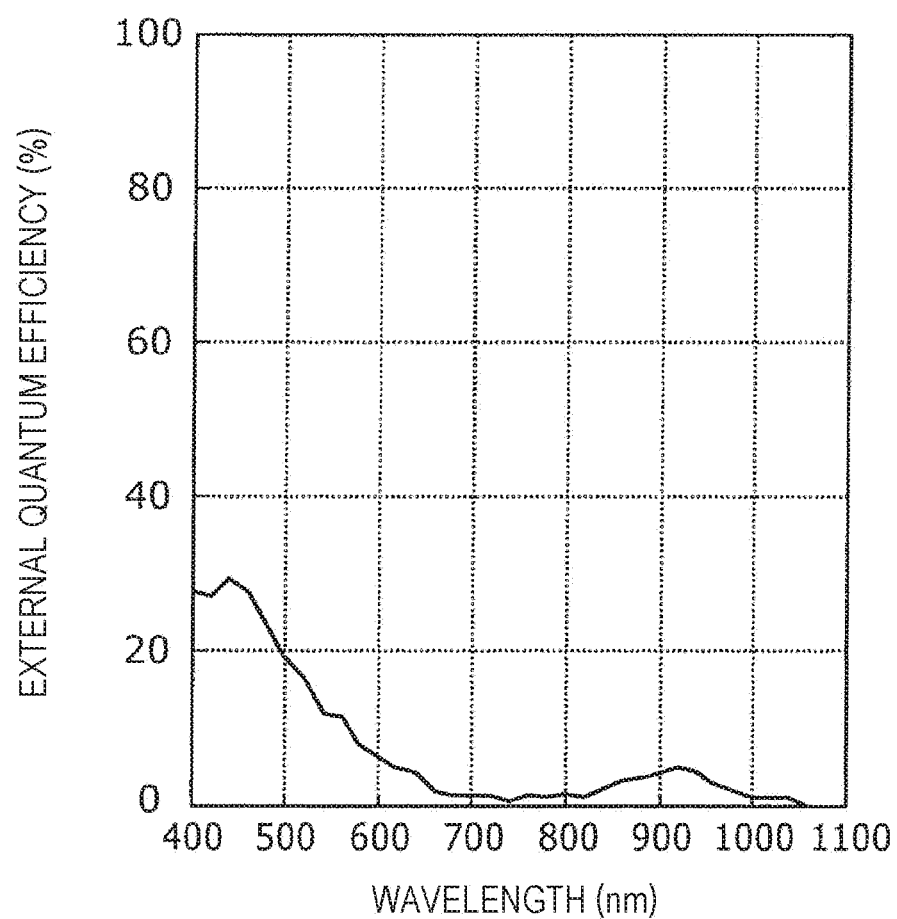
FIG. 23 is a graph showing measurement results of spectral sensitivity characteristics of a near-infrared photoelectric conversion film obtained in Example 26.

As shown in FIG. 23, the external quantum efficiency of the near-infrared photoelectric conversion element obtained in Example 26 in the near-infrared region was highest, about 5%, at a wavelength of about 920 nm.

Example 27

A near-infrared photoelectric conversion element including a near-infrared photoelectric conversion film with a thickness of 241 nm was obtained in substantially the same manner as that used in Example 19 except that $(S-Pent)_8PcSi(OPO(Ph-3,5-bisCF_3)_2)_2$ obtained in Example 9 was used as material for a photoelectric conversion layer instead of the compound obtained in Example 1. The spectral sensitivity of the obtained near-infrared photoelectric conversion element was measured in the same manner as that used in Example 19. Results were as shown in FIG. 24.

Figure 24:
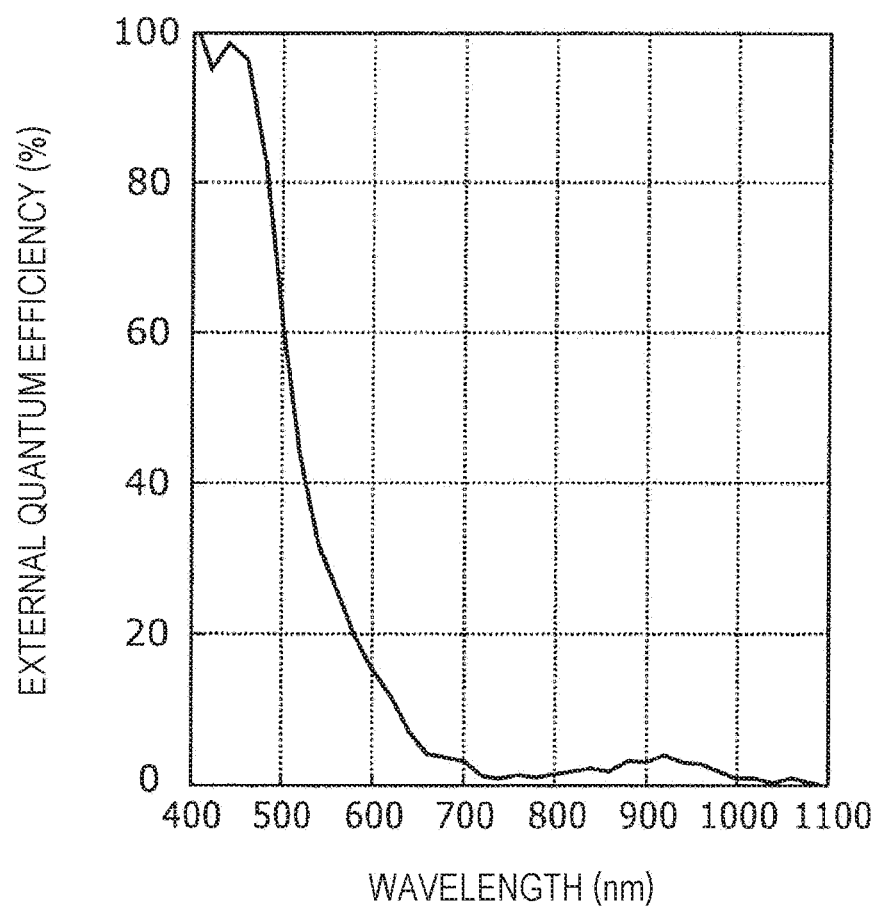
FIG. 24 is a graph showing measurement results of spectral sensitivity characteristics of a near-infrared photoelectric conversion film obtained in Example 27.

As shown in FIG. 24, the external quantum efficiency of the near-infrared photoelectric conversion element obtained in Example 27 in the near-infrared region was highest, about 4%, at a wavelength of about 920 nm.

Summary

Figure 6B:
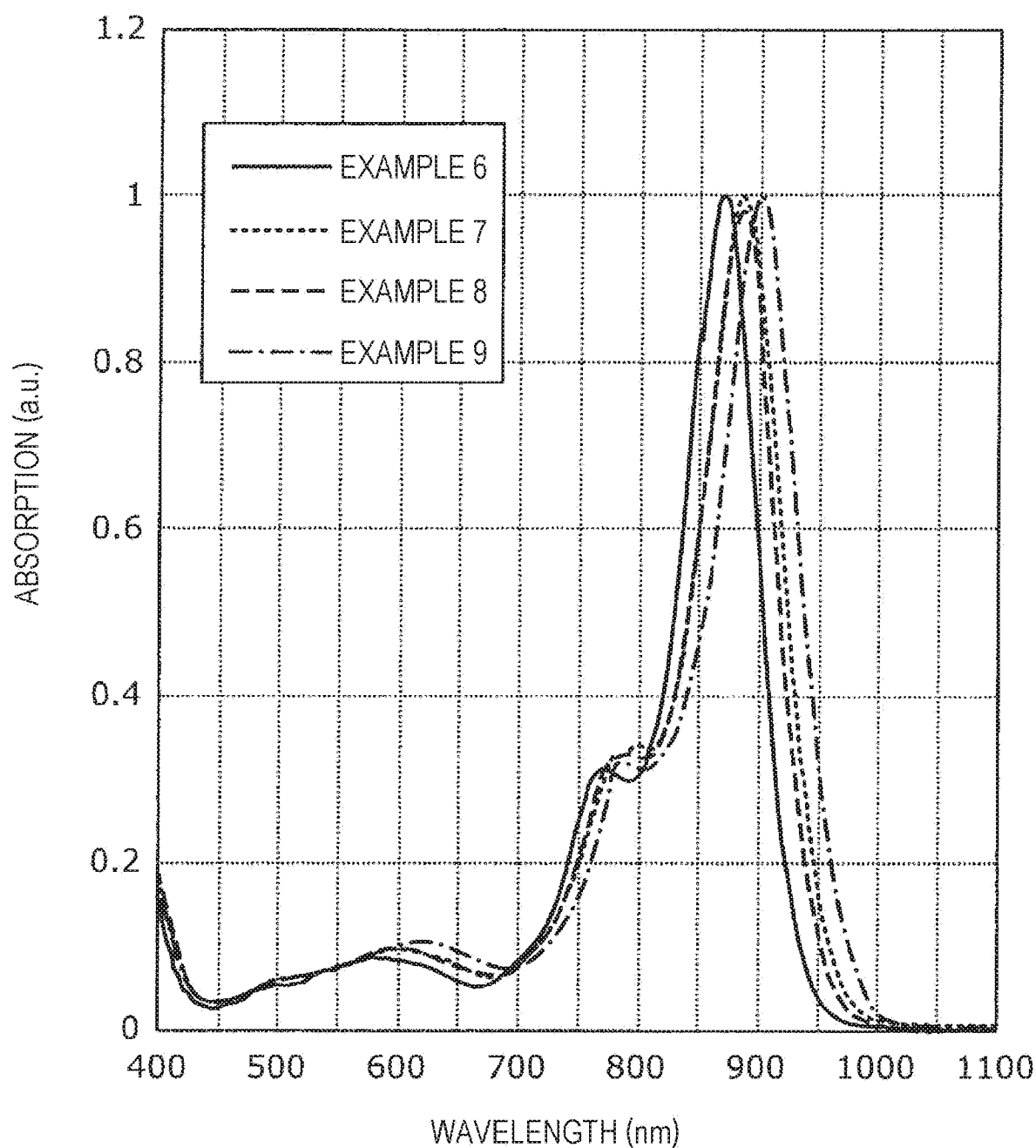
FIG. 6B is a graph showing the absorption spectrum of a phthalocyanine derivative obtained in each of Examples 6 to 9.

As shown in FIG. 6A, the phthalocyanine derivative obtained in Example 1, 2, 3, 4, or 5 had an absorption peak at about 806.5 nm, 842 nm, 854 nm, 802.5 nm, or 865 nm, respectively. As shown in FIG. 6B, the phthalocyanine derivative obtained in Example 6, 7, 8, or 9 had an absorption peak at about 868 nm, 886 nm, 882 nm, or 900 nm, respectively. On the other hand, the phthalocyanine derivatives disclosed in Japanese Patent No. 5405719 and Non-Patent Document 3 have an absorption peak at less than 800 nm.

From results of the chemical structures and absorption spectra of these phthalocyanine derivatives, it was clear that the presence or absence of a side chain at an α-position of a phthalocyanine skeleton and the difference in structure between axial ligands caused differences between absorption characteristics of near-infrared photoelectric conversion films. It could be confirmed that a phthalocyanine derivative having a thiol group at an α-position of a phthalocyanine skeleton had sensitivity to near-infrared light with a long wavelength as described in Examples 1 to 9.

From the comparison between Example 2 and Examples 6 to 9, it could be confirmed that a phthalocyanine derivative having a thiol group at an α-position of a phthalocyanine skeleton and a substituent, serving as a axial ligand, substituted by a fluorine atom or a fluorine-containing group had sensitivity to near-infrared light with a longer wavelength.

As shown in FIGS. 7A to 11A, the near-infrared photoelectric conversion film obtained in Example 10, 11, 12, 13, or 14 had an absorption peak at about 824 nm, 896 nm, 882 nm, 822 nm, or 860 nm, respectively.

As shown in FIGS. 12A to 15A, the near-infrared photoelectric conversion film obtained in Example 15, 16, 17, or 18 had an absorption peak at about 898 nm, 920 nm, 940 nm, or 956 nm, respectively.

From these results, it was clear that the chemical structure of a phthalocyanine derivative, that is, the presence or absence of a side chain at an α-position of a phthalocyanine skeleton and the difference in structure between axial ligands caused differences between absorption characteristics of near-infrared photoelectric conversion films. It could be confirmed that a near-infrared photoelectric conversion film containing a composition containing a phthalocyanine derivative having a thiol group at an α-position of a phthalocyanine skeleton had sensitivity to near-infrared light with a long wavelength as described in Examples 10 to 18.

From the comparison between Example 11 and Examples 15 to 18, it could be confirmed that a near-infrared photoelectric conversion film containing a composition containing a phthalocyanine derivative having a thiol group at an α-position of a phthalocyanine skeleton and a substituent, serving as a axial ligand, substituted by a fluorine atom or a fluorine-containing group had sensitivity to near-infrared light with a longer wavelength.

As shown in FIGS. 7B to 11B, the near-infrared photoelectric conversion film obtained in Example 10, 11, 12, 13, or 14 had an ionization potential of 5.25 eV, 5.10 eV, 5.10 eV, 5.25 eV, or 5.30 eV, respectively. As shown in FIGS. 12B to 15B, the near-infrared photoelectric conversion film obtained in Example 15, 16, 17, or 18 had an ionization potential of 5.15 eV, 5.20 eV, 5.32 eV, or 5.37 eV, respectively. Thus, it could be confirmed that a near-infrared photoelectric conversion film with an ionization potential of 5.1 eV or more was obtained using a composition containing the phthalocyanine derivative obtained in one of Examples 1 to 9. That is, the composition containing the phthalocyanine derivative obtained in one of Examples 1 to 9 can reduce the dark current when the composition is contained in a photoelectric conversion element, because as the HOMO level is deeper, the value of the ionization potential is larger.

Furthermore, the comparison between Example 11 and Examples 15 to 18, it was clear that a near-infrared photoelectric conversion film containing a compound having a thiol group at an α-position of a phthalocyanine skeleton and a substituent, serving as a axial ligand, substituted by a fluorine atom or a fluorine-containing group had a deeper HOMO level and a higher ionization potential. This enables a composition containing the phthalocyanine derivative obtained in one of Examples 15 to 18 to further reduce the dark current when the composition is contained in a photoelectric conversion element.

As shown in FIG. 16, the external quantum efficiency of the near-infrared photoelectric conversion element obtained in Example 19 in the near-infrared region was highest, about 39%, at a wavelength of about 820 nm.

As shown in FIG. 17, the external quantum efficiency of the near-infrared photoelectric conversion element obtained in Example 20 in the near-infrared region was highest, about 30%, at a wavelength of about 880 nm.

As shown in FIG. 18, the external quantum efficiency of the near-infrared photoelectric conversion element obtained in Example 21 in the near-infrared region was highest, about 22%, at a wavelength of about 880 nm.

As shown in FIG. 19, the external quantum efficiency of the near-infrared photoelectric conversion element obtained in Example 22 in the near-infrared region was highest, about 62%, at a wavelength of about 820 nm.

As shown in FIG. 20, the external quantum efficiency of the near-infrared photoelectric conversion element obtained in Example 23 in the near-infrared region was highest, about 19%, at a wavelength of about 860 nm.

As shown in FIG. 21, the external quantum efficiency of the near-infrared photoelectric conversion element obtained in Example 24 in the near-infrared region was highest, about 31%, at a wavelength of about 880 nm.

As shown in FIG. 22, the external quantum efficiency of the near-infrared photoelectric conversion element obtained in Example 25 in the near-infrared region was highest, about 39%, at a wavelength of about 900 nm.

As shown in FIG. 23, the external quantum efficiency of the near-infrared photoelectric conversion element obtained in Example 26 in the near-infrared region was highest, about 5%, at a wavelength of about 920 nm.

As shown in FIG. 24, the external quantum efficiency of the near-infrared photoelectric conversion element obtained in Example 27 in the near-infrared region was highest, about 4%, at a wavelength of about 920 nm.

From results of the chemical structures and external quantum efficiencies of these materials, it was clear that the peak of external quantum efficiency was obtained at a long wavelength of 820 nm or more using the phthalocyanine derivative, obtained in one of Example 1 to 9, having the thiol group at the α-position of the phthalocyanine skeleton as material for a near-infrared photoelectric conversion film.

As described above, the near-infrared photoelectric conversion films obtained in Examples 10 to 18 and the near-infrared photoelectric conversion elements obtained in Examples 19 to 27 were evaluated for near-infrared light absorption characteristics and photoelectric conversion efficiency.

In Example 1, the phthalocyanine derivative in which each of $R_{11}$ to $R_{13}$ was a butyl group containing four carbon atoms was synthesized. A phthalocyanine derivative differing in $R_{11}$ to $R_{13}$ and the number of carbon atoms from that synthesized in Example 1 can be obtained by a technique below. For example, (nBu)$_3$SiOH (tributylsilanol) used to synthesize (S-Pent)$_8$PcSi(OSiBu$_3$)$_2$ (Compound (A-4)) shown in Step (3) in Example 1 may be replaced with (nDec)$_3$SiOH (tridecylsilanol). This enables a phthalocyanine derivative in which alkyl groups that are $R_{11}$ to $R_{13}$ in Example 1 are replaced with decyl groups, each of which contains ten carbon atoms, to be obtained. Incidentally, the inventors have confirmed that, in a tin-naphthalocyanine complex having a structure similar to that of a phthalocyanine derivative according to the present disclosure, a compound having decyl groups that are substituents corresponding to $R_9$ to $R_{14}$ in Formula (1) in the present disclosure. Details are described in Japanese Patent Application No. 2017-090808, which is unpublished, filed by the applicant.

Specific compounds included in the concept of the present disclosure are cited below. The HOMO and LUMO energy levels of Compounds 1 to 21 have been determined by Gaussian 09 calculation. Gaussian 09 calculation was carried out by the DFT method using B3LYP and a basis function used was 3-21G*. Results are shown in Tables 1, 2, 3, and 4.

Incidentally, for Compound 1, Compound 2, Compound 6, Compound 11, Compound 12, Compound 13, and Compound 14, which were measured for HOMO energy level in Example 1, Example 2, Example 4, Example 6, Example 7, Example 8, and Example 9, respectively, measured values (measured values in Example 10, Example 11, Example 13, Example 15, Example 16, Example 17, and Example 18) are also shown.

TABLE 1

| | | Structural formula | Calculated value (eV) | | Measured value (eV) |
| --- | --- | --- | --- | --- | --- |
| | | | HOMO | LUMO | HOMO |
| Example 1 | Compound 1 | | −4.49 | −2.65 | −5.25 |

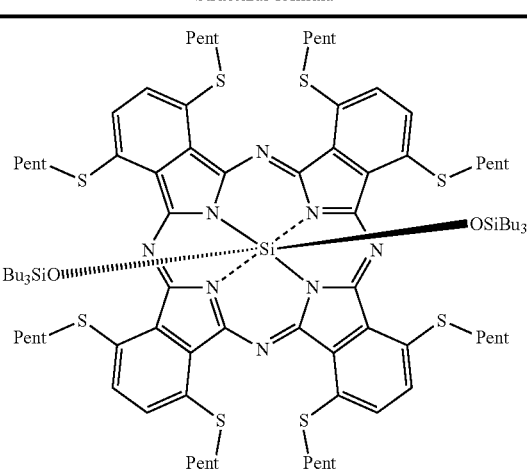

TABLE 1-continued

|  |  | Structural formula | Calculated value (eV) | | Measured value (eV) |
|---|---|---|---|---|---|
|  |  |  | HOMO | LUMO | HOMO |
| Example 2 | Compound 2 | [structure] | −4.45 | −2.69 | −5.12 |
|  | Compound 3 | [structure] | −4.45 | −2.74 |  |
|  | Compound 4 | [structure] | −4.48 | −2.70 |  |

TABLE 1-continued

| | Structural formula | Calculated value (eV) | | Measured value (eV) |
| --- | --- | --- | --- | --- |
| | | HOMO | LUMO | HOMO |
| Compound 5 | (structure: Si phthalocyanine with S-Pent substituents and two axial O-2-ethylhexyl groups) | −4.45 | −2.60 | |

TABLE 2

| | | Structural formula | Calculated value (eV) | | Measured value (eV) |
| --- | --- | --- | --- | --- | --- |
| | | | HOMO | LUMO | HOMO |
| Example 4 | Compound 6 | (structure: Si phthalocyanine with S-Et substituents and two axial OSiBu₃ groups) | −4.51 | −2.72 | −5.25 |
| | Compound 7 | (structure: Si phthalocyanine with S-Et substituents and two axial O-P(O)Ph₂ groups) | −4.49 | −2.72 | |

TABLE 2-continued

| | Structural formula | Calculated value (eV) | | Measured value (eV) |
|---|---|---|---|---|
| | | HOMO | LUMO | HOMO |
| Compound 8 | | −4.55 | −2.76 | |
| Compound 9 | | −4.49 | −2.78 | |
| Compound 10 | | −4.48 | −2.70 | |

TABLE 3

| | | Structural formula | Calculated value (eV) | | Measured value (eV) |
|---|---|---|---|---|---|
| | | | HOMO | LUMO | HOMO |
| Example 6 | Compound 11 | | −4.58 | −2.85 | −5.15 |
| Example 7 | Compound 12 | | −4.64 | −2.93 | −5.20 |
| Exampe 8 | Compound 13 | | −4.68 | −3.00 | −5.32 |
| Example 9 | Compound 14 | | −4.76 | −3.07 | −5.37 |

TABLE 3-continued

| | Structural formula | Calculated value (eV) | | Measured value (eV) |
|---|---|---|---|---|
| | | HOMO | LUMO | HOMO |
| Compound 15 | [structure] | −4.83 | −3.18 | |

TABLE 4

| | Structural formula | Calculated value (eV) | | Measured value (eV) |
|---|---|---|---|---|
| | | HOMO | LUMO | HOMO |
| Compound 16 | [structure] | −4.68 | −2.95 | |
| Compound 17 | [structure] | −4.59 | −2.84 | |

TABLE 4-continued

| | | Calculated value (eV) | | Measured value (eV) |
|---|---|---|---|---|
| Structural formula | | HOMO | LUMO | HOMO |
| Compound 18 | | −4.62 | −2.85 | |
| Compound 19 | | −4.65 | −2.99 | |
| Compound 20 | | −4.67 | −3.03 | |

TABLE 4-continued

| | Structural formula | Calculated value (eV) | | Measured value (eV) |
| --- | --- | --- | --- | --- |
| | | HOMO | LUMO | HOMO |
| Compound 21 | (structure shown) | −4.79 | −3.08 | |

As shown in Table 1, Compounds 1 to 5 are such compounds that a central metal M in a phthalocyanine derivative represented by Formula (1) is Si and α-side chains are S-Pent. As shown in Table 2, Compounds 6 to 10 are such compounds that the central metal M in the phthalocyanine derivative represented by Formula (1) is Si and α-side chains are S-Et.

As shown in Table 3, Compounds 11 to 15 are such compounds that the central metal M in the phthalocyanine derivative represented by Formula (1) is Si or Sn and α-side chains are S-Pent. As shown in Table 4, Compounds 16 to 21 are such compounds that the central metal M in the phthalocyanine derivative represented by Formula (1) is Si and α-side chains are S-Et.

As shown in Tables 1 to 4, the measured value and calculated value of the HOMO of each of Compounds 1, 2, 6, 11, 12, 13, and 14 do not agree with each other. However, there is a certain relation between the measured and calculated values of these HOMOs. That is, as the measured value of the HOMO is lower (deeper), the calculated value thereof is lower (deeper) and as the measured value of the HOMO is higher (shallower), the calculated value thereof is higher (shallower). As is the case with, for example, Compounds 1 and 6, when the measured value of the HOMO is deep, the calculated value of the HOMO is deep. As is the case with Compound 2, when the measured value of the HOMO is shallow, the calculated value of the HOMO is shallow.

The calculated values of the HOMOs of Compounds 2, 3, and 5 are the same. The calculated values of the HOMOs of Compounds 1, 4, 6, 7, 9, and 10 are substantially the same. The calculated value of the HOMO of Compound 8 is slightly deep. Thus, it is conceivable that Compounds 3 to 5 and 10, as well as Compound 1, Compound 2, and Compound 6, which were actually synthesized in Example 1, Example 2, and Example 4, respectively, serve as photoelectric conversion materials with a deep HOMO level. Therefore, photoelectric conversion films prepared using these compounds can reduce the dark current.

As is clear from Compounds 11 to 14, increasing the number of fluorine atoms introduced into an axial ligand allows the measured value of the HOMO to be deep and also allows the calculated value thereof to be deep. This is clear from the fact that, in Compounds 15 to 21, increasing the number of fluorine atoms introduced into an axial ligand allows the calculated value of the HOMO to be deep.

Thus, it is conceivable that Compounds 15 to 21, as well as Compounds 11 to 14, which were actually synthesized in Examples 6 to 9, serve as photoelectric conversion materials with a deeper HOMO level. Therefore, a photoelectric conversion film prepared using a compound containing fluorine atoms introduced into an axial ligand can further reduce the dark current.

A method for synthesizing each of Compounds 3 to 5, 7 to 10, and 15 to 21, which are shown in Tables 1, 2, 3, and 4. Incidentally, a method for synthesizing Compound 1, 2, 6, 11, 12, 13, or 14 is as described in Example 1, 2, 4, 6, 7, 8, or 9, respectively, and is therefore not described herein.

First, a method for synthesizing each of Compounds 3 and 8 is described. Compounds 3 and 8 can be synthesized in accordance with a synthesis method described in Japanese Unexamined Patent Application Publication No. 3-202395.

Synthesis of Compound 3

Compound 3 is represented by the following formula and can be synthesized in accordance with a method described below:

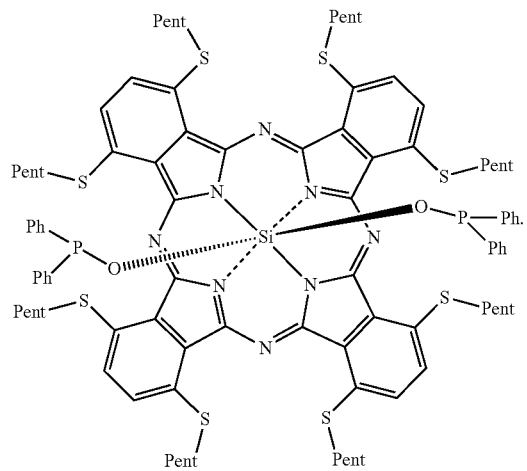

To a 200 mL reaction vessel filled with argon, 0.3 g of (S-Pent)$_8$PcSi(OH)$_2$ (Compound (A-3)) obtained in Step (2) and 3.0 g of chlorodiphenylphosphine are added and are dissolved in 20 mL of dehydrated pyridine together with 3.0 g of tributylamine, followed by stirring at 110° C. for two hours. After the progress of reaction is confirmed from a UV-vis spectrum, a reaction solution is cooled to room temperature, is diluted with 60 mL of methanol, and is filtered. Subsequently, the filtrate is distilled off, 30 mL of dilute hydrochloric acid is added, and a precipitated solid is filtered out. The obtained solid is washed with water and is dried under reduced pressure, whereby the oxidation of a phosphine moiety can be prevented and target Compound 3 can be obtained.

Synthesis of Compound 8

Compound 8 is represented by the following formula and can be synthesized in accordance with a method described below:

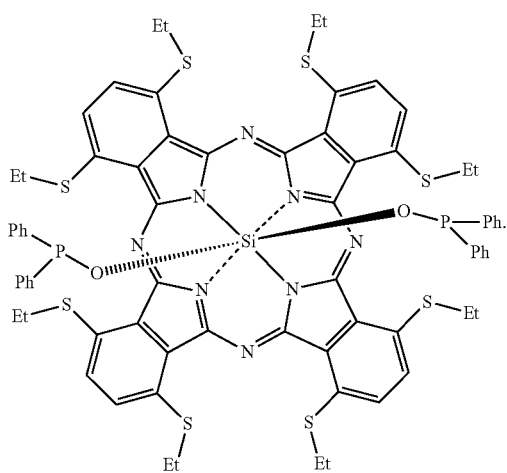

To a 200 mL reaction vessel filled with argon, 0.3 g of (S-Et)$_8$PcSi(OH)$_2$ (Compound (A-12)) obtained in Step (10) and 3.0 g of chlorodiphenylphosphine are added and are dissolved in 20 mL of dehydrated pyridine together with 3.0 g of tributylamine, followed by stirring at 110° C. for two hours. After the progress of reaction is confirmed from a UV-vis spectrum, a reaction solution is cooled to room temperature, is diluted with 60 mL of methanol, and is filtered. Subsequently, the filtrate is distilled out, 30 mL of dilute hydrochloric acid is added thereto, and a precipitated solid is filtered out. The obtained solid is washed with water and is dried under reduced pressure, whereby the oxidation of a phosphine moiety can be prevented and target Compound 8 can be obtained.

Next, a method for synthesizing each of Compounds 4 and 9 is described. Compounds 4 and 9 can be synthesized in accordance with a synthesis method described in Jian-Yong et. al., "Switching the photo-induced energy and electron-transfer processes in BODIPY-phthalocyanine conjugates", Chemical Communications, Royal Society of Chemistry, 2009, pp. 1517-1519 (Non-Patent Document 6).

Synthesis of Compound 4

Compound 4 is represented by the following formula and can be synthesized in accordance with a method described below:

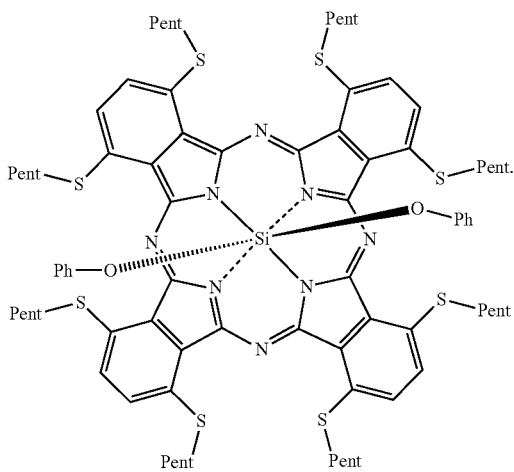

To a 200 mL reaction vessel filled with argon, 0.3 g of (S-Pent)$_8$PcSi(OH)$_2$ (Compound (A-3)) obtained in Step (2) and 3.0 g of phenol are added and are dissolved in a mixture of 10 mL of dehydrated toluene and 10 mL of dehydrated pyridine, followed by stirring for three hours under heating and reflux. After the termination of reaction is confirmed by TLC, a reaction solution is concentrated in an evaporator, whereby a crude product is obtained. After the obtained crude product is purified by alumina column chromatography (a developing solvent: hexane/chloroform=2/1 (v/v)) twice, the solvent is distilled off, whereby target Compound 4 can be obtained.

Synthesis of Compound 9

Compound 9 is represented by the following formula and can be synthesized in accordance with a method described below:

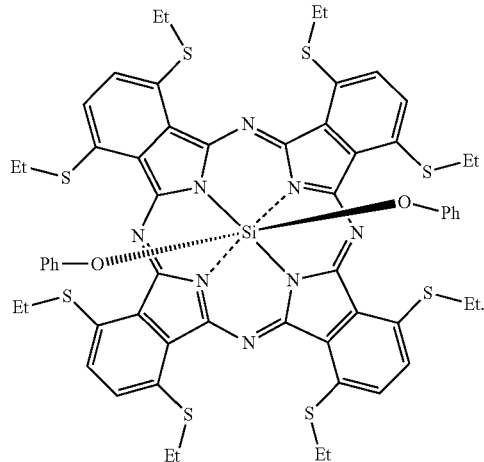

To a 200 mL reaction vessel filled with argon, 0.3 g of (S-Et)$_8$PcSi(OH)$_2$ (Compound (A-12)) obtained in Step (10) and 3.0 g of phenol are added and are dissolved in a mixture of 10 mL of dehydrated toluene and 10 mL of dehydrated pyridine, followed by stirring for three hours under heating and reflux. After the termination of reaction is confirmed by TLC, a reaction solution is concentrated in an evaporator, whereby a crude product is obtained. After the obtained crude product is purified by alumina column chromatography (a developing solvent: hexane/chloroform=2/1 (v/v)) twice, the solvent is distilled off, whereby target Compound 9 can be obtained.

Next, a method for synthesizing each of Compounds 5 and 10 is described. Compounds 5 and 10 can be synthesized in accordance with a synthesis method described in Japanese Patent Application No. 2018-024367, which is unpublished, filed by the applicant.

Synthesis of Compound 5

Compound 5 is represented by the following formula and can be synthesized in accordance with a method described below:

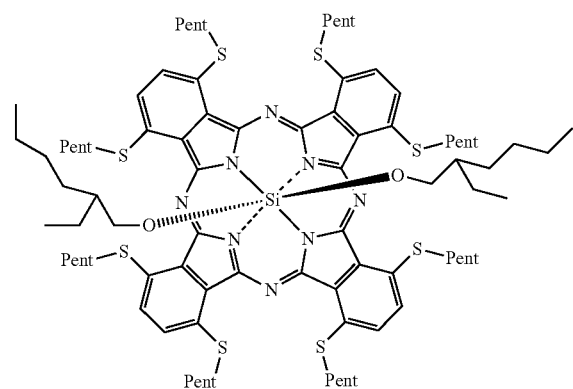

To a 200 mL reaction vessel filled with argon, 0.5 g of (S-Pent)$_8$PcSi(OH)$_2$ (Compound (A-3)) obtained in Step (2) and 1.1 g of 2-ethyl-1-hexanol are added and are dissolved in 50 mL of 1,2,4-trimethylbenzene, followed by stirring at 200° C. for three hours. After a reaction solution is cooled to room temperature, the reaction solution is cooled at 10° C. for 30 minutes and is filtered such that an insoluble component is removed. Subsequently, the filtrate is concentrated under reduced pressure and is cooled at 10° C. for 30 minutes. Subsequently, after obtained residue is purified by alumina column chromatography (a developing solvent: hexane/chloroform=2/1 (v/v)) twice, the solvent is distilled off, whereby target Compound 5 can be obtained.

Synthesis of Compound 10

Compound 10 is represented by the following formula and can be synthesized in accordance with a method described below:

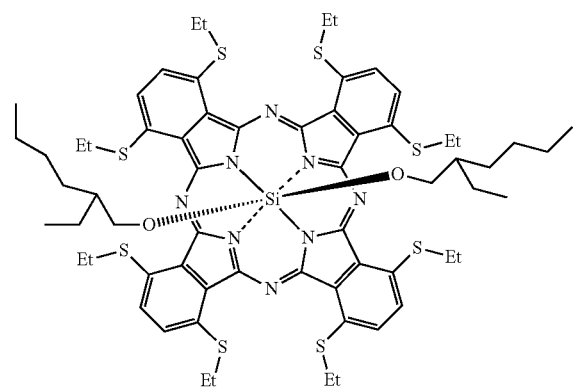

To a 200 mL reaction vessel filled with argon, 0.5 g of (S-Et)$_8$PcSi(OH)$_2$ (Compound (A-12)) obtained in Step (10) and 1.1 g of 2-ethyl-1-hexanol are added and are dissolved in 50 mL of 1,2,4-trimethylbenzene, followed by stirring at 200° C. for three hours. After a reaction solution is cooled to room temperature, the reaction solution is cooled at 10° C. for 30 minutes and is filtered such that an insoluble component is removed. Subsequently, the filtrate is concentrated under reduced pressure and is cooled at 10° C. for 30 minutes. Subsequently, after concentrate is purified by alumina column chromatography (a developing solvent: hexane/chloroform=2/1 (v/v)) twice, the solvent is distilled off, whereby target Compound 10 can be obtained.

Next, a method for synthesizing Compound 7 is described. Compound 7 can be synthesized in accordance with the synthesis method described in Step (4) in Example 2.

Synthesis of Compound 7

Compound 7 is represented by the following formula and can be synthesized in accordance with a method described below:

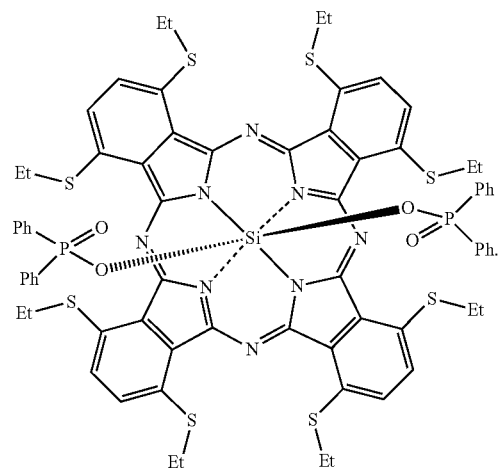

Compound 7 can be synthesized by the synthesis method described in Step (4) in Example 2 in such a manner that 0.3 g of (S-Et)$_8$PcSi(OH)$_2$ (Compound (A-12)) obtained in Step (10) is used instead of 0.3 g of (S-Pent)$_8$PcSi(OH)$_2$ (Compound (A-3)) obtained in Step (2).

Next, a method for synthesizing each of Compounds 15, 16, and 19 is described.

Synthesis of Compound 15

Compound 15 is represented by the following formula and can be synthesized in accordance with a method described below:

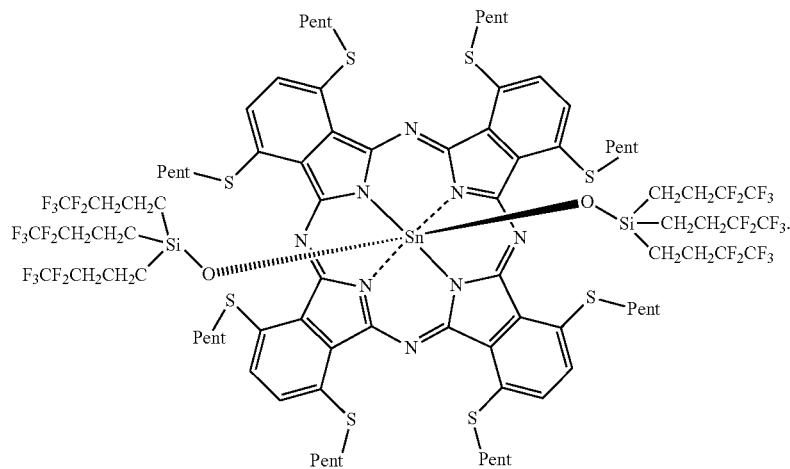

To a 200 mL reaction vessel filled with argon, 0.3 g of (S-Pent)$_8$PcSnCl$_2$ (Compound (A-7)) obtained in Step (6) and 3.0 g of Si(CH$_2$CH$_2$CF$_2$CF$_3$)$_3$OH are added and are dissolved in 20 mL of dehydrated toluene together with 0.5 g of sodium methoxide, followed by stirring at 110° C. for eight hours. After a reaction solution is cooled to room temperature, 10 mL of water is added to the reaction solution and an organic layer is separated with a separatory funnel. After a solvent is distilled off from the separated organic layer wherever possible, methanol is added to the organic layer, whereby a solid is precipitated. The precipitated solid is washed with 100 mL of methanol and is dried by heating at 60° C. for three hours under reduced pressure, whereby target Compound 15 can be obtained.

Synthesis of Compound 19

Compound 19 is represented by the following formula and can be synthesized in accordance with a method described below:

To a 10 mL reaction vessel filled with argon, 50 mg of (S-Et)$_8$PcSi(OH)$_2$ (Compound (A-12)) obtained in Step (10) and 0.5 g of Si(CH$_2$CH$_2$CF$_2$CF$_3$)$_3$OH are added and are dissolved in 1.5 mL of dehydrated toluene, followed by heating for five hours under reflux. After a reaction solution is cooled to room temperature, the reaction solution is concentrated in an evaporator, whereby a crude product is obtained. Methanol (up to 5 mL) is added to the obtained crude product and the resulting crude product is left statically at room temperature for one day. A formed precipitate is filtered out, is washed with methanol, and is then dried under reduced pressure, whereby target Compound 19 can be obtained.

Synthesis of Compound 16

Compound 16 is represented by the following formula and can be synthesized in accordance with a method described below:

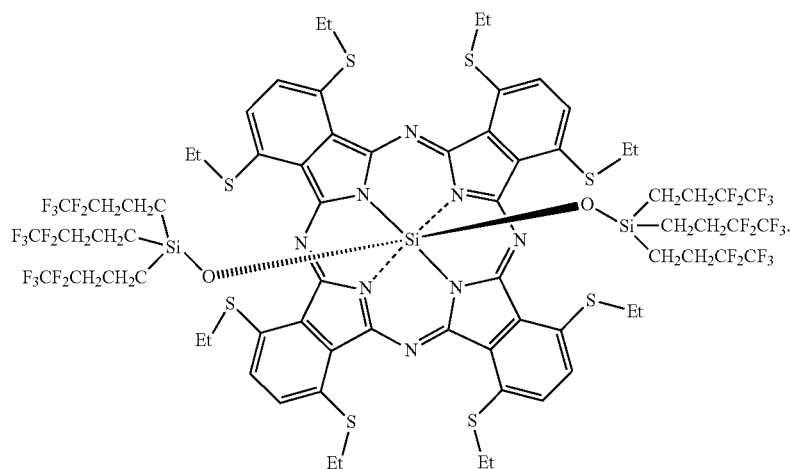

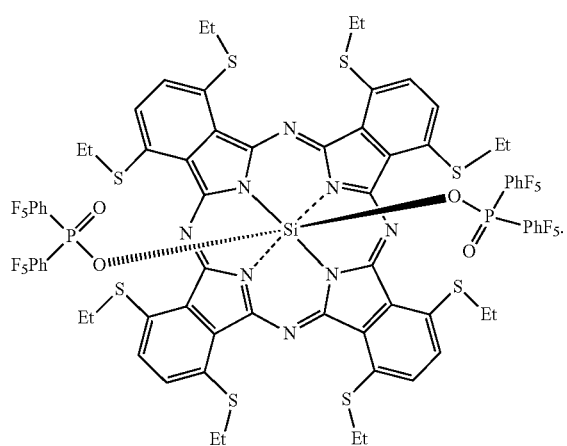

To a 10 mL reaction vessel filled with argon, 150 mg of (S-Et)$_8$PcSi(OH)$_2$ (Compound (A-12)) obtained in Step (10) and 500 mg of Cl—PO(PhF$_5$)$_2$ are added and 0.5 mL of tributylamine and 4 mL of dehydrated pyridine are further added followed by stirring at 130° C. for 12 hours. A reaction solution is cooled to room temperature, chloroform and distilled water are added to the reaction solution, and an organic layer is separated with a separatory funnel. A solvent is distilled off from the separated organic layer, whereby the organic layer is concentrated.

The obtained concentrate is purified by neutral alumina column chromatography. A purified solution is concentrated and is then washed with heptane, whereby target Compound 16 can be obtained.

Next, a method for synthesizing each of Compounds 18 and 20 is described. Compounds 18 and 20 can be synthesized in accordance with a synthesis method described in Jian-Yong et. al., "Switching the photo-induced energy and electron-transfer processes in BODIPY-phthalocyanine conjugates", Chemical Communications, Royal Society of Chemistry, 2009, pp. 1517-1519 (Non-Patent Document 6).

Synthesis of Compound 18

Compound 18 is represented by the following formula and can be synthesized in accordance with a method described below:

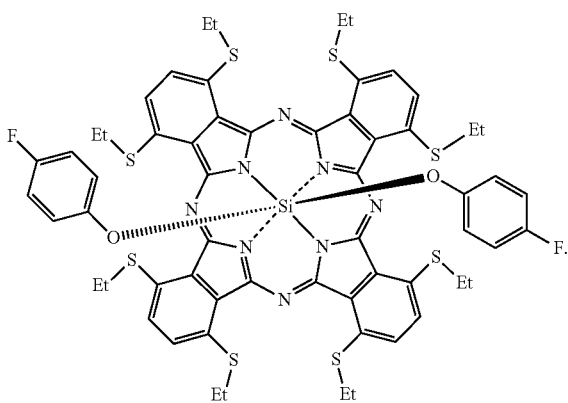

To a 200 mL reaction vessel filled with argon, 0.3 g of (S-Pent)$_8$PcSi(OH)$_2$ (Compound (A-3)) obtained in Step (2) and 3.0 g of 4-fluorophenol are added and 10 mL of dehydrated toluene and 10 mL of dehydrated pyridine are further added, followed by stirring for three hours under heating and reflux. After the termination of reaction is confirmed by TLC, a reaction solution is concentrated in an evaporator, whereby a crude product is obtained. After the obtained crude product is purified by alumina column chromatography (a developing solvent: hexane/chloroform=2/1 (v/v)) twice, the solvent is distilled off, whereby target Compound 18 can be obtained.

Synthesis of Compound 20

Compound 20 is represented by the following formula and can be synthesized in accordance with a method described below:

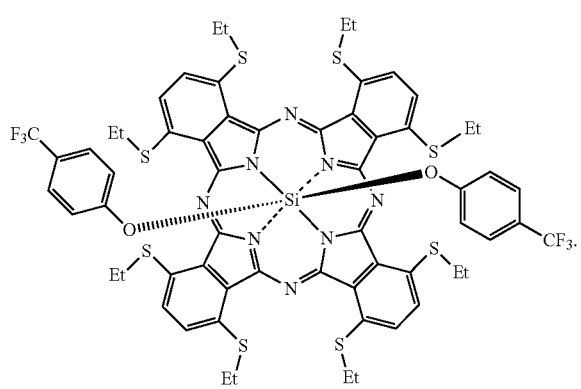

To a 200 mL reaction vessel filled with argon, 0.3 g of (S-Et)$_8$PcSi(OH)$_2$ (Compound (A-12)) obtained in Step (10) and 4.0 g of 4-fluorophenol are added and 10 mL of dehydrated toluene and 10 mL of dehydrated pyridine are further added followed by stirring for three hours under heating and reflux. After the termination of reaction is confirmed by TLC, a reaction solution is concentrated in an evaporator, whereby a crude product is obtained. After the obtained crude product is purified by alumina column chromatography (a developing solvent: hexane/chloroform=2/1 (v/v)) twice, the solvent is distilled off, whereby target Compound 20 can be obtained.

Next, a method for synthesizing Compound 17 is described. Compound 7 can be synthesized in accordance with a synthesis method described in Japanese Patent Application No. 2018-024367, which is unpublished, filed by the applicant.

Synthesis of Compound 17

Compound 17 is represented by the following formula and can be synthesized in accordance with a method described below:

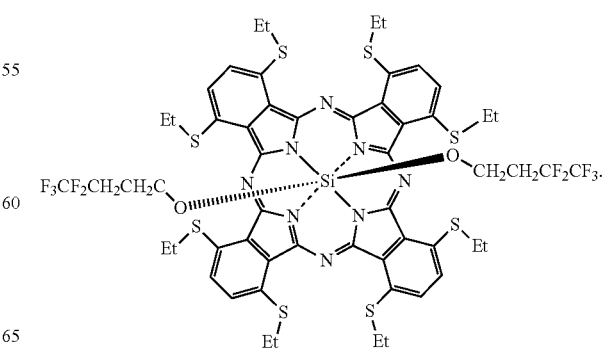

To a 200 mL reaction vessel filled with argon, 0.3 g of (S-Et)$_8$PcSi(OH)$_2$ (Compound (A-12)) obtained in Step (10) and 3.0 g of CF$_3$CF$_2$CH$_2$CH$_2$OH are added and are dissolved in 50 mL of 1,2,4-trimethylbenzene, followed by stirring at 200° C. for three hours. After a reaction solution is cooled to room temperature, the reaction solution is cooled at 10° C. for 30 minutes and is filtered such that an insoluble component is removed. Subsequently, the filtrate is concentrated under reduced pressure and is cooled at 10° C. for 30 minutes. Subsequently, after obtained residue is purified by alumina column chromatography (a developing solvent: hexane/chloroform=2/1 (v/v)) twice, the solvent is distilled off, whereby target Compound 17 can be obtained.

Next, a method for synthesizing Compound 21 is described.

Synthesis of Compound 21

Compound 21 is represented by the following formula and can be synthesized in accordance with a method described below:

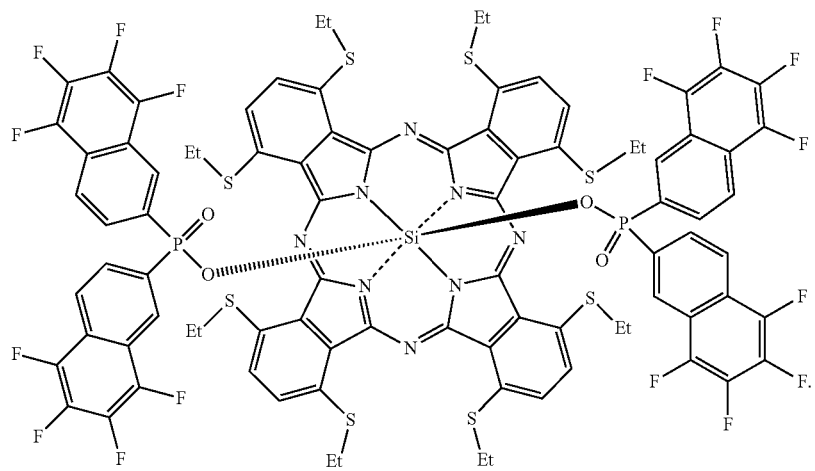

To a 10 mL reaction vessel filled with argon, 150 mg of (S-Et)$_8$PcSi(OH)$_2$ (Compound (A-12)) obtained in Step (10) and 700 mg of bis(5,6,7,8-tetrafluoronaphthyl)phosphinic chloride are added and 0.5 mL of tributylamine and 4 mL of dehydrated pyridine are further added followed by stirring at 130° C. for 12 hours. A reaction solution is cooled to room temperature, chloroform and distilled water are added to the reaction solution, and an organic layer is separated with a separatory funnel. A solvent is distilled off from the separated organic layer, whereby the organic layer is concentrated.

The obtained concentrate is purified by neutral alumina column chromatography. A purified solution is concentrated and is then washed with heptane, whereby target Compound 21 can be obtained.

A composition, photoelectric conversion element, and imaging device according to the present disclosure have been described above with reference to embodiments and examples. The present disclosure is not limited to the embodiments or the examples. The scope of the present disclosure includes forms obtained by applying various modifications conceived by those skilled in the art without departing from the spirit of the present disclosure to the embodiments or the examples and other forms configured by combining constituent elements in some of the embodiments or the examples.

A composition and photoelectric conversion element according to the present disclosure may be used in a solar cell such that charges generated by light are extracted in the form of energy.

A composition according to the present disclosure may be used in films, sheets, glasses, building materials, and the like in the form of a near-infrared light-blocking material or may be used in combination with ink, resin, glass, or the like in the form of an infrared absorber.

What is claimed is:

1. A composition containing a phthalocyanine derivative represented by the following formula:

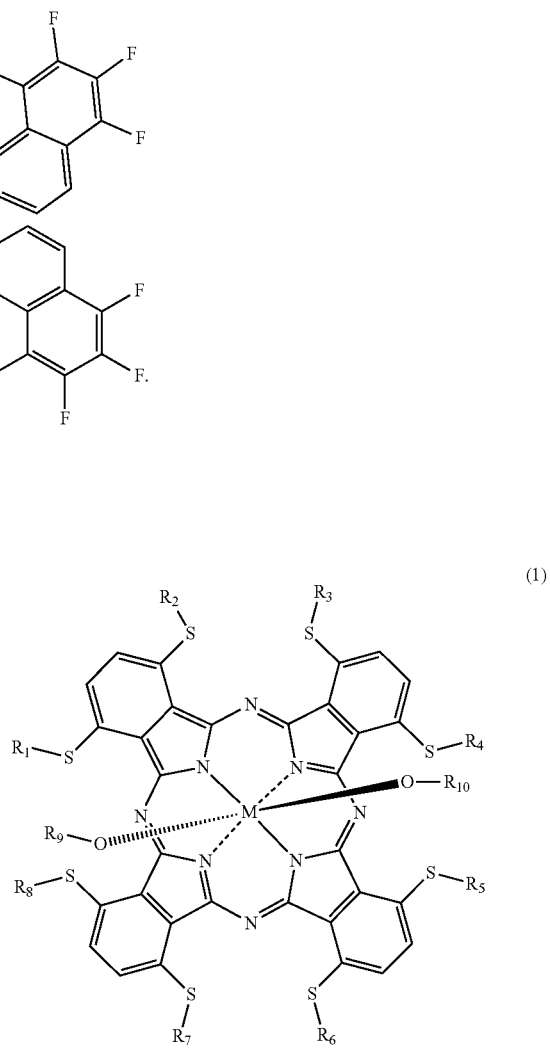

where R$_1$ to R$_8$ are independently an alkyl group, M is Si, each of R$_9$ and R$_{10}$ is any one of substituents represented by the following formulas, R$_{11}$ to R$_{13}$ are independently an alkyl group, and R$_{14}$ to R$_{18}$ are independently an alkyl group or an aryl group:

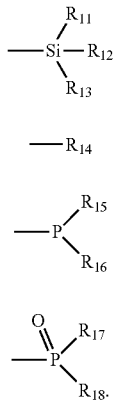

(2)

(3)

(4)

(5)

2. The composition according to claim 1, wherein $R_1$ to $R_8$ in Formula (1) are alkyl groups containing five or less carbon atoms.

3. The composition according to claim 1, wherein the phthalocyanine derivative is one of compounds represented by the following formulas:

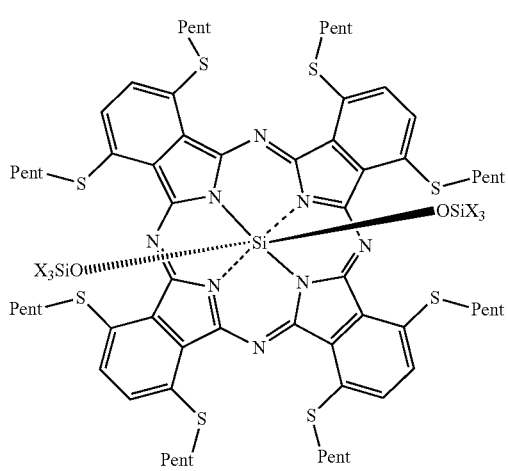

(6)

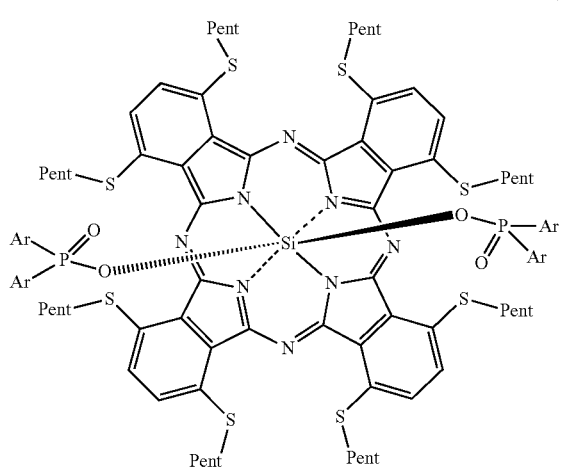

(8)

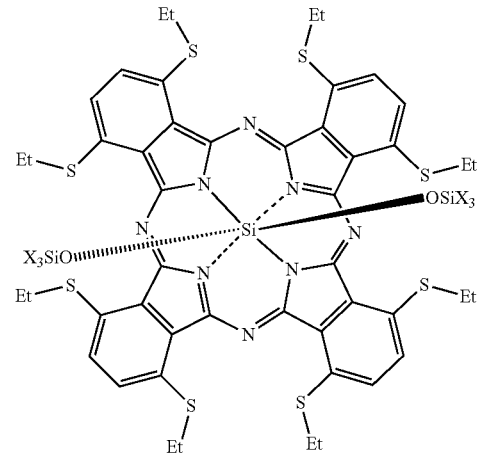

(9)

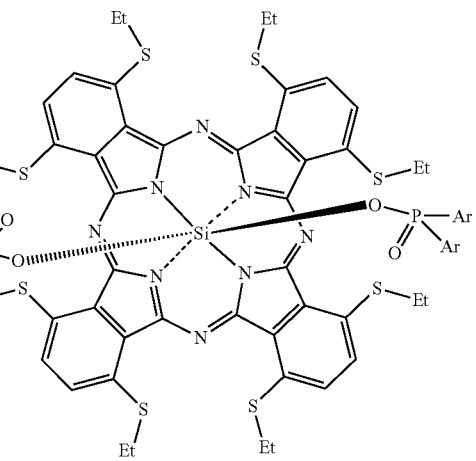

(10)

where Ar is an aryl group and X is an alkyl group containing ten or less carbon atoms.

4. The composition according to claim 1, wherein at least one hydrogen atom contained in at least one selected from the group consisting of $R_9$ and $R_{10}$ in Formula (1) is substituted by a fluorine atom or a fluorine-containing group.

5. The composition according to claim 4, wherein $R_9$ and $R_{10}$ in Formula (1) are represented by Formula (5), $R_{17}$ and $R_{18}$ in Formula (5) are independently an aryl group, and at least one hydrogen atom contained in at least one selected from the group consisting of $R_{17}$ and $R_{18}$ is substituted by a fluorine atom or a fluorine-containing group.

6. The composition according to claim 5, wherein $R_{17}$ and $R_{18}$ in Formula (5) are independently a phenyl group and at least one hydrogen atom contained in at least one selected from the group consisting of $R_{17}$ and $R_{18}$ is substituted by a fluorine atom or a trifluoromethyl group.

7. The composition according to claim 4, wherein the phthalocyanine derivative is any one of compounds represented by the following formulas:

-continued
(12)
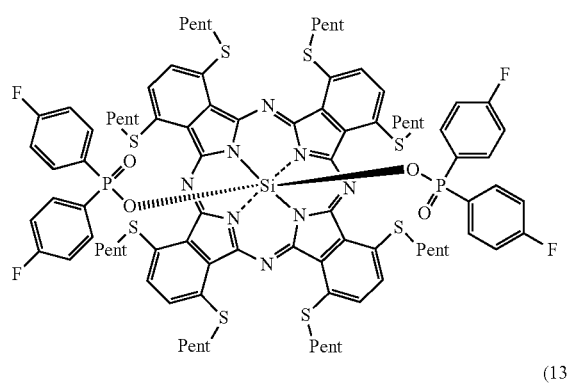
(13)
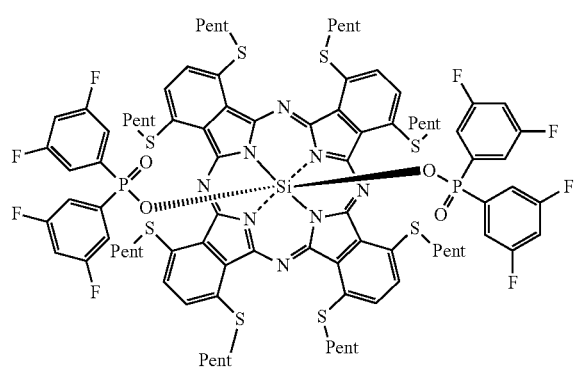
(14)
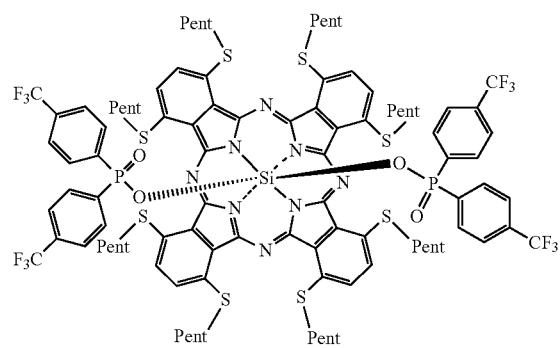
(15)
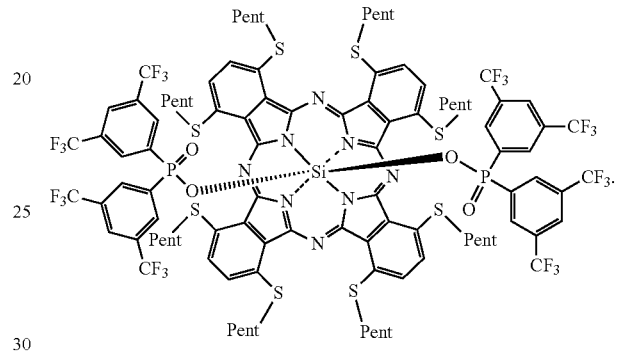
* * * * *